United States Patent [19]

Siegele et al.

[11] Patent Number: 5,607,002

[45] Date of Patent: *Mar. 4, 1997

[54] CHEMICAL REFILL SYSTEM FOR HIGH PURITY CHEMICALS

[75] Inventors: Stephen H. Siegele, Campbell; Craig M. Noah, Mountain View, both of Calif.; John N. Gregg, Marble Falls, Tex.

[73] Assignee: Advanced Delivery & Chemical Systems, Inc., San Jose, Calif.

[ * ] Notice: The term of this patent shall not extend beyond the expiration date of Pat. No. 5,465,766.

[21] Appl. No.: 345,244

[22] Filed: Nov. 28, 1994

Related U.S. Application Data

[63] Continuation-in-part of Ser. No. 184,226, Jan. 19, 1994, which is a continuation-in-part of Ser. No. 54,597, Apr. 28, 1993, Pat. No. 5,465,766.

[51] Int. Cl.⁶ .................................................... F17C 13/00
[52] U.S. Cl. ........................ 141/198; 141/95; 73/308; 73/311; 73/313; 73/319; 137/209; 137/412; 200/84 C
[58] Field of Search .................................. 141/21, 67, 95, 141/198; 137/208, 209, 412; 73/308, 311, 313, 319, DIG. 5; 340/623, 624; 200/84 C

[56] References Cited

U.S. PATENT DOCUMENTS

| | | | |
|---|---|---|---|
| 2,160,062 | 5/1939 | Drake et al. | |
| 2,536,273 | 1/1951 | Gahagan | 200/84 |
| 2,777,914 | 1/1957 | Brown | 200/84 |
| 3,419,695 | 12/1968 | Dinkelkamp et al. | 200/84 C X |
| 3,646,293 | 2/1972 | Howard | 200/84 C |
| 3,731,805 | 5/1973 | Schniers | 210/86 |
| 3,826,139 | 7/1974 | Bachman | 73/311 |
| 4,056,979 | 11/1977 | Bongort et al. | 73/313 |
| 4,064,755 | 12/1977 | Bongort et al. | 73/313 |
| 4,134,514 | 1/1979 | Schumacher et al. | 220/85 |
| 4,298,037 | 11/1981 | Schumacher et al. | 141/1 |
| 4,425,949 | 1/1984 | Rowe, Jr. | 141/1 |
| 4,436,674 | 3/1984 | McMenamin et al. | 261/64 |
| 4,576,552 | 3/1986 | Smith | 417/2 |
| 4,676,404 | 6/1987 | Yamazaki et al. | 222/56 |
| 4,730,491 | 3/1988 | Lew | 73/308 |
| 4,859,375 | 8/1989 | Lipisko et al. | 261/20 |
| 4,976,146 | 12/1990 | Senghaas et al. | 73/313 |
| 4,979,545 | 12/1990 | Fair | 141/83 |
| 4,979,643 | 12/1990 | Lipisko et al. | 222/83 |
| 5,038,840 | 8/1991 | Fair | 141/83 |
| 5,041,267 | 8/1991 | Randtke et al. | 422/102 |
| 5,069,244 | 12/1991 | Miyazaki et al. | 137/209 |
| 5,079,950 | 1/1992 | McKiernan et al. | 73/313 |
| 5,103,673 | 4/1992 | Sawada et al. | 73/313 |
| 5,137,063 | 8/1992 | Foster et al. | 141/98 |
| 5,148,945 | 9/1992 | Geatz | 222/1 |
| 5,285,812 | 2/1994 | Morales | 137/393 |
| 5,329,963 | 7/1994 | Jones et al. | 141/6 |

FOREIGN PATENT DOCUMENTS 1036717  8/1958  Germany.

OTHER PUBLICATIONS

B/W Unifloat® Liquid Level Control Systems, *New single float/multiple switch level sensing system provides versatile, reliable means of controlling any type of liquid!*, Brochure by B/W Controls Inc.

Transfil™, *Chemical Refill System*, Brochure by Air Products and Chemicals, Inc., Aug. 1991 Rev. 1, Schumacher.

*Announcing A New Era In Liquid Chemical Delivery*, Transfil II™, Product Brochure by Schumacher (Apr. 1990).

*Primary Examiner*—J. Casimer Jacyna
*Attorney, Agent, or Firm*—Lyon & Lyon

[57] ABSTRACT

A highly reliable digital level sensor assembly is provided to replace optical and capacitance type sensors in high purity chemical delivery systems. The digital level sensor assembly is particularly useful in bulk chemical refill delivery systems for high purity chemicals employing a manifold that ensures contamination free operation and canister change outs with a minimum of valves and tubing.

5 Claims, 37 Drawing Sheets

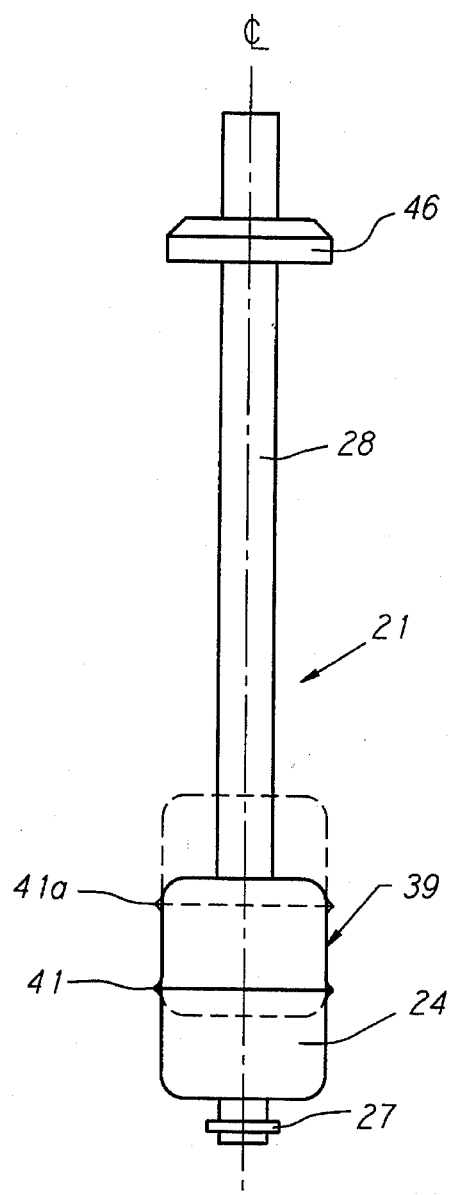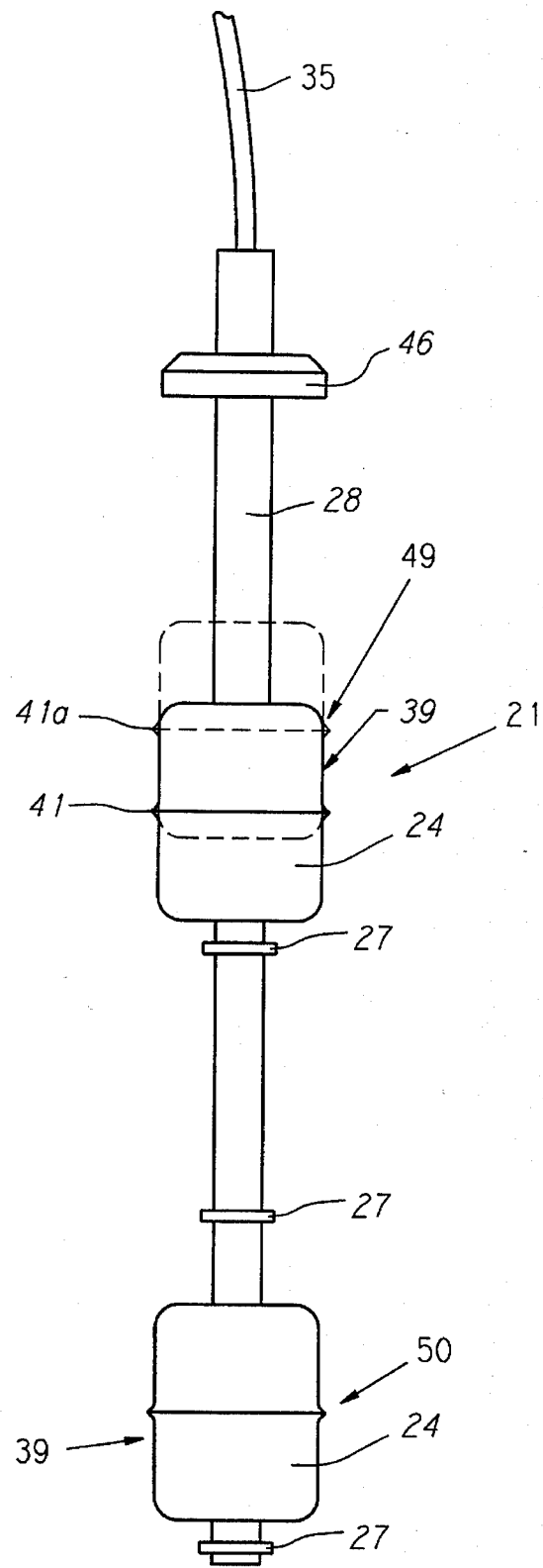
FIG. 9
FIG. 10

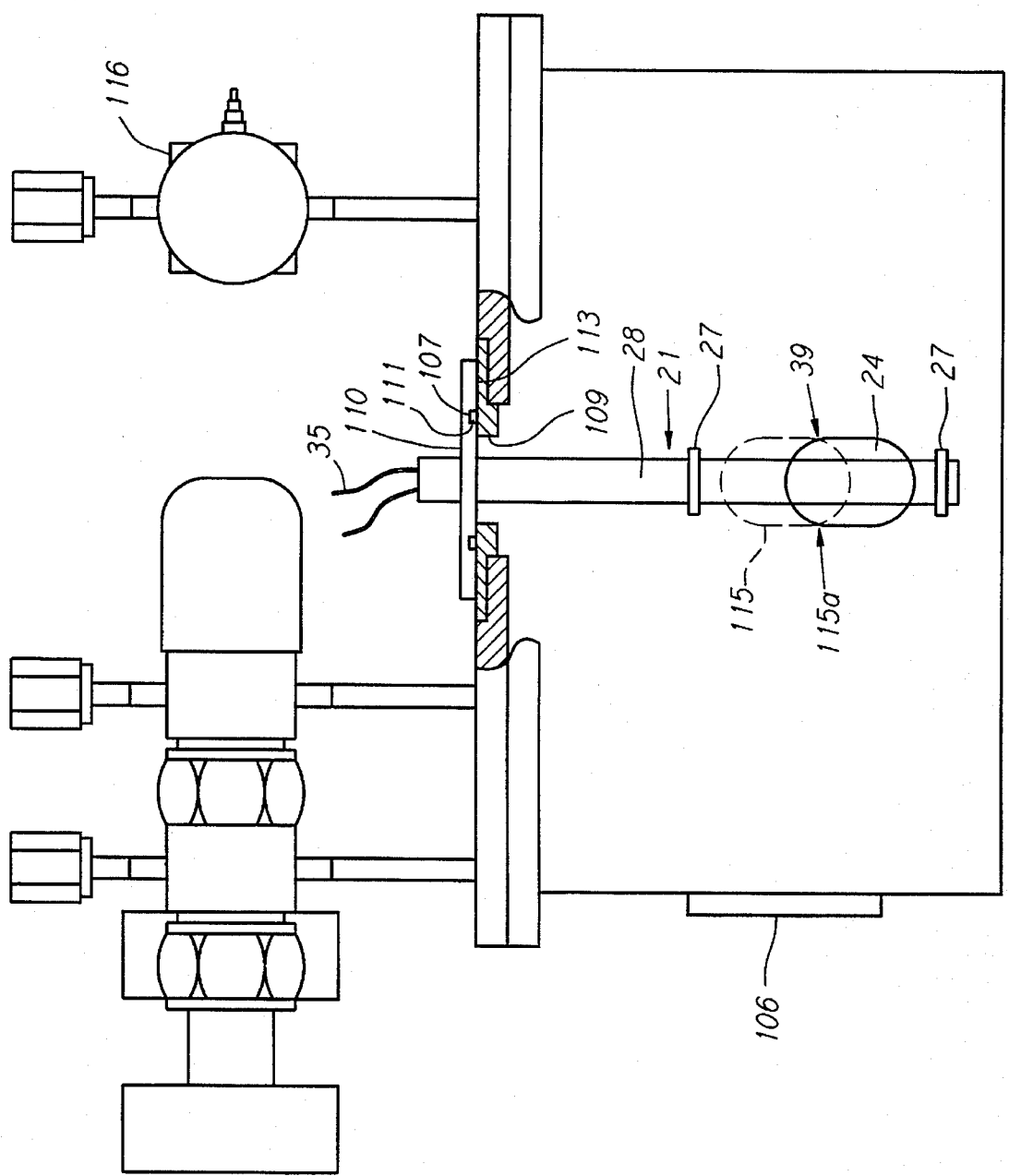

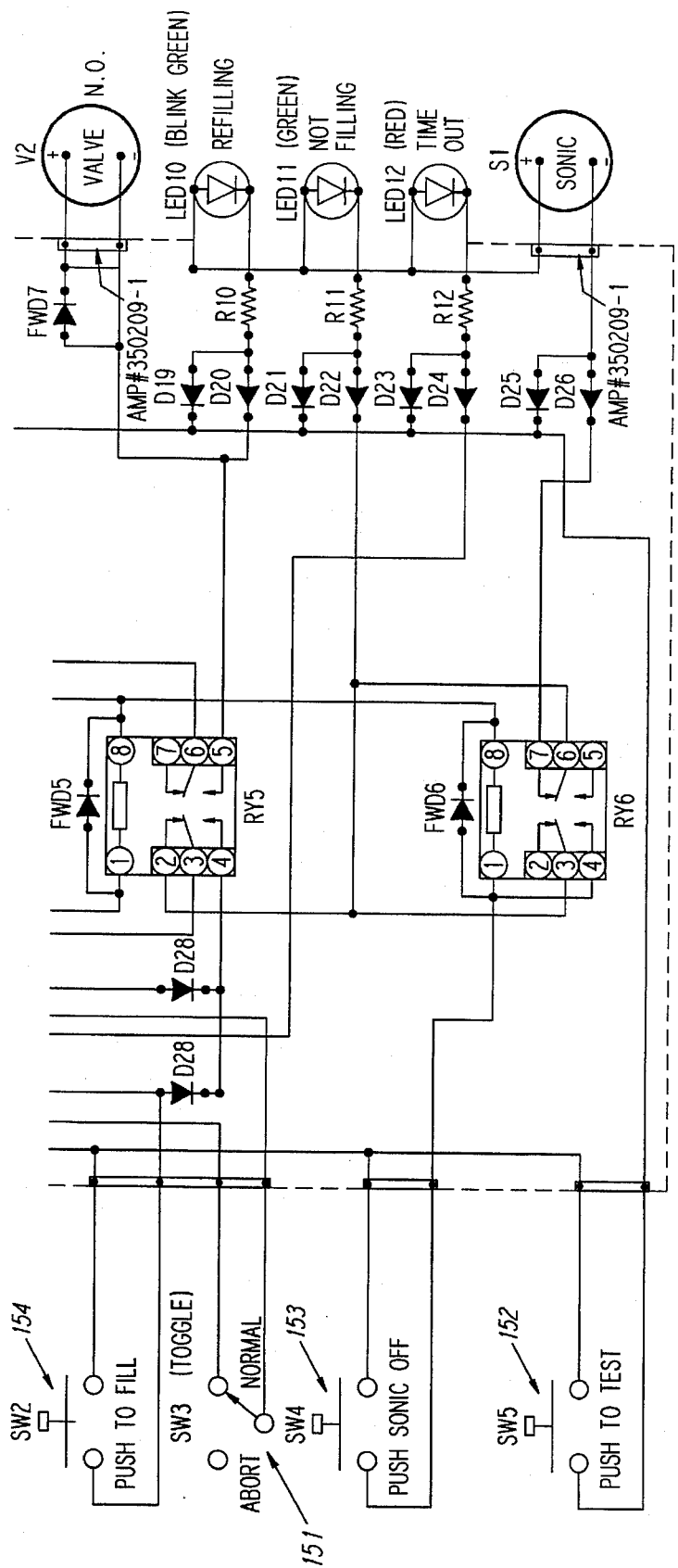
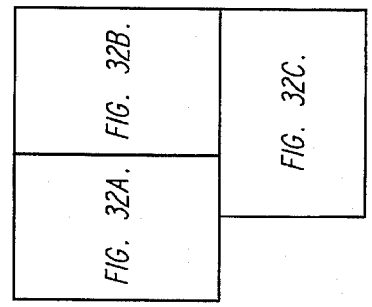
FIG. 32C
FIG. 32

CHEMICAL REFILL SYSTEM FOR HIGH PURITY CHEMICALS

This application is a continuation-in-part application of copending U.S. patent application Ser. No. 08/184,226, filed Jan. 19, 1994, which is a continuation-in-part application of copending U.S. patent application Ser. No. 08/054,597, filed Apr. 28, 1993, now U.S. Pat. No. 5,465,766, which applications are incorporated herein by reference in their entirety.

BACKGROUND OF THE INVENTION

1. Field of the Invention

The field of the invention relates to chemical delivery systems, in particular containers, manifolds and level sensing schemes for chemical delivery systems.

2. Description of Related Art

The chemicals used in the fabrication of integrated circuits must have a ultrahigh purity to allow satisfactory process yields. As integrated circuits have decreased in size, there has been a directly proportional increase in the need for maintaining the purity of source chemicals. This is because contaminants are more likely to deleteriously affect the electrical properties of integrated circuits as line spacing and interlayer dielectric thicknesses decrease.

One ultrahigh purity chemical used in the fabrication of integrated circuits is tetraethylorthosilicate (TEOS). The chemical formula for TEOS is $(C_2H_5O)_4Si$. TEOS has been widely used in integrated circuit manufacturing operations such as chemical vapor deposition (CVD) to form silicon dioxide films. These conformal films are generated upon the molecular decomposition of TEOS at elevated temperatures and reduced pressures (LPCVD), or at lower temperatures in plasma enhanced and atmospheric pressure reactors (PECVD, APCVD). TEOS is typically used for undoped, and phosphorous and boron doped interlayer dielectrics, intermetal dielectrics, sidewall spacers and trench filling applications.

Integrated circuit fabricators typically require TEOS with 99.999999+% (8–9's +%) purity with respect to trace metals. Overall, the TEOS must exhibit a 99.99+% purity. This high degree of purity is necessary to maintain satisfactory process yields. However, it also necessitates the use of special equipment to contain and deliver the high purity TEOS to the CVD reaction chamber.

Traditionally, high purity TEOS (and dopants) has been fed to the CVD reaction chamber from a small volume container called, an ampule. Historically, it was strongly believed ampules could not be metallic and that no metal should interface with the high purity TEOS or other source chemicals in the ampule. The use of metal ampules was spurned in the industry on the basis of the belief that high purity TEOS and other high purity source chemicals used in the semiconductor fabrication industry would pick up contamination from the metallic container in the form of dissolved metal ions. Thus, the industry used, almost exclusively, quartz ampules.

When these relatively small quartz ampules were emptied, they would simply be replaced with a full ampule. The ampules were not refilled in the fabrication area. The empty ampule was returned to the chemical manufacturer who would clean and refill the ampule.

Inconveniences resulting from the use of the quartz ampules are that they require frequent replacement due to their small size, which increases the potential for equipment damage. Furthermore, quartz ampules are subject to breakage, and have limited design versatility. Also, quartz has limited heat capacity making it difficult to control temperature of the ampule. Plus, the lack of effective quartz-to-stainless steel seals created significant leak problems.

In an attempt to solve the problem associated with quartz ampules, at least one supplier of ultrahigh purity chemicals, Advanced Delivery & Chemical Systems, Inc., going against the belief in the industry that high purity source chemicals should not be placed in contact with metal, developed a stainless steel ampule. This ampule was used to directly supply high purity TEOS and other high purity source chemicals to semiconductor fabrication equipment. As with the quartz ampules, when it was empty it was not refilled, but rather returned to the supplier for cleaning and refilling.

There were still several problems with using the stainless steel ampule. Namely, because of the small size of the these ampules, they often required frequent replacement. Also, an optical sensor employing a quartz rod was used to detect when the high purity TEOS reached a low level inside the ampule. Unfortunately, optical sensors, which employ a light emitting diode and a photodetector in combination with a quartz rod, require a high degree of maintenance because they are subject to misalignment if jostled. Furthermore, the conditioning circuit of the sensor must be constantly tuned because the sensor is subject to calibration drift, which can cause false sensor output signals. These problems can result in allowing the ampule to run dry or causing the premature removal of a partial or full ampule. Another problem with optical sensors is that they are prone to breakage in transport and cleaning, requiring frequent replacement. Despite these problems, optical sensors were used over more reliable metallic float sensor systems because of the fears of contaminating the high purity chemical with metal particles and metal ions.

In an attempt to solve the problem of frequent replacement of stainless steel ampules, a larger five gallon stainless steel tank was developed to refill the smaller stainless steel ampule. This tank also used an optical level sensor to detect when the container had been depleted, despite all of the problems associated with optical level sensors. Like the ampule in the previous configuration, this tank was not refilled, but was rather returned to the supplier for cleaning and refilling. Due to the size and weight of the five-gallon tank, it is subject to more physical jarring than the smaller ampules when transported and changed out with empty canisters, thus causing a higher frequency of problems with the traditional optical sensors used to detect a low level of source chemical in the delivery system.

Furthermore, in this refill configuration a second optical sensor, with all of the problems associated with such sensors, was required in the ampule to signal when the ampule was full during the refilling process. This, in some cases, required another opening in the ampule which is undesirable, because this introduces additional potential for leaks and contamination points.

In an attempt to overcome the problems associated with the optical sensors, a metallic level sensor was employed to detect low levels of high purity chemicals in the five-gallon bulk container. The metallic level sensor generally consisted of a toroidal shaped float made of stainless steel held captive on a hollow shaft made of electropolished stainless steel. The float contained a fixed magnet. A digital reed relay was secured at a fixed position inside the shaft at an alarm trigger point. As the float travelled past the reed relay, the fixed magnet would change its state, thus causing a low level alarm condition to be signaled. A replacement tank would then be substituted. The digital magnetic reed relay used in the metallic float level sensor provided much more reliable detection of low source chemical levels in the remote tank, because the magnetic reed switch is a low maintenance mechanical switch and provides positive on/off switching. As before, the empty 5-gallon container was never refilled by the user. It was always returned to the chemical supplier for cleaning and filling.

A low level metallic float sensor has also been used more recently in the stainless steel ampule. Due to fears associated with contamination, however, the ampules were not refilled by the user and were only used in stand alone systems. As with the five-gallon tank, when the metallic level sensor indicated the high purity TEOS or other high purity source chemical level was low, the ampule was simply replaced with a full ampule. In no instance was a metallic level sensor used to detect the level of high purity TEOS or other high purity source chemical in an ampule when the ampule was used in any refill type system. Ampules used in refill type systems have not used a float-type sensor or any other sensor with movable parts.

The use of metallic level sensors has been spurned in ampules used in refill type systems because of the strong belief in the industry that sliding metal to metal contact will cause the shedding of metal particles and dissolution of metal ions, thus contaminating the high purity TEOS or other high purity source chemical employed in the delivery system. This belief exists despite the use of low level metal float sensors in stand alone stainless steel five-gallon tanks and in stainless steel ampules. This is because in the stand alone systems, the tank or ampule is exchanged with a replacement tank or ampule, respectively, following each use. Furthermore, following each use, the tank or ampule is cleaned before refilling for a subsequent use. Both the cleaning and refilling are accomplished at a remote location by the supplier of the source chemical. Therefore, the amount a metal float travels in a stand alone system is limited to one fill and drain cycle. On the other hand, in a refill system the ampule is periodically refilled from a remote bulk container after each time it is emptied. Further, in a refill system, the ampule is never completely drained of high purity TEOS or other high purity source chemical between each refilling. Thus, integrated circuit manufacturers and source chemical suppliers have had an unsubstantiated concern that with repeated fillings of the same ampule over a period of time, the metal ion concentration and metal particles in the ampule would increase to an unacceptable level. As a result of this concern, ampules that have been used in refill type systems have always been equipped with the optical sensors or with sensors with non-movable parts, such as, for example, capacitance probe sensors, despite the knowledge that metallic float level sensors were much more reliable in refill systems.

Because, as noted above, optical sensors and capacitance probe sensors require a high degree of maintenance and are subject to frequent failure, the reliability of the bulk chemical refill systems using sensors without moving parts have been in question. When these sensors fail to detect a low or "empty" level, the ampule can run dry during the CVD process. As previously discussed, this can destroy the batch of wafers then in process or force their rework at a cost of thousands to tens of thousands of dollars. On the flip side, when sensors fail to detect the high or "full" level during a refill cycle, the ampule can be overfilled potentially causing damage to costly equipment; wasting expensive high purity source chemical such as TEOS and dopants (high purity TEOS costs approximately $2,000/gal.); contaminating the fabrication area, which is typically a class 1 or class 10 clean room environment; contaminating or damaging other equipment in the clean room; ruining the wafers being processed; and causing severe personal safety concerns. In the past, to avoid these problems semiconductor equipment manufacturers have used refill systems with redundant level sensors to minimize the impact of sensor malfunctions, used other level sensor types (excluding the above-described float type sensors), employed timed refill, or employed measured refill of only a small fixed volume or measured mass of chemical. These refill systems suffer characteristic performance problems arising from: non-linearity of alternate sensor technology, uncertainty of the refill volume, the lack of a positive shut-off of the chemical fill, the risk of malfunction due to maladjustment of system components or the lack of level monitoring of the bulk chemical source. Therefore, a need exists for a reliable bulk chemical refill system for applications where a high degree of chemical purity must be maintained, and a high level or error free refill confidence must exist.

A number of problems have been found to exist with capacitive sensors currently used with rectangular ampules used for example in Applied Materials' P5000 CVD unit. These problems include leak integrity, repeatability and reliability problems. While the desire to obtain a continuous level output from the rectangular ampule is a worthwhile goal, the basic design of the capacitive sensor is poor, making systems using a capacitance probe somewhat unreliable and hence, unsafe.

Due to the complexity of capacitive level sensors, it is time consuming and difficult to properly disassemble, clean and assemble them. Because of this, certain chemical suppliers, rather than take on this task, may leave the capacitance probes assembled during ampule refill cycles. If critical parts are not properly cleaned and replaced upon each chemical refill, however, the probability of leaks occurring and improper level sensing may increase. When Trimethylborate (TMB) or Trimethylphosphite (TMP) is the source chemical, failure to replace critical parts or improper replacement of these parts typically leads to source chemical leaks at the capacitive sensor and, occasionally, at the site glass located in the front of rectangular ampules. These leaks can pose significant safety and process integrity problems.

Because the capacitive level sensor design has not exhibited the longevity required to sustain several chemical fills between consumable parts replacement, the present capacitance probe design has not been widely used in refill systems. Rather, rectangular ampules filled with TMB or TMP and utilizing capacitive sensors have been removed and refurbished.

The combination of the O-ring gland design, the chemical interaction and the elevated temperatures have been known to cause mechanical failure of the sealing O-rings on the capacitance probes. Specifically, there are two out of four O-rings that have been known to fail on a regular basis. These two O-rings form a seal on the inner rod and on the outer surface of the outer sheath of the probe and are particularly prone to leaks because the sealing surfaces are angled providing poor control of O-ring compression. The most severe failures in one or both of these O-rings can result in a very dangerous situation in which TMB or TMP can leak in large quantities during manufacture or, if in shipment, in the shipping crate. The manufacturer of the O-rings, DuPont, has also expressed concern over the gland design of certain capacitive sensor probes in that it does not have adequate volume for the O-ring to expand with a rise in temperature and with the minor interaction with the chemical that it is exposed to.

Further, the capacitance style sensor has been known to have problems in other industrial applications in terms of reliability and repeatability. The capacitive level sensor used in CVD systems is no exception. When rectangular ampules are shipped back to chemical suppliers for refurbishing and refilling, routinely they are shipped back well above the low level mark resulting in wasted chemical. Also, at other times, the ampules are run dry, destroying the wafers in process. Moreover, in some systems the capacitance reading for these sensors exceeds that of the interface board designed to interpret its level and convert it to an analog signal. The result is the capacitive sensor has poor repeatability and accuracy in CVD systems.

Capacitive sensors also have poor sensitivity to level changes where because of the electrical conductivity of the chemical the overall capacitance changes very little even with large volume differences such as for example with TMB and Triethylborate (TEB). Accordingly, a reliable level sensor and refill system for rectangular ampules is desirable.

SUMMARY OF THE INVENTION

The present inventions address and solve these problems. This is accomplished through various combinations a bulk chemical delivery system and components for delivery of chemicals, including high purity chemicals. One of these inventive components is a highly reliable sensor which allows for the easy refilling and cleaning ampules, automatic and semiautomatic manifold and methods for using the manifolds and components in high purity bulk chemical delivery systems.

A refillable ampule according to one embodiment of the present invention comprises a digital level sensor for sensing a levels of chemicals in the ampule. The digital level sensor transmits this signal to a control unit that can be used to automatically start and stop the refilling process. Additionally the refillable ampule may include a digital sensor that either provides an automatic signal for starting the refilling process or an audible or visual alarm to alert an operator that the container is empty and requires refilling. The sensor can also send a signal to the processing equipment indicating the empty state of the ampule. Preferably, due to the need for highly reliable level detection, the sensor is a digital level sensor comprising, for example a two-pole magnetic reed switch that can be interfaced through an interface circuit with electronics on existing semiconductor processing equipment such as chemical vapor deposition equipment.

An aspect of a refill system made in accordance with the invention is a control unit. The preferred control unit includes circuitry for processing the high level signal from a digital sensor in a refillable ampule to automatically discontinue the refilling process. Additionally, the control unit can include circuitry for processing the low level signal and automatically beginning the refilling process. The system can be fully automatic, and, if so, the control unit will also include circuitry for controlling the necessary valves associated with the refill lines as well as for processing a signal from a remote bulk container.

In one embodiment of one the present inventions, the configuration of the control unit is such that it provides for manual start and automatic shut off of the refill cycle. In this configuration the control unit, when it receives the low level signal from the low level sensor in the refillable ampule, illuminates a visual alarm indicator or sounds an audible alarm for signalling the operator to begin the refilling process. This warning indicator need not be incorporated into the control unit, but may be also incorporated into a CVD reactor, an independent alarm module, or a temperature controller entirely separate from the control unit. Once such a warning is signaled, it is up to the operator to close off the valves that apply pressurized inert gas to the refillable ampule and to vent the refillable ampule to atmosphere. The pressurized inert gas is a traditional medium for supplying the high purity chemical to the semiconductor equipment. It is then up to the operator to initiate the actual flow of the high purity chemical from the remote container to the refillable ampule by, for example, pressing a fill button on the control unit. In this configuration, once the fill sequence is initiated, a valve, which is preferably a pneumatic valve, in the refill line is caused to open. The refillable ampule is then refilled with a high purity source chemical such as TEOS, TMB, TMP or other high purity chemical from the bulk container. The actual transfer of the high purity source chemical from the remote bulk container to the refillable ampule, may be accomplished by pressurizing the remote bulk container with an inert gas that pushes out the high purity source chemical. In this configuration, at this point the operators involvement is complete.

In this configuration when the refillable ampule is full a high level digital sensor can be used to transmit a signal to the control unit. The signal is processed and the pneumatic valve is closed. Additionally, or alternatively, an audible and visible alarms may be sounded and illuminated. As a safety precaution the digital sensor in the refillable ampule may also include a "high-high" level sensor. This sensor can be used as an emergency shutoff when the normal high level sensor fails. Preferably, this sensor signals the control unit that the refillable ampule is full by an independent circuit from the normal high level or full signal within the control unit.

A manual shut off configuration is also possible and within the scope the disclosed inventions. In such a configuration, the control unit can still be used to indicate that the refillable ampule is full but would not necessarily automatically close the pneumatic valve. In this configuration, to stop the flow of high purity chemical from the remote bulk container to the refillable ampule, the operator may be required to manually depress a button on the control unit to close the valve and terminate the fill cycle.

The control unit may also be configured to interface with a digital level sensor in the bulk container. A digital level sensor in the bulk container may include any number of actual discrete sensors for providing an indication of the remaining volume of high purity chemical at any point in time. If a dual level digital metallic level sensor is used, the trigger points are preferably set at 20% source chemical remaining and at 5% or less source chemical remaining. Depending upon the application other trigger points can be used.

Through the unique arrangement of piping and valves interconnecting the bulk containers and refillable ampules, and their method and sequence of operation, bulk containers can be replaced without fear of contamination. This latter aspect of the inventions is especially useful in refillable high purity chemical bulk delivery systems.

The above and other objects, features and advantages of the inventions will become apparent from the following detailed description of the preferred embodiments, considered in conjunction with the accompanying drawings.

BRIEF DESCRIPTION OF THE DRAWINGS

FIG. 9 is a side view of a metallic level switch assembly for a refillable container according to an embodiment of the present invention;

FIG. 10 is a side view of metallic level switch assembly for a refillable container according to an embodiment of the present invention;

FIG. 20a is a partial cross section of a rectangular TEOS ampule and associated piping incorporating a digital probe sensor.

DETAILED DESCRIPTION OF THE DRAWINGS

Figure 1:
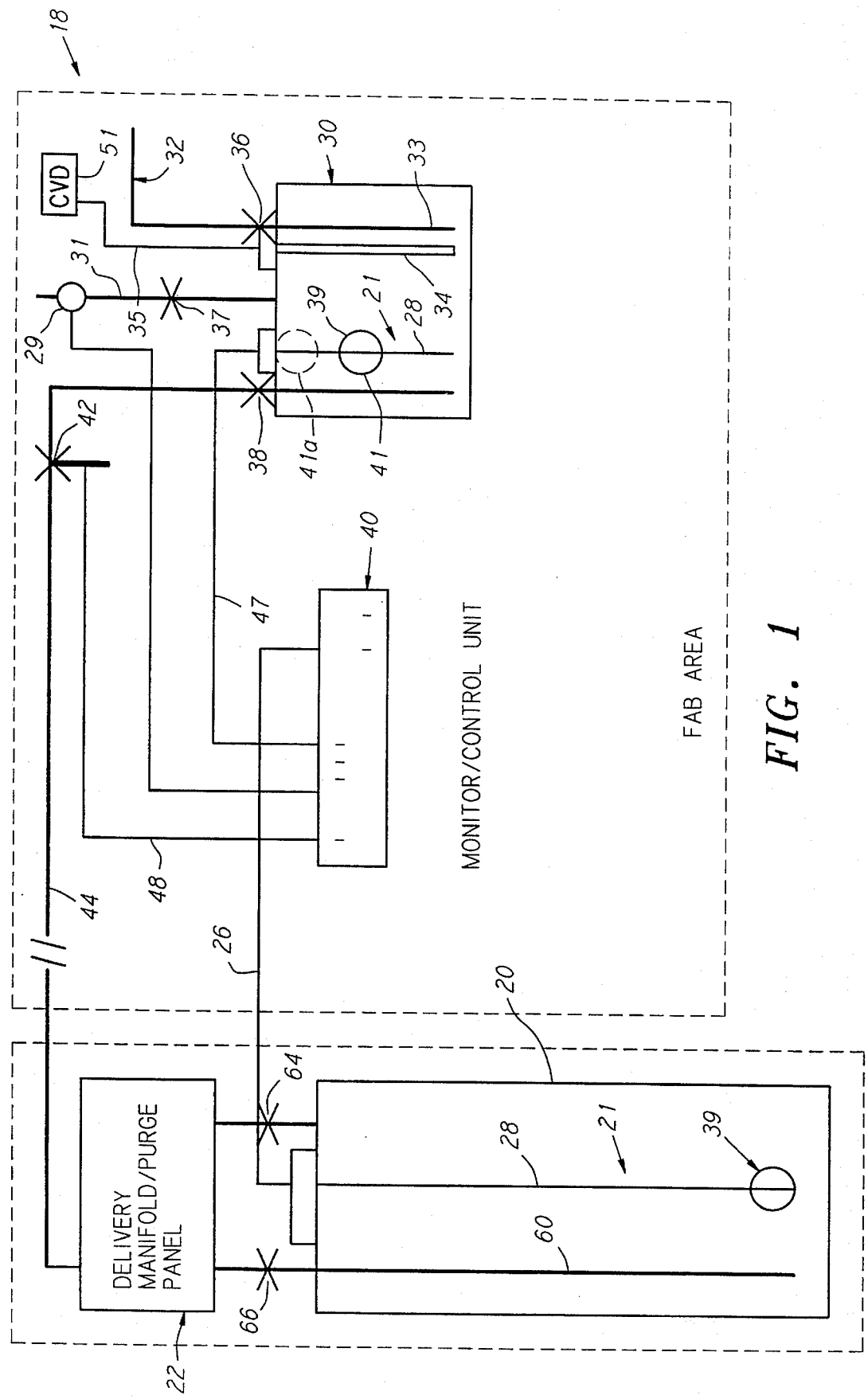
FIG. 1 is a schematic representation of a high purity chemical refill delivery system according to one embodiment of the present invention.

A preferred embodiment of a high purity chemical refill system is described in connection with FIG. 1. The system consists of three main functional components: a bulk canister 20 located in a remote chemical cabinet with a delivery manifold/purge panel 22; a refillable stainless steel ampule 30 to supply semiconductor fabrication equipment such as a CVD reactor with high purity TEOS or other high purity source chemicals; and a control unit 40 to supervise and control the refill operation and to monitor the level of the bulk container.

Bulk chemical refill system 18 has two basic modes of operation: a normal process operation and a refill mode of operation. Under normal process operation, refillable ampule 30 delivers high purity TEOS or other high purity source chemicals to semiconductor fabrication equipment fabrication equipment via delivery line 32. Delivery line 32 is connected to the semiconductor processing equipment using conventional process connections.

Figure 13:
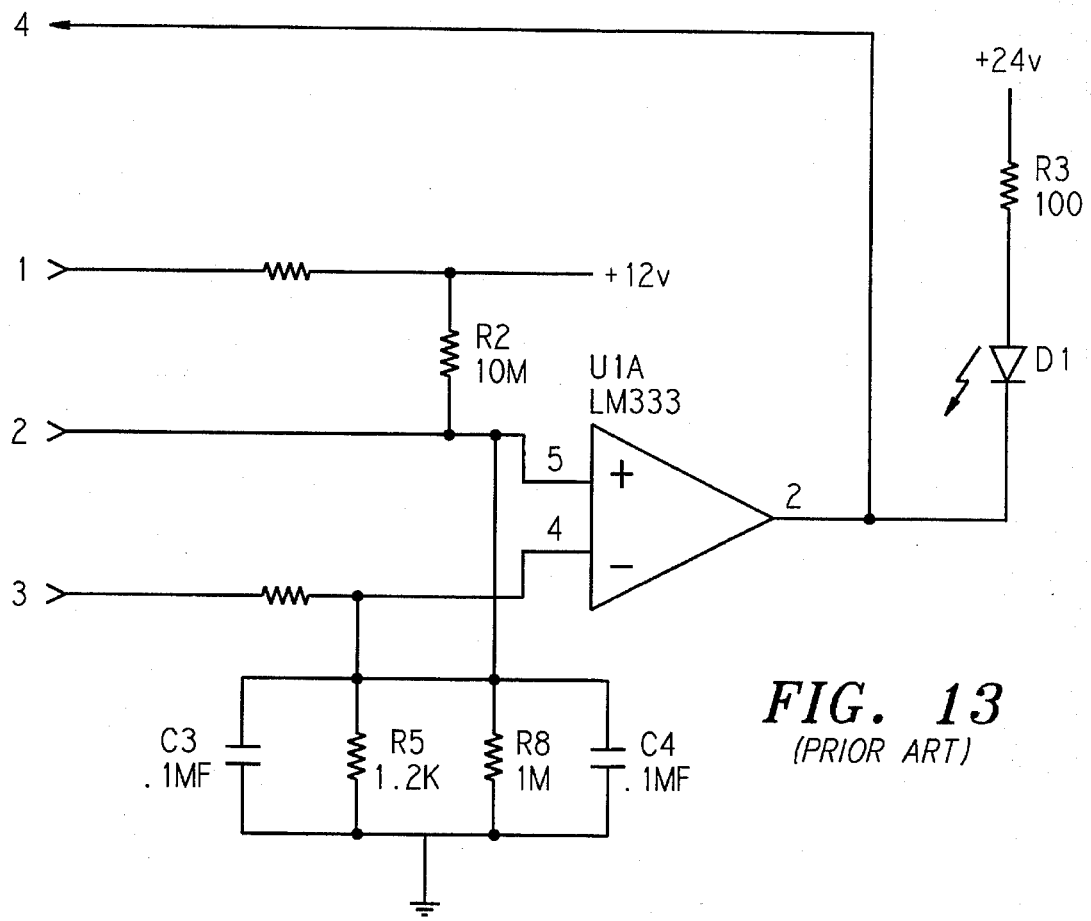
FIG. 13 is a schematic diagram of typical prior art conditioning circuitry for interfacing an optical level sensor with existing semiconductor processing equipment.

In this embodiment the refillable ampule 30 incorporates an optical sensor 34 for communicating a low level signal to the CVD reactor through the conventional low level sensor/reactor interface circuit shown in FIG. 13. When a low level signal is communicated to the fabrication equipment, the fabrication equipment will employ the signal in accordance with its normal conventional operation, such as its normal low level default procedure.

Figure 2:
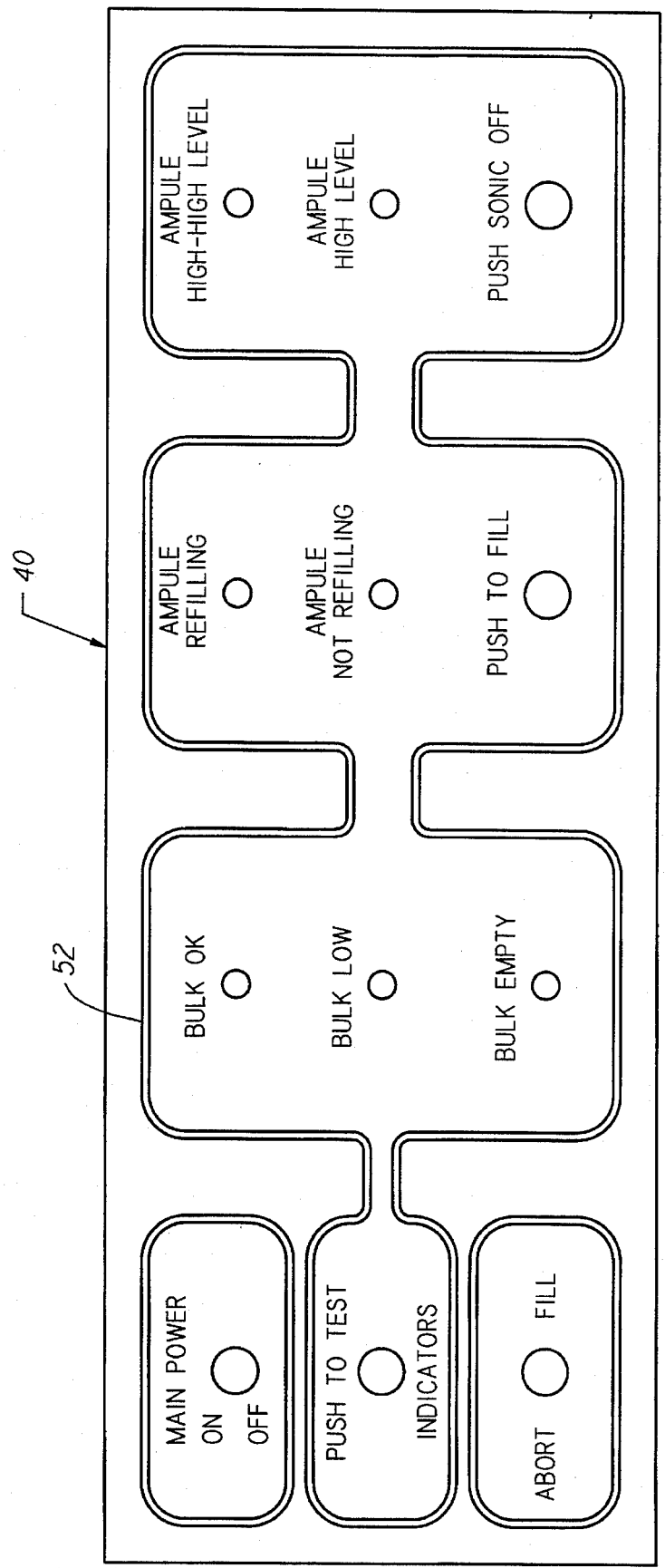
FIG. 2 is a front view of a control unit control panel according to one embodiment of the present invention.

FIG. 2 illustrates an embodiment of control panel 52 of control unit 40. Control panel 52 contains five switches: a "MAIN POWER" on off switch, a "PUSH TO TEST INDICATORS" switch, an "ABORT FILL" switch, a "PUSH TO FILL" switch, and a "PUSH SONIC OFF" switch. The operation of these switches is described in detail in conjunction with FIG. 15 below.

Control panel 52 also includes a number of illuminated indicators to report the status of chemical levels in bulk container 20 and ampule 30. The illuminated indicators include "BULK OK", "BULK LOW", "BULK EMPTY", "AMPULE REFILLING", "AMPULE NOT REFILLING", "AMPULE HIGH-HIGH LEVEL", and "AMPULE HIGH LEVEL".

A preferred method of operation of control unit 40 during normal process operation is described in connection with FIG. 2. During normal process operation, the level of source chemical in bulk container 20 should not change. Therefore, the "BULK OK" indicator should remain lit. However, if the "BULK LOW" or "BULK EMPTY" indicator came on during the last refill cycle, these indicators will remain illuminated until the bulk container 20 is replaced with a full container. The operation of the level sensors in bulk container 20 is explained in more detail below.

Throughout normal process operation, the "AMPULE NOT FILLING" indicator should remain on to indicate that the refill system is not in the refill mode. Because the level of high purity TEOS or other high purity source chemical in refillable ampule 30 changes throughout normal process operation, the "AMPULE HIGH" level indicator, which is illuminated upon completion of a refill cycle, will remain illuminated until the high purity TEOS or other high purity source chemical level in refillable ampule 30 falls below the "AMPULE HIGH" trigger point 41 of metallic level sensor 39.

It should be noted that if the "AMPULE HIGH-HIGH" indicator was illuminated during the refill process, as with the "AMPULE HIGH" indicator, the "AMPULE HIGH-HIGH" indicator will remain on until the high purity source chemical in ampule 30 falls below the "HIGH-HIGH" trigger point 41a of metallic level sensor 39. In such a case, the chemical level will fall through the "AMPULE HIGH" trigger region thus causing the "AMPULE HIGH" indicator to illuminate and then extinguish as described above.

The refill procedure is started either automatically or semiautomatically. The semiautomatic procedure begins by the operator manually configuring ampule 30 to the refill configuration. This is done by closing the outlet valve 36 on the ampule 30. In addition, the operator would verify that the inlet valve 38 is closed.

Because the high purity TEOS or other high purity source chemical is supplied under pressure to some CVD reactors by an inert gas such as He during normal operation, the ampule 30 may need to be depressurized and a vacuum pulled to ease the high purity TEOS or other high purity source chemical transfer process. The depressurization and degassing process are accomplished using standard techniques utilized in the chemical vapor deposition art through passage 31. After the depressurization step, the vacuum/ pressurization valve 37 is closed. Inlet valve 38 is now opened to allow the flow of high purity TEOS or other high purity source chemical into ampule 30. The depressurization would be unnecessary for other applications where pressurization of the headspace of ampule 30 would not present a problem.

The semiautomatic refilling process requires an operator to depress the "PUSH TO FILL" switch on control panel 52 of control unit 40 shown in FIG. 2. Once the "PUSH TO FILL" switch is pushed, the control unit 40 opens a valve 42 in the refill line 44. High purity TEOS or other high purity source chemical, depending on the application, then flows into the ampule 30 from the bulk container 20.

Valve 42 is preferably a pneumatically activated valve. When a pneumatically activated valve is used for valve 42, it is opened when a control pressure is supplied through passage 48 from control unit 40. The control pressure used to open valve 42 can be nitrogen or other pressurization gas such as plant compressed dry air. The flow of a control pressure through passage 48 is controlled by solenoid valves in control unit 40. The operation of these solenoid valves is described in detail below in conjunction with FIG. 15.

Bulk container 20 is continuously pressurized with an inert gas such as helium; thus, when valve 42 is opened, inert gas forces the high purity source chemical from bulk container 20 through refill line 44 and to the ampule 30.

Metallic level sensor assembly 21 in ampule 30 contains a high level metallic level sensor 39. Metallic level sensor 39 is preferably a dual level sensor capable of detecting two separate levels of source chemical in ampule 30. However, metallic level sensor 39 can also be a single level sensor, or a multiple trigger point level sensor up to a continuous level sensor. In the preferred embodiment metallic level sensor 39 is a dual level sensor with two trigger points, 41 and 41a. Trigger point 41 is for detecting a "HIGH LEVEL" (full) condition in ampule 30, and trigger point 41a detects a "HIGH-HIGH LEVEL" condition in ampule 30.

When the metallic level sensor 39 detects that the ampule 30 is full, it supplies a signal to the control unit 40 via cable 47. In response to that signal control unit 40 closes pneumatic valve 42 without operator intervention. Simultaneously, control unit 40 signals an audible and visual alarm on control panel 52. If the "HIGH LEVEL" trigger point 41 of metallic level sensor 39 should fail, the "HIGH-HIGH LEVEL" trigger point 41a of metallic level sensor 39 is in place and will trigger and instruct control unit 40 that the ampule 30 is full via cable 47 by an independent circuit within the control unit 40. This "HIGH-HIGH" alarm is a fail safe feature that prevents overfilling the ampule 30 and stops refilling in case of electrical failure of the "HIGH LEVEL" alarm circuit and is described below in connection with FIG. 15. Obviously, if metallic level sensor 39 is only a single level sensor, only a "HIGH LEVEL" condition can be detected, and no fail safe level detection is provided.

Control unit 40 also interfaces with a metallic level sensor assembly 21 in bulk container 20 via cable 26. The metallic level sensor 39 in the remote bulk container has its trigger points preferably set at 20% remaining source chemical and at 5% remaining source chemical. Depending on specific process requirements, however, other trigger points can be used. If the source chemical level falls below the first trigger point, which typically only occurs during the refilling sequence, a visual indication of "BULK LOW" on the control panel 52 of control unit 40 is produced. If the source chemical level falls below the second trigger point, a "BULK EMPTY" visual alarm on control panel 52 in addition to an audible alarm is produced in conjunction with an automatic termination of the refill sequence.

Control unit 40 can also be configured for manual shut off during the refill cycle. In such a configuration, the operator would terminate the refill cycle by manually depressing a button on control panel 52 upon acknowledging a visual or audible indication that the refillable ampule 30 is full. Similarly, a fully automatic start/automatic shut off configuration can be provided. This can be accomplished by replacing manual vacuum/pressurization valve 37 with an automatic valve preferably pneumatic, and placing a pressure sensor in the passage 31 to ampule 30. The pneumatic valve and pressure sensor are then connected to control unit 40. When a specified vacuum is pulled on ampule 30 at the beginning of the refill cycle to ease the flow of high purity source chemical into ampule 30, the pressure sensor in passage 31 would signal control unit 40. In response, control unit 40 would close the pneumatic valve 37 and simultaneously open pneumatic valve 42 in the refill line 44, thus automatically initiating the refill process.

An alternative refill procedure for ampule 30 will now be described. This refill procedure is applicable if the CVD processing equipment to which ampule 30 is attached has a separate valve, from that of valve 36 on ampule 30, in delivery line 32 for closing off the supply of TEOS or other high purity source chemical to the CVD reaction chamber in addition to separate valves from that of valve 37 for closing of the inert gas supply and the vacuum supply through passage 31 to ampule 30. One CVD machine that has such a layout is a Novellus Sigma Six machine. The following procedure is preferred for effecting a refill of ampule 30 with TEOS from bulk container 20 in such a system:

1. Ensure the System is Idle.
2. Ensure that the outlet valve 36, the vacuum/pressurization valve 37, and inlet valve 38 on ampule 30 are open.
3. Close the separate source chemical shutoff valve in delivery line 32.
4. Close the separate "Inert Gas Supply" valve in passage 31 of the CVD unit.
5. Open the separate "Vacuum" supply valve in passage 31 of the CVD unit and wait approximately 5 minutes until the pressure in ampule 30 is less than approximately 100 mTorr.
6. Close the separate "Vacuum" supply valve in passage 31.
7. Press the "PUSH TO FILL" button on control unit 40.
8. As with the above described refill procedure, two normal conditions will terminate the refill sequence:
   1) "AMPULE HIGH LEVEL". Ampule 30 is full. The "AMPULE HIGH LEVEL" indicator on control panel 52 will light, the sonic alarm will sound and control unit 40 will automatically close valve 42 in refill line 44. If the controller alarms for "AMPULE HIGH LEVEL", proceed to step 9.
   2) "BULK EMPTY". Bulk container 20 has an insufficient amount of source chemical in it to completely fill ampule 30. The "BULK EMPTY" indicator on control panel 52 will be on, the sonic alarm will sound and control unit 40 will automatically close valve 42 in refill line 44. If control until 40 alarms for "BULK EMPTY", proceed to step 14.
   Ampule 30 should typically be filled in less than 10 minutes if it has a capacity of 2 gallons or less. Therefore, if the SONIC ALARM does not activate within 10 minutes after starting the refill, steps 8a through 8j should be followed to ensure that a proper vacuum has been pulled on ampule 30.
8a. Press the "ABORT FILL" switch on control panel 52.
8b. Press the "SONIC OFF" switch on control panel 52.
8c. Ensure that valves 36, 37, and 38 on ampule 30 are open.
8d. Open the separate "Vacuum" supply valve in passage 31 of the CVD unit and wait approximately 5 minutes until the pressure in ampule 30 is less than 100 mTorr.
8e. Close the separate "Vacuum" supply valve in passage 31.
8f. Press the "PUSH TO FILL" switch on control panel 52.
8g. Wait for an audible alarm. When the audible alarm activates, observe the visual indicators on the front panel of the Controller. If the "AMPULE HIGH LEVEL" indicator is on, go to step 9. If the "BULK EMPTY" indicator is on, go to step 14.
9. Press "SONIC OFF" button on control panel 52.
10. Open the separate "Inert Gas Supply" valve in passage 31 of the CVD unit and wait 30 seconds.
11. Open the separate source chemical shutoff valve in delivery line 32.
12. Check all valve switches in the chemical supply cabinet of the CVD machine to verify that all of them are in their normal operating positions.
13. Return the CVD reactor to normal operation. If the audible alarm and "BULK EMPTY" indicators are both activated, then steps 14–19 should be followed:
14. Press "SONIC OFF" button on control panel 52.
15. Open the separate "Inert Gas Supply" valve in passage 31 of the CVD unit and wait 30 seconds.
16. Open the separate source chemical shutoff valve in delivery line 32.
17. Check all valve switches in the chemical supply cabinet of the CVD machine to verify that all of them are in their normal operating position.
18. Return the CVD reactor to normal operation.
19. Exchange the empty bulk container 20 for a full one at the earliest opportunity.

The "BULK LOW" visual indicator may be illuminated when the refill sequence is complete. This is a normal condition. Replacing bulk container 20 with a full container when the "BULK LOW" visual indicator is illuminated is not recommended because expensive high purity source chemical remains in bulk container at this point. Bulk container 20, therefore, should not be replaced until the "BULK EMPTY" indicator is illuminated. Ampule 30 may be refilled at any convenient time. It is not necessary to wait until a low alarm on the CVD processing equipment sounds before refilling.

The fill rate of ampule 30 is preferably approximately 2 liters/minute. Therefore, if a "BULK EMPTY" alarm activates within one minute of starting the refill sequence, bulk container 20 should be replaced immediately and the refill sequence repeated before resuming operation of the CVD reactor when ampule 30 has a capacity of 2 gallons or more.

Figure 3:
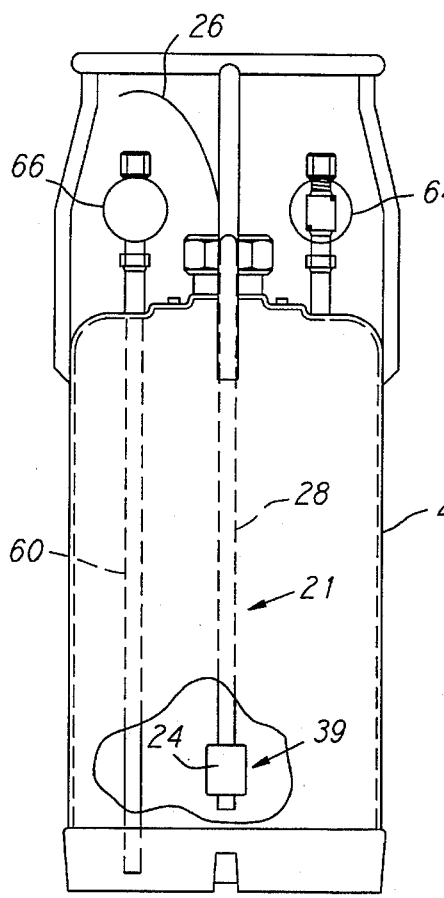
FIG. 3 is a side view in partial cross section of a five-gallon high purity bulk chemical container.

A particularly preferred bulk container 20 will now be described in connection with FIG. 3. Bulk container 20 is made of 316L electropolished stainless steel to minimize the risk of contamination to the high purity source chemical contained within the tank. Bulk container 20 typically comes in a five-gallon capacity. However, larger capacity canisters can be used for bulk container 20, including ten and twenty-gallon containers. Smaller containers may be used too, for example, one and two-gallon containers. Bulk container 20 is used to supply a bulk high purity source chemical such as high purity TEOS from a remote location to ampule 30. The source chemical is delivered by continuous pressurization of the canister with inert gas such as helium for on demand refill of the refillable ampule 30. The inert gas is supplied through the inlet valve 64. Inlet valve 64 is connected to and communicates with passage 88 of the delivery/purge manifold 22 which is in communication with an inert gas source. The outlet valve 66 also connects to the refill line 44 by way of manifold 22. Thus when container 20 is pressurized with helium gas or another suitable gas and pneumatic valve 42 is opened, high purity TEOS or other high purity source chemical is forced through outlet pipe 60, outlet valve 66, manifold 22, refill line 44, inlet valve 38 and into refillable ampule 30.

In one embodiment, bulk container 20 is provided with a metallic level sensor assembly 21 including a metallic level sensor 39 preferably comprised of a two pole reed switch triggered by a metallic float 24. It is understood that other types of triggers, such as a Hall effect sensor may be employed. The two-pole reed switch interfaces directly with control unit 40 through cable 26. Metallic level sensor 39 preferably is a dual level sensor, in that it incorporates two reed switches. As with the metallic level sensor 39 in refillable ampule 30, however, it can incorporate any desirable number of reed switches to detect one or more levels of source chemical. Further any number of separate metallic level sensors 39, each employing their own metallic float 24 may be employed.

The principle of operation behind metallic level sensor 39 is described in connection with the single level metallic level sensor 39 illustrated in FIGS. 4 and 5. Metallic level sensor 39 is comprised of a toroidal shaped metallic float 24 made of stainless steel or other non-magnetic, chemically inert material. Alternatively, metallic float 24 is coated with a fluoropolymer or other chemically inert coating. The preferred construction material is 316L stainless steel. Metallic float 24 contains a fixed magnet 23 and is held captive on a hollow metallic shaft 28. Shaft 28, however, is sealed on its bottom extending into ampule 30 to prevent high purity source chemical from flowing up into the shaft. Further, metallic shaft 28 is preferably made of electropolished 316L stainless steel or other chemically inert material. Alternatively, shaft 28 is made of a non-magnetic material coated with a fluoropolymer or other chemically inert material. Inside shaft 28, a digital magnetic reed relay switch RS is secured in a fixed position at a predetermined alarm trigger point. This trigger point corresponds, for example, to the "BULK EMPTY" trigger set point. A ferrule 46 is permanently attached to one end of shaft 28 for attachment to the container.

Additional reed relay switches RS may be added within shaft 28 to form a multiple level detector. For example, if a second reed relay switch RS is added at second fixed trigger point within shaft 28 a dual level float sensor is created. Additional reed relay switches RS may be added for any number of additional levels of detection.

Retainer rings 27 are used to restrain the movement of the metallic float 24 so that upon filling of bulk container 20, the float is restrained from sliding up the entire length of shaft 28, and sliding back down the entire length of shaft 28 as bulk container 20 is drained. It should be noted that, if desired the upper retainer ring 27 may be eliminated in this configuration. Only the lower retainer ring 27 is necessary to prevent metallic float 24 from sliding off shaft 28. Retainer rings 27 are also preferably constructed from 316 stainless steel, Kalrez™ or other suitable, chemically inert material.

Metallic level sensor assembly 21 comprising shaft 28, metallic float 24 and retainer ring 27 is preferably electropolished following assembly. In addition, the surface finish of all wetted metal parts is preferably Ra 20 or better prior to electropolishing.

Metallic level sensor 39 works as follows, when the liquid source chemical is above the upper retainer ring, the metallic float 24 remains at the top ring 27 in the "float up" position. As the liquid level drops, metallic float 24 moves down the shaft 28. When the magnetic field from fixed magnet 23 latches the magnetic reed switch RS, metallic float 24 is in the "float down" position. When the magnetic reed switch is closed, the indicator circuit is completed. This output signal is transmitted through one of two wires 25 in cable 26 to an alarm circuit in control unit 40.

Figure 4:
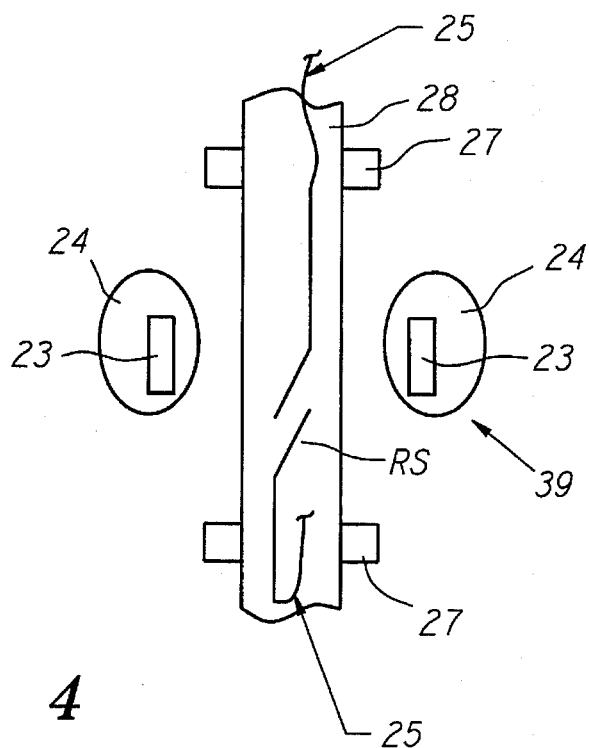
FIG. 4 is a schematic representation of a single level float control sensor in the "open" position.
Figure 5:
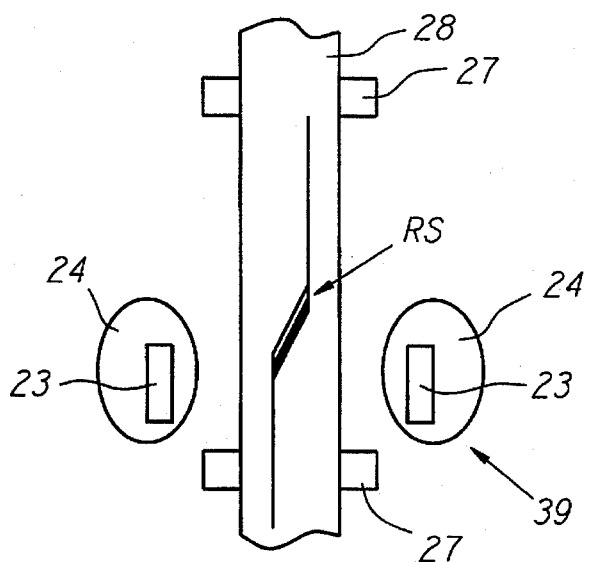
FIG. 5 is a schematic representation of a single level float level sensor in the "closed" position.

FIGS. 4 and 5 illustrate the use of a normally open magnetic reed switch RS. Alternatively, however, a normally closed magnetic reed switch can be used. In such a case, as the metallic float 24 travels pass the reed relay, the fixed magnet 23 will open the reed relay switch RS. Thus, the alarm condition is signaled either by opening the closed relay contacts or by closing the open reed relay contacts.

As discussed above, in the preferred embodiment, a dual level metallic sensor 39 is utilized. A dual level metallic sensor 39 is provided simply by securing a second digital magnetic reed relay switch RS at a desired alarm trigger point. The single metallic float 24 on shaft 28 can trigger both reed switches. If a dual level metallic sensor is used, four wires are found in cable 26 and are used to communicate the state of the switches to the control unit 40. Preferably, the second trigger point should be set for 20% source chemical remaining. In the preferred embodiment, this corresponds to the "BULK LOW" trigger point.

A second sensor configuration could incorporate a fixed magnet 23 inside a float made of the same materials as metallic float 24 and attached to shaft 28 by means of a hinge. As the float swivels, it brings the fixed magnet into proximity of a reed relay switch RS and changes the state of the reed relay from open to closed or closed to open.

Figure 7:
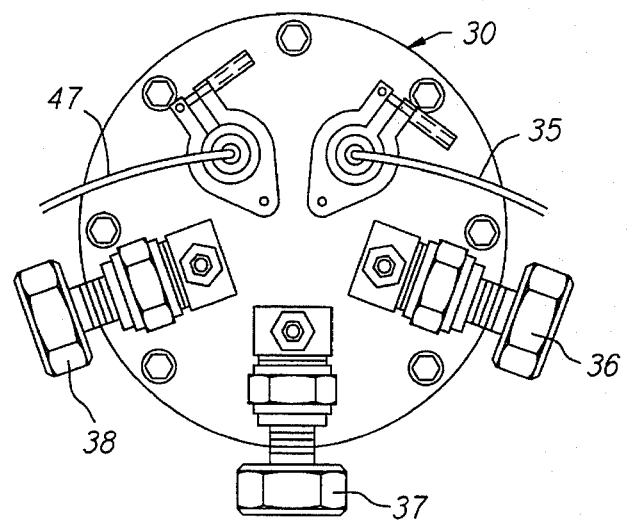
FIG. 7 is a top view of the refillable ampule illustrated in FIG. 6.
Figure 6:
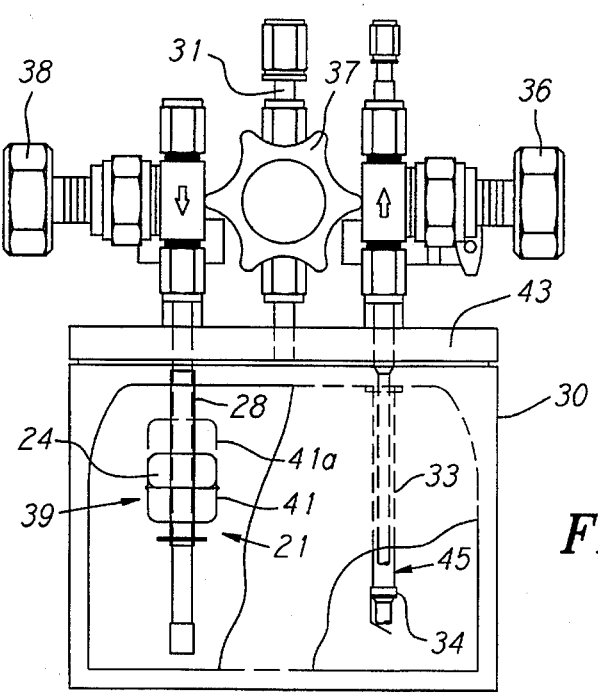
FIG. 6 is a side view in partial cross-section of a refillable ampule according to one embodiment of the present invention.

Refillable ampule 30 can now be described in connection with FIGS. 6 and 7. Refillable ampule 30 is preferably made from 316L electropolished stainless steel construction. Typically, ampule 30 has a 2.3 liter capacity, but can be provided in a wide range of sizes, including 1.3 liter, 1 gallon, 1.6 gallons, 2 gallons, and 5 gallons. The size of the ampule merely depends on process demands.

Vacuum/pressurization valve 37 permits refillable ampule 30 to be pressurized with an inert gas such as helium during normal process operation, which is typical of many CVD ampules. This valve also has the function of permitting the depressurization and application of a vacuum to ampule 30 prior to a refill sequence or removal of ampule 30 from the system 18.

Outlet valve 36 connects refillable ampule 30 to a delivery line 32 that supplies liquid high purity TEOS or other high purity source chemical directly to the semiconductor processing equipment during normal process operation. Thus, during normal process operation, helium or other inert pressurizing gas is supplied through vacuum/pressurization valve 37 to pressurize ampule 30. The pressure applied to the internal cavity of ampule 30 forces high purity TEOS or other high purity source chemical through hollow pipe 33 and outlet valve 36 to delivery line 32 that feeds a CVD reaction chamber. It should be noted that the entirety of pipe 33 is not shown on the drawing to allow the optical sensor assembly 45 to be seen. Normally the pipe 33 extends below the end of the optical sensor 34 to allow for proper operation of the system.

Figure 14:
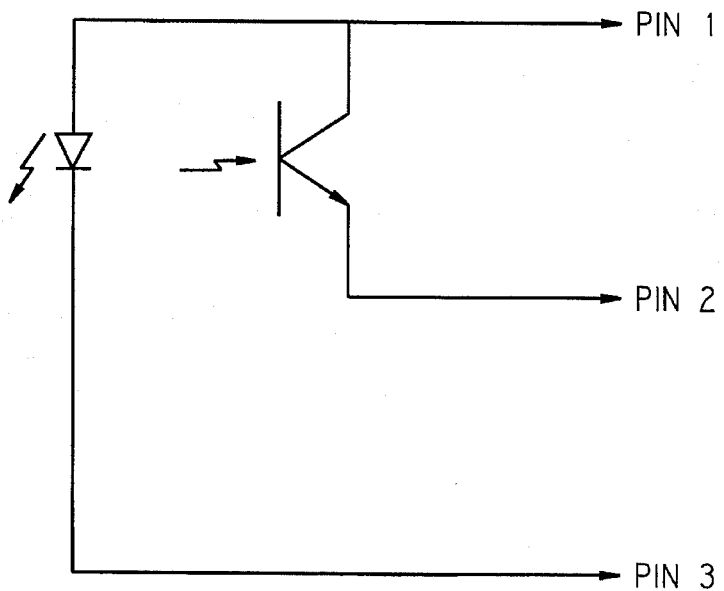
FIG. 14 is an electrical schematic diagram of a prior art optical level sensor.

In the depicted embodiment, low level sensor 34 is an optical sensor. It is of the type commonly used with standard CVD processing equipment, and need not be explained in detail. An electrical schematic diagram of the optical sensor 34 is illustrated in FIG. 14. Low level optical sensor 34 sends signals through cable 35 to an independent alarm module, the display panel for the reactor itself, or through a temperature controller, but not through control panel 40. Because low level sensor 34 is an optical sensor in the present embodiment of the invention, it can interface with the semiconductor processing equipment, independent alarm module or temperature controller using the existing circuitry illustrated in FIG. 13 for interfacing a low level optical sensor with a reactor, independent alarm module, or temperature controller.

Inlet valve 38 is a manual shut-off valve for the refill line 44. Valve 38 remains closed during normal process operation and is opened only during a refill sequence. In the fully automatic process this is an automatic valve, preferably pneumatically activated.

Metallic level sensor assembly 21 contains at least a single level metallic sensor level 39. Preferably, however, metallic level sensor 39 is a dual level sensor for detecting "HIGH LEVEL" and "HIGH-HIGH LEVEL" respectfully. The metallic level sensor 39 of the metallic level sensor assembly 21 operates in the same manner as described in connection with FIGS. 4 and 5. Metallic level sensor 39 illustrated in FIG. 6 is a dual level sensor with trigger points at "HIGH LEVEL" 41 and "HIGH-HIGH LEVEL" 41a.

Figure 8:
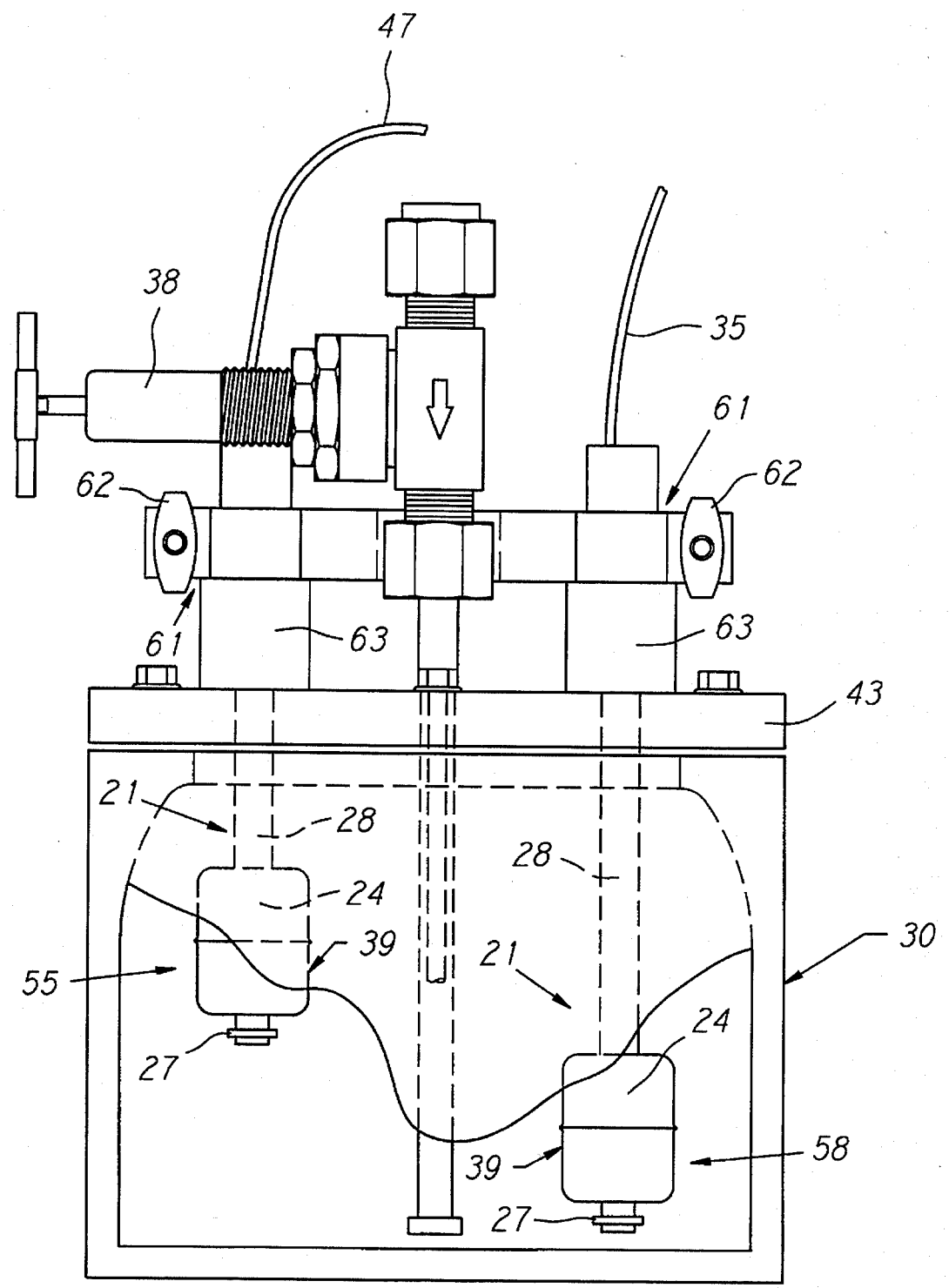
FIG. 8 is a schematic side view in partial cross-section of a refillable ampule according to an embodiment of the present invention.

A particularly preferred refillable ampule 30 is illustrated in FIG. 8. The ampule 30 in FIG. 8 has two metallic sensor assemblies 21, each comprising a metallic level sensor 39. The first 55 is for detecting high level conditions. As before, preferably metallic level sensor 39 is a dual level sensor as described in FIG. 6. The second 58 detects a low level condition. Low level metallic level sensor 58 is a single level float sensor that signals the CVD reactor, an independent alarm module, or a temperature control unit that the source chemical level with in ampule 30 has reached a low level, terminating normal process operations. Cable 35 carries two wires. These two wires are used to interface with the semiconductor processing equipment. In particular, the two wires are connected across pins 1 and 2 of the interface circuitry depicted in FIG. 13. When the metallic level sensor 39 is employed, pin 3 is left floating.

As is apparent from the above discussion, metallic level sensor assembly 21 can have a number of configurations. FIGS. 9–12 illustrate just a few of the available preferred configurations.

FIG. 9 illustrates a metallic level sensor assembly 21 for refillable ampule 30 comprising a metallic level sensor 39 with two trigger points a "HIGH LEVEL" trigger point 41 and a "HIGH-HIGH" level trigger point 41a.

Figure 15A:
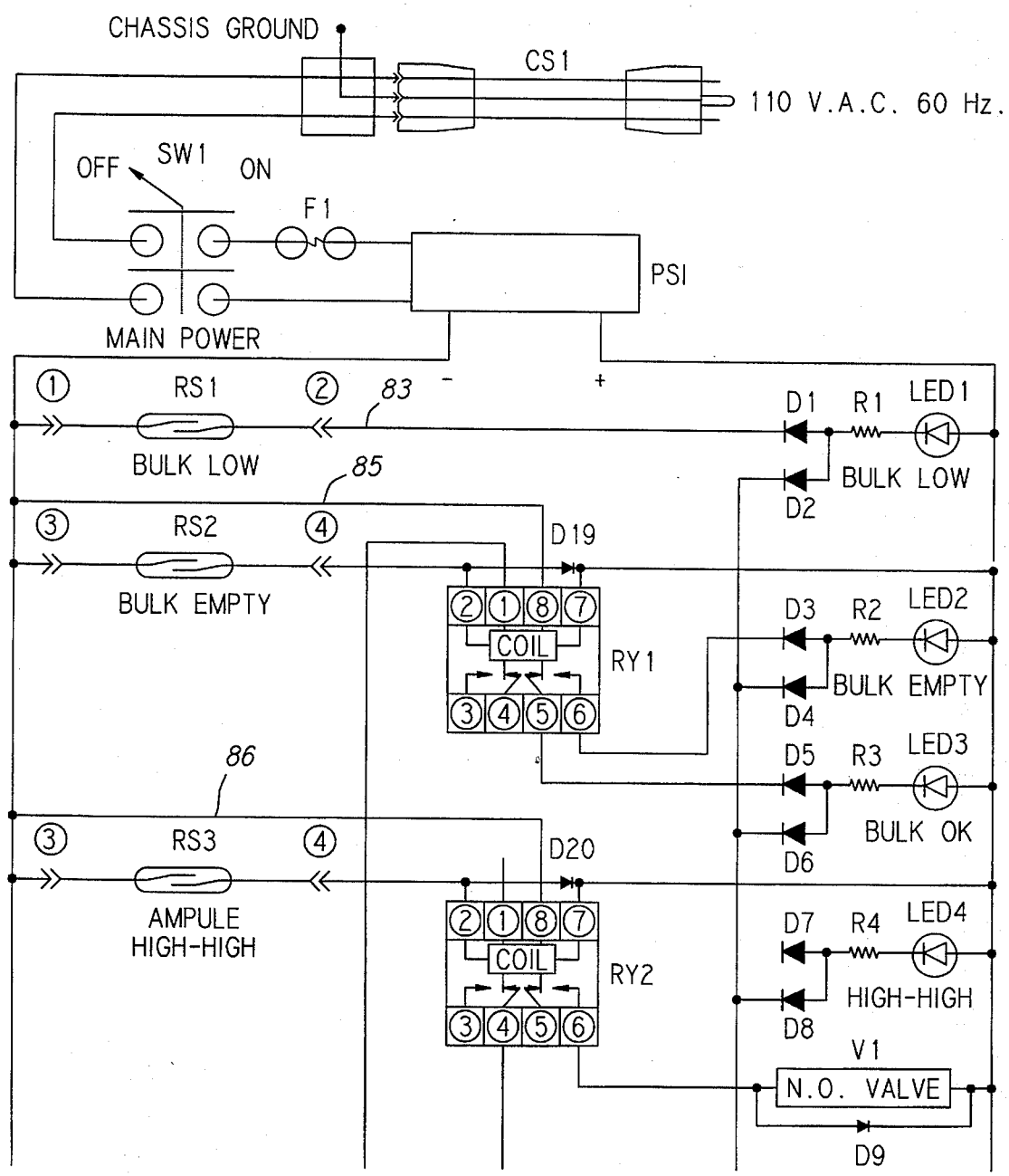
FIG. 15 is a schematic diagram of control circuitry for an embodiment of a control unit.
Figures 15, 15A, 15B:
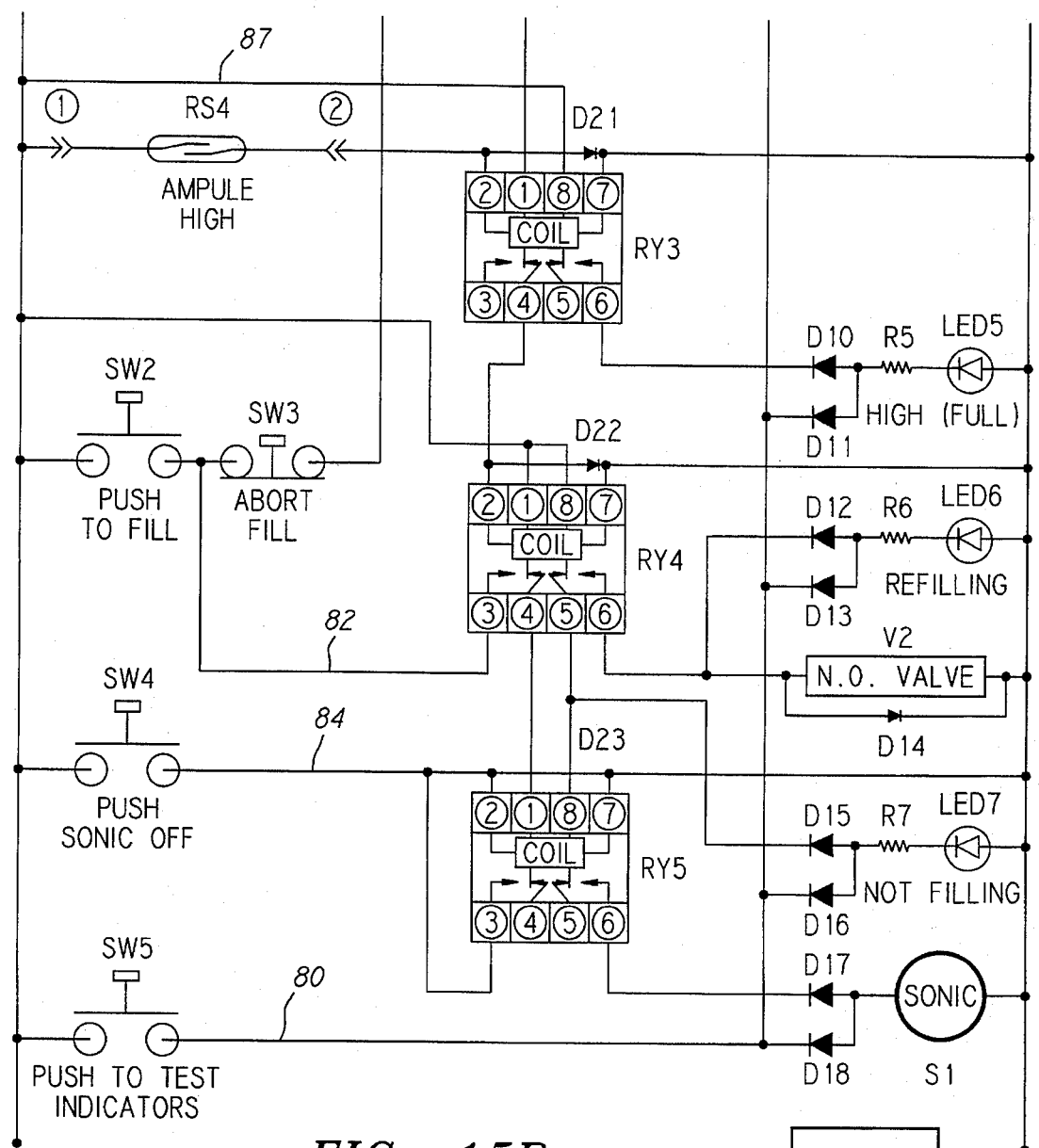

FIG. 10 illustrates a metallic level sensor assembly 21 for refillable ampule 30 comprising two metallic level sensors 39. The first 49 is a dual level sensor as described in FIG. 9. The second 50 detects a low level condition. Low level metallic level sensor 50 is a single level float sensor that signals the CVD reactor, an independent alarm module, or a temperature control unit that the source chemical level within ampule 30 has reached a low level, terminating normal process operations. High level metallic level sensor 49 is a dual level float sensor with two trigger points a "HIGH LEVEL" trigger point 41 and a "HIGH-HIGH" level trigger point 41a as previously described. This configuration has an advantage in that only one hole must be provided in the lid 43 of ampule 30 for the source chemical level sensors, thus reducing the potential for contamination of source chemical. The cable 35 carries six wires. Four of these wires terminate in the control panel as indicated in FIG. 15 and two are used to interface with the semiconductor processing equipment. In particular, the two wires are connected across pins 1 and 2 of the interface circuitry depicted in FIG. 13. When the metallic level sensor 39 is employed, pin 3 is left floating.

Figure 11:
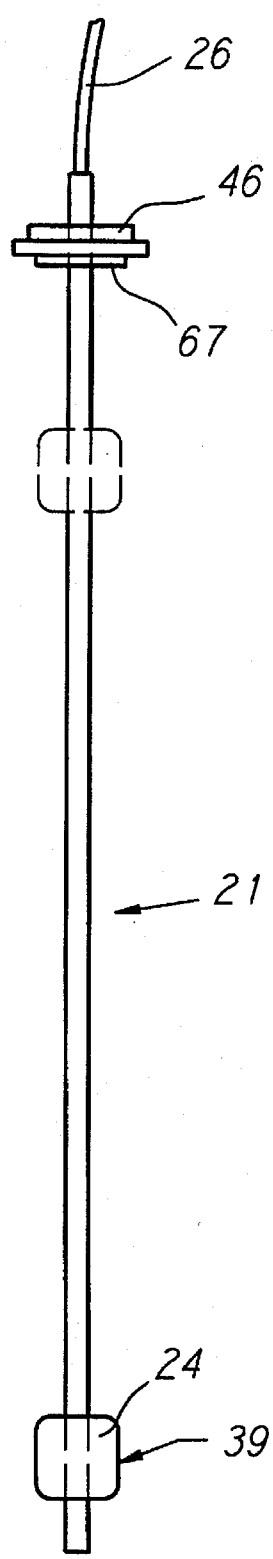
FIG. 11 is a side view of metallic level digital switch assembly for a bulk container according to one embodiment of the present invention.

FIG. 11 illustrates a metallic level sensor assembly 21 for a bulk container 20 comprising a dual level metallic level sensor 39 with trigger points set at a "BULK EMPTY" trigger point and at a bulk full trigger point. The bulk full trigger point is used by the supplier of the high purity source chemical to fill bulk container 20 after cleaning and servicing the tank.

Figure 12:
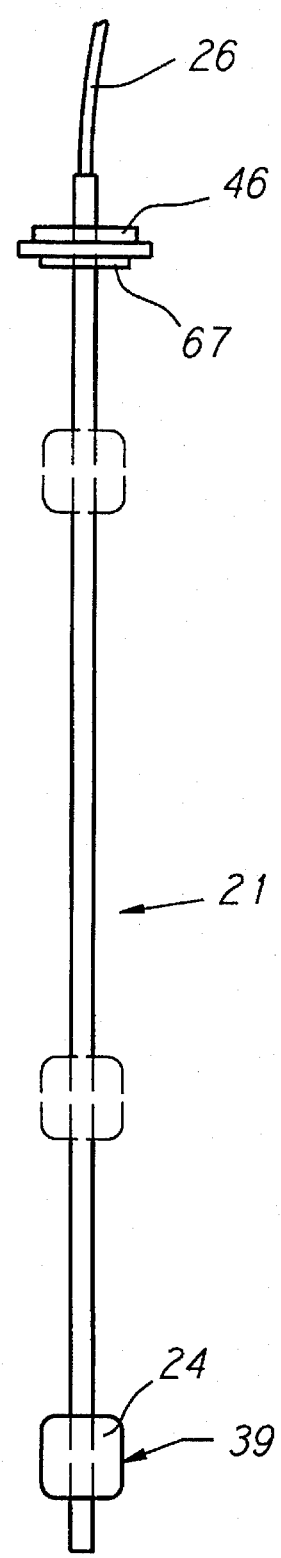
FIG. 12 is a side view of a metallic level digital switch assembly for a bulk container according to an embodiment of the present invention.

FIG. 12 illustrates a metallic level sensor assembly 21 for a bulk container 20 comprising a triple level metallic level sensor 39 with trigger points set to detect the following level conditions: "BULK EMPTY", "BULK LOW", and "BULK FULL". Again, the bulk full trigger point is used by the supplier to the high purity source chemical to fill bulk container 20 after cleaning and servicing the tank.

The manner in which metallic sensor assembly 21 is attached to ampule 30 is described in connection with FIGS. 8–12. A ferrule 46 is permanently attached to one end of shaft 28 for attachment of the metallic sensor assembly 21 to ampule 30. Ferrule 46 is preferably constructed from 316L stainless steel, and the preferred method of attachment is welding.

Metallic sensor assembly 21 is attached to ampule 30 using ferrule 46 in conjunction with clamp 61. Clamp 61 is preferably a flange clamp of the type used for sanitary piping. Clamp 61 is used to clamp flange surface 62 of ferrule 46 against a mating flange surface on a pipe 63 extending out of the top of ampule lid 43. Clamp 61 is tightened around ferrule 46 and the mating flange on pipe 63 by tightening knob 65. A teflon O-ring 67, which is interposed between the mating flange surfaces, is compressed as clamp 61 is tightened, thereby providing a leak tight seal.

Alternatively, metallic sensor assembly 21 can be attached to ampule 30 by welding a threaded connector plug to shaft 28. The threaded connector plug would then be threaded into a mating female connector on lid 43 of ampule 30.

The operation of control unit 40 will now be described in connection with FIGS. 1, 2 and 15.

Connection to the 110 V.A.C. 60 Hz. Plant Power is made via a standard U-ground male plug of the AC Cord Set CS1. Cord set CS1 plugs into the filter assembly L1. Filter L1 provides line conditioning for both incoming and outgoing transients and connects the AC power to the main power switch SW1. Filter L1 also provides the chassis ground connection.

Main power switch SW1, is a Double Pole Double Throw (DPDT) toggle switch located on the upper left-hand corner of the control panel 52 of the control unit 40. Both the hot and neutral sides of the AC line are switched ON and OFF. Switched AC power is connected to the Fuse F1 through main power switch SW1. Fuse F1 is ¾ AMP, 3AG size (¼"×1¼"), standard blow fuse mounted inside control unit 40.

Conditioned, switched, and fused AC power is connected to the AC input of the linear power supply PS1. Power supply PS1 is located inside the control unit 40 and provides regulated 24 V.D.C. power for the control unit 40 circuitry.

The "BULK LOW" circuit 83 will be described first.

When the level of source chemical in bulk container 20 is above the "LOW LEVEL" trigger point, float 24 is floated up and the "BULK LOW" sensor reed switch RS1, is open and the "BULK LOW" indicator LED1 is off. (It should be noted that the reed switches are only shown in representative form as being inside the control panel. In reality the reed switches are in respective containers in the metallic level sensor assemblies 21.)

When the level of product in bulk container 20 goes below the "LOW LEVEL" trigger point, float 24 floats down and the "BULK LOW" sensor reed switch RS1, is closed and the "BULK LOW" indicator LED1 is turned on.

With respect to the "BULK EMPTY" circuit 85, when the level of product in bulk container 20 is above the "EMPTY LEVEL" trigger point, float 24 is floated up and the "BULK EMPTY" sensor reed switch RS2 is open, and the control relay RY1 coil (pins 2 to 7) is deenergized. When RELAY RY1 is deenergized, the normally open contacts (N.O.) (pins 8 to 6), are open, and the "BULK EMPTY" indicator LED2 is off. When relay RY1 is deenergized, the normally closed (N.C.) contacts (pins 8 to 5) are closed and the "BULK OK" indicator LED3 is on. When relay RY1 is deenergized, the N.C. contacts (pins 1 to 4) are closed and the refill circuit is made.

When the level of product in the Bulk Container goes below the "EMPTY LEVEL" trigger point, the float 24 floats down and the "BULK EMPTY" sensor reed switch RS2 is closed, and the control relay RY1 coil (pins 2 to 7) is energized. When relay RY1 is energized, the N.O. contacts (pins 8 to 6) close and the "BULK EMPTY" indicator LED2 is turned on. When relay RY1 is energized, the N.C. contacts (pins 8 to 5) open and the "BULK OK" indicator LED3 is turned off. When relay RY1 is energized, the N.C. contacts (pins 1 to 4) open and the refill circuit is broken.

The ampule "HIGH-HIGH LEVEL" circuit 86 is now described.

When the level of product in the ampule 30 is below the "HIGH-HIGH LEVEL", the float 24 of dual level metallic level sensor 39 is floated down with respect to the "HIGH-HIGH LEVEL" trigger point 41a, and the ampule 30 "HIGH-HIGH" sensor reed switch RS3 is open. Thus, the control relay RY2 coil (pins 2 to 7) is deenergized. When relay RY2 is deenergized, the N.O. contacts (pins 8 to 6) are open and the "AMPULE HIGH-HIGH" indicator LED4 is off. When relay RY2 is deenergized, the N.O. contacts (pins 8 to 6) are open and the N.O. coil of air control valve V1 is deenergized and valve V1 is open. When relay RY2 is deenergized, the N.C. contacts (pins 1 to 4) are closed and the refill circuit is made.

When the level of product in ampule 30 goes above the "HIGH-HIGH LEVEL" trigger point 41a, the float 24 of dual level metallic level sensor 39 floats up with respect to the "HIGH-HIGH LEVEL" trigger point 41a, and the ampule 30 "HIGH-HIGH" sensor reed switch RS3 is closed. Thus, control relay RY2 Coil (pins 2 to 7) is energized. When relay RY2 is energized, the N.O. contacts (pins 8 to 6) close and the "AMPULE HIGH-HIGH" indicator LED4 is turned on. When relay RY2 is energized, the N.O. contacts (pins 8 to 6) close and the N.O. coil of control solenoid valve V1 is energized and valve V1 closes, stopping the refill cycle. When relay RY2 is energized, the N.C. contacts (pins 1 to 4) open and the refill circuit is broken.

With respect to the "AMPULE HIGH" circuit 87, when the level of product in ampule 30 is below the "HIGH LEVEL" trigger point 41, the float of dual level float sensor 39 is floated down with respect to the "HIGH LEVEL" trigger point 41, and the "AMPULE HIGH" sensor reed switch RS4 is open. Thus, the control relay RY3 coil (pins 2 to 7) is deenergized. When relay RY3 is deenergized, the N.O. contacts (pins 8 to 6) are open and the "AMPULE HIGH" indicator LED5 is off. When relay RY3 is deenergized, the N.C. contacts (pins 1 to 4) are closed and the refill circuit is made.

When the level of source chemical in the ampule 30 goes to or above the "HIGH LEVEL" trigger point 41, the float 24 of dual level metallic level sensor 39 floats up and the "AMPULE HIGH" sensor reed switch RS4, is closed and the control relay RY3 coil (pins 2 to 7) is energized. When relay RY3 is energized, the N.O. contacts (pins 8 to 6) close and the "AMPULE HIGH" indicator LED5 is turned on. When relay RY3 is energized, the N.C. contacts (pins 1 to 4) open and the refill circuit is broken.

Refill circuit 82 is now described. Before the refill cycle begins, the "PUSH TO FILL" switch SW2 is open, the "ABORT FILL" switch SW3 is closed, the control relay RY4 coil (pins 2 to 7) is deenergized, the N.C. contacts (pins 8 to 5) are closed and the "AMPULE NOT FILLING" indicator LED7 is on, the N.O. contacts (pins 8 to 6) are open and the "AMPULE REFILLING" indicator LED6 is off, the N.O. contacts (pins 8 to 6) are open and the N.C. coil of air control valve V2 is deenergized, and solenoid valve 12 is closed. When the N.C. solenoid valve V2 is closed, there is no control pressure supplied to pneumatic valve 42 through passage 48.

To start the refill cycle, the "PUSH TO FILL" switch SW2 is momentarily pushed closed, the coil of control relay RY4 (pins 2 to 7) is energized through the N.C. contacts of SW3, RY1 (pins 1 to 4), RY2 (pins 1 to 4), RY3 (pins 1 to 4). As RY4 energizes, N.O. contacts (pins 1 to 3) close. This energizes relay RY4 and latches it in the energized state. "PUSH TO FILL" switch SW2 may now be released.

The refill cycle continues with RY4 energized, the N.C. contacts (pins 8 to 5) are open and the "AMPULE NOT FILLING" indicator LED7 is turned OFF. Also, the N.O. contacts (pins 8 to 6) are closed, and the "AMPULE REFILLING" indicator LED6 is turned on. Finally, the N.O. contacts (pins 8 to 6) are closed and the N.C. solenoid valve V2 is energized and the valve is opened. When the N.C. solenoid valve V2 is opened, control pressure is supplied through passage 48 to pneumatic valve 42, opening pneumatic valve 42. Source chemical from bulk container 20 can now flow through refill line 44 to ampule 30.

The end of the refill cycle occurs in one of six (6) ways:

MODE 1: Control pressure failure: Pneumatic valve 42 closes, ending the refill cycle.

MODE 2: Power Failure: The N.C. solenoid valve V2 is deenergized and solenoid valve V2 is closed. When the N.C. solenoid valve V2 is closed, no control pressure is supplied through passage 48 to pneumatic valve 42. Thus, pneumatic valve 42 closes, ending the refill cycle.

MODE 3: ABORT FILL: If an operator presses the "ABORT FILL" switch SW3, which is a push-button switch, the refill circuit 82 is broken. Control relay RY4 de-energizes, N.O. contacts (pins 8 to 6) open, and N.C. solenoid valve V2 is de-energized, cutting off the flow of control pressure to pneumatic valve 42 and ending the refill cycle.

MODE 4: BULK EMPTY: If the level of product in the bulk container 20 goes below the "EMPTY LEVEL" trigger point, the float of dual level float sensor 24 floats down with respect to the "EMPTY LEVEL" trigger point, and the "BULK EMPTY" sensor reed switch RS2 closes. As a result, the control relay RY1 coil (pins 2 to 7) is energized, N.C. contacts (pins 1 to 4) open, and the refill circuit 82 is broken. This causes control relay RY4 to de-energize, N.O. contacts (pins 8 to 6) to open, and N.C. solenoid valve V2 is de-energized, closing solenoid valve V2. When the N.C. solenoid valve V2 closes, no control pressure is supplied through passage 48 to pneumatic valve 42. Thus, pneumatic valve 42 closes, ending the refill cycle.

MODE 5: AMPULE HIGH-HIGH: If the level of source chemical in ampule 30 goes above the "HIGH-HIGH LEVEL" trigger point 41a, the float of dual level float sensor 39 floats up with respect to the "HIGH-HIGH LEVEL" trigger point 41a, and the "HIGH-HIGH" sensor reed switch RS3 closes. In turn, the coil of control relay RY2 (pins 2 to 7) is energized, the N.O. contacts (pins 8 to 6) close, and the N.O. solenoid valve V1 is energized, closing the valve. When the N.O. solenoid valve V1 is closed, no control pressure can be supplied through passage 48 to pneumatic valve 42, thus ending the refill cycle. Additionally, when relay RY2 is energized, the N.C. contacts (pins 1 to 4) open, and the refill circuit 82 is broken. As a result, control relay RY4 de-energizes, N.O. contacts (pins 8 to 6) open, N.C. solenoid valve V2 is deenergized, causing solenoid valve V2 to close. When N.C. solenoid valve V2 is closed, no control pressure can be supplied through passage 48 to pneumatic valve 42, thus ending the refill cycle.

MODE 6: AMPULE HIGH: If the level of source chemical in the ampule 30 goes to or above the "HIGH LEVEL" trigger point 41, the float of dual level float sensor 39 floats up with respect to "HIGH LEVEL" trigger point 41, and the "AMPULE HIGH" sensor reed switch RS4 closes. In turn, the coil of control relay RY3 (pins 2 to 7) is energized. When relay RY3 is energized, the N.C. contacts (pins 1 to 4) open, and the refill circuit 82 is broken. As a result, control relay RY4 deenergizes, N.O. contacts (pins 8 to 6) open, N.C. solenoid valve V2 is de-energized, causing the valve to close. When the N.C. solenoid valve V2 is closed, no control pressure is supplied to pneumatic valve 42, ending the refill cycle.

Sonic circuit 84 is now described in connection with FIGS. 2 and 15. When the "MAIN POWER" switch SW1 is first turned ON, the sonic circuit 84 will self-test and an audible signal will be heard. The sonic transducer S1 is powered by the circuit through the N.C. contacts (pins 8 to 5) of relay RY4, through the N.C. contacts (pins 8 to 5) of relay RY5, and through Diode D17. The Operator presses the "PUSH SONIC OFF" switch SW4 to silence the audible signal.

When the "PUSH SONIC OFF" switch SW4 is momentarily closed, the Control relay RY5 coil (pins 2 to 7) is energized. As a result, N.C. contacts (pins 8 to 5) open, and the audible signal is turned off. Also, N.O. contacts (pins 1 to 3) close. When relay RY5 is energized, N.O. contacts (pins 1 to 3) are latched. "PUSH SONIC OFF" switch SW4 may now be released and the audible signal will stay off.

At the start of the refill cycle, control relay RY4 energizes. In turn, N.C. contacts (pins 1 to 4) and N.C. contacts (pins 8 to 5) open, de-energizing and un-latching control relay RY5 and simultaneously removing power from the contacts of RY5 connected to the sonic transducer S1. Therefore, the audible signal still remains off.

At the end of the refill cycle, control relay RY4 de-energizes. In addition, N.C. contacts (pins 8 to 5) close and, through the N.C. contacts (pins 8 to 5) of RY5, energize the sonic transducer S1 so that a audible signal is sounded.

At the Operator's discretion, the Sonic audible signal may be silenced by pressing the "PUSH SONIC OFF" switch SW4. When SW4 momentarily closes, control relay RY5 energizes and latches as described above. In turn, N.C. contacts (pins 8 to 5) open and de-energize the sonic transducer S1. Also, N.O. contacts (pins 1 to 3) close, energizing and latching relay RY5 in the energized state. "PUSH SONIC OFF" switch SW4 may now be released and the audible signal will stay OFF until the next refill cycle ends.

When the "PUSH TO TEST INDICATORS" switch SW5 is momentarily pressed, test circuit 80 is completed and power is connected to LED1, LED2, LED3, LED 4, LED5, LED6, LED 7, and sonic transducer S1, thus energizing all of these indicators.

Each Diode anode of test circuit 80 is connected in parallel to the direct drive Diode anode of the various indicator circuits. This blocks any potential false circuit paths.

Diodes D9, D14, D19, D20, D22, D23 are connected in parallel across their respective relay coils with their cathodes toward the positive power supply line. When a coil that has been energized is deenergized, the magnetic field that is created, quickly collapses and creates a transient voltage of opposite polarity to the energizing voltage across the coil terminals. Diodes D9, D14, D19, D20, D22, D23 provides a discharge path in its forward biased direction for this transient voltage and dissipates the stored energy. This configuration tends to protect the contacts of the switch that energizes the coil from high voltage spikes that may cause arc damage and also contributes to a quieter overall electrical environment.

Figure 16:
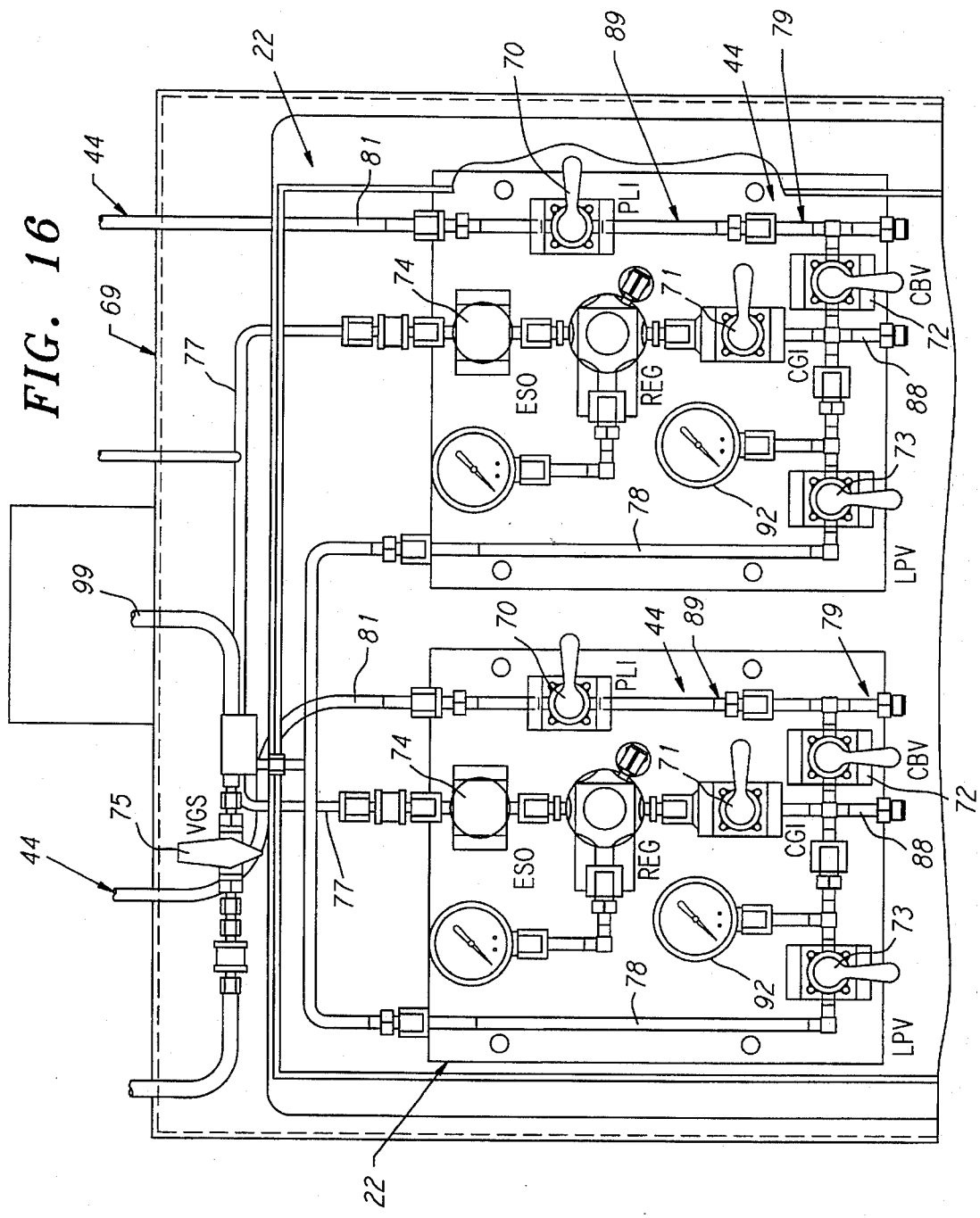
FIG. 16 is a front view of a manifold layout according to one embodiment of the present invention.

FIG. 16 illustrates a partial view of a chemical cabinet 69 having two manifolds 22 therein. Each manifold 22 connects up to a separate bulk container 20. Manifold 22 contains six valves: process line isolation valve 70, carrier gas isolation valve 71, container bypass valve 72, low pressure vent valve 73, emergency shut off valve 74, and vacuum supply valve 75. Obviously chemical cabinet 69 can have one or more manifolds in it depending on process requirements.

Figure 17:
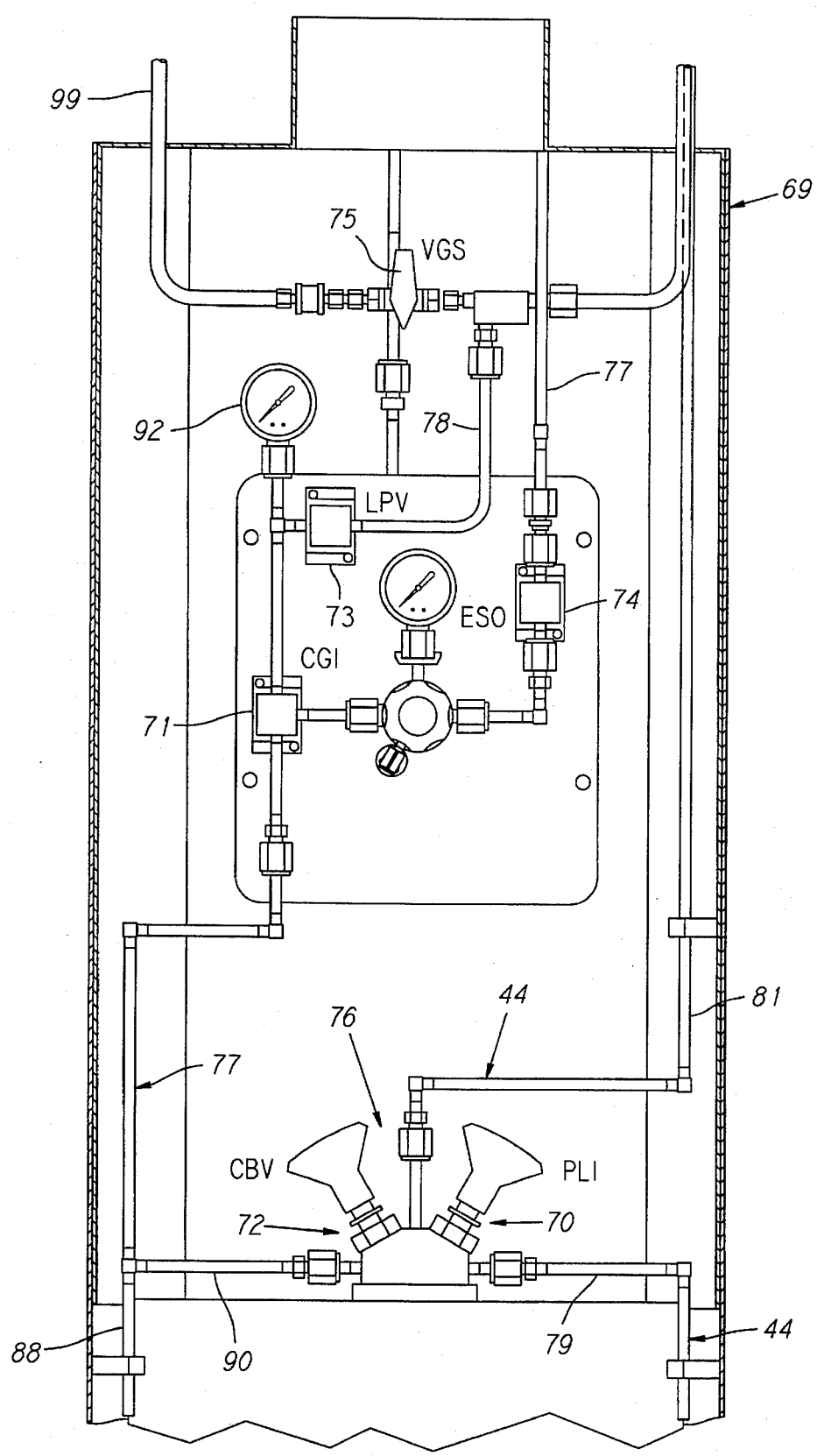
FIG. 17 is a front view of a manifold layout for an embodiment of the present invention.

A particularly preferred manifold arrangement is depicted in FIG. 17. The difference between the manifold in FIG. 16 and the one in FIG. 17 is that a block valve 76 contains both a container bypass valve 72 and a process line isolation valve 70. Thus, block valve 76 is substituted for separate valves 70 and 72 of FIG. 16. As a result of this modification, high purity source chemical is prevented from being trapped in the passage 89 of refill line 44 illustrated in FIG. 16. This is because passage 89 is effectively removed from the manifold with the use of block valve 76. Thus, the manifold configuration of FIG. 17 further reduces the risk of introducing contamination to the system.

Figure 18:
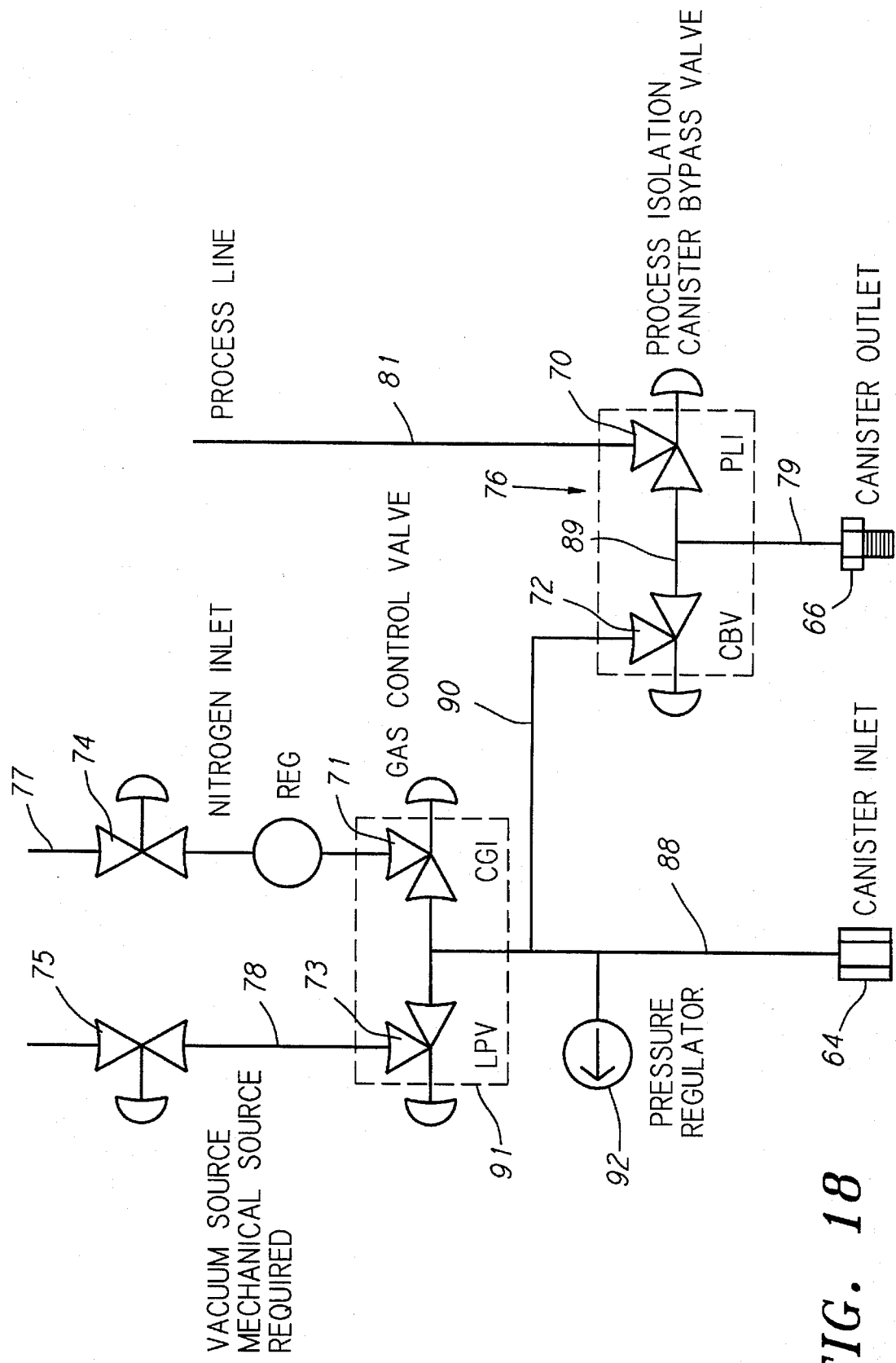
FIG. 18 is a schematic diagram of a manifold layout for an embodiment of the present invention.

A most preferred embodiment of manifold 22 is depicted in FIG. 18. In this embodiment, in addition to employing a process isolation block valve 76 for the canister bypass valve 72 and the process line isolation valve 70, a vacuum/pressure block valve 91 is used for the low pressure vent valve 73 and the carrier gas isolation valve 71. Again, as with the embodiment depicted in FIG. 17, the basic operation of the manifolds are the same. Thus, the description of the operation of the manifold for various processes applies to all three depicted embodiments.

Manifold 22 is preferably used to isolate the refill line 44 when the bulk container 20 is replaced with a fresh tank. This helps prevent contamination of the system. Thus, the preferred manifold 22, is not required for operation of refill system 18. Naturally, if a manifold is not used, bulk canister inlet valve 64 will need to be attached to a regulated source of inert gas and bulk canister outlet valve 66 will need to be connected to refill line 44.

Process line isolation valve 70 is interposed in refill line 44 between the inlet valve 38 of ampule 30 and the outlet valve 66 of bulk container 20. When process line isolation valve 70 is closed, the portion of process line 44 down stream from valve 70 is isolated from the atmosphere during subsequent replacement of bulk tank 20. Carrier gas isolation valve 71 is interposed in carrier gas line 77 between the inlet valve 64 of bulk container 20 and the carrier gas supply source.

Low pressure vent valve 73 is interposed in vacuum line 78, which is communicated to both the carrier gas line 77 and refill line 44. Container bypass valve 72, however, is interposed in the line between refill line 44 and low pressure valve 73. This line is both pressurized or evacuated dependent on the states of LPV and CGI.

Emergency shut off valve 74 is a normally closed valve, preferably a pneumatic valve. Thus, any loss in system air pressure will immediately close the valve. Typically emergency shut off valve 74 is controlled by the facility emergency gas pad shut off control system. The use of pneumatically activated normally closed valves in the manifold and on the bulk canister inlet and outlet enables all valves to act as emergency shut-off valves. Thus, when the ESO condition is activated, the pneumatic supply to the valves will be cut off, closing all valves. Vacuum supply valve 75 is disposed in a venturi loop 99 so that when it is opened, vacuum is supplied to vacuum supply lines 78.

During normal operation the manifold 22 is left in the delivery configuration. Pneumatic valve 42 in the refill line 44 is used to control the refilling operation. In the delivery configuration the emergency shutoff valve 74 is open, the carrier gas isolation valve 71 is open, the process line isolation valve 70 is open, the vacuum gas shutoff valve 75 is closed, the low pressure vent valve 73 is closed, the canister bypass valve 72 is closed, the bulk canister inlet valve 64 is open and the bulk canister outlet valve 66 is open.

To change the bulk canister 20, the following preferred procedure is used to prevent contamination of the high purity chemical being delivered. First the high purity chemical must be evacuated from the manifold and the bulk canister 20 depressurized and isolated. Next the manifold should be purged. After purging, the depleted bulk canister should be disconnected and removed. Then the new full bulk canister 20 should be installed and connected. The connections for the full bulk canister should be tested for leaks. The manifold should then be purged and the new bulk canister 20 placed in service.

To evacuate the high purity chemical remaining in the manifold 22 and to isolate, depressurize and shut off the bulk canister 20, the following procedure is presently preferred. (It should be noted that unless otherwise expressly noted, the emergency shutoff valve 74 should open be throughout all of the following procedures.) Ensure that the container bypass valve 72 is closed, which it should be in the delivery configuration. Then close the process line isolation valve 70. Next close the bulk canister outlet valve 66. Close the carrier gas isolation valve 71 and open the vacuum gas shutoff valve 75 and the low pressure vent valve 73. Wait until the manifold pressure gauge 92 reads approximately zero psia, which takes approximately four minutes. Close the bulk canister inlet valve 64. Close the low pressure vent valve 73 and open the carrier gas isolation valve 71 and the canister bypass valve 72. Open the canister outlet valve 66 and wait approximately a half a minute or until the bulk canister pressure equalizes with the pressurizing gas. Close the bulk container bypass valve 72, the bulk canister outlet valve 66 and the carrier gas isolation valve 71. Open the bulk canister inlet valve 64. The foregoing steps should preferably be repeated a number of times, most preferably a minimum of five times. Finally the bulk canister inlet valve 64 should be closed.

To purge the manifold prior to disconnecting the depleted canister 20, the following steps should preferably be followed. Open the canister bypass valve 72 and the low pressure vent valve 73. Wait approximately 30 seconds to maximize the evaporation of the residual high purity chemical in the manifold. Close the low pressure vent valve 73 and open the carrier gas isolation valve 71. Wait approximately 4 seconds and then close the carrier gas isolation valve 71. Open the low pressure vent valve for approximately 10 seconds and then close it again. Repeat the steps of closing the low pressure vent valve 73; opening the carrier gas isolation valve 71; waiting approximately 4 seconds and then closing the carrier gas isolation valve 71; and, opening the low pressure vent valve for approximately 10 seconds and then closing it again preferably a minimum of nineteen times. Then close the vacuum gas shutoff valve 75 and wait approximately three seconds. Then open the low pressure vent valve 73 for approximately five seconds.

To disconnect and remove the depleted bulk canister 20, the following steps are preferred. Open the carrier gas isolation valve 71 to keep a positive pressure of the pressurizing gas, preferably helium, on the manifold. Open the canister inlet and outlet valves 64 and 66. With a suitable tool, support the canister outlet valve 66 to prevent rotation, and then loosen the canister outlet valve 66 connection and disconnect the canister outlet tubing 79. In a similar fashion, disconnect the canister inlet tubing 88. The pressurizing gas should be flowing freely out of the canister inlet and outlet tubing 88 and 79 throughout the operation and until the new canister is connected. This prevents atmospheric contamination of the manifold. Disconnect the level sensor cable, unfasten the safety chains and straps and carefully remove the depleted bulk canister 20 from the enclosure.

A presently preferred method of disconnecting the depleted bulk container 20 consists of the following steps. Open the carrier gas isolation valve 71 to keep a positive pressure of the pressurizing gas, preferably helium, on the material. With a suitable tool, support the container outlet valve 66 to prevent rotation, and then loosen the container outlet valve 66 connection and disconnect the container outlet tubing 79. In a similar fashion, disconnect the container inlet tubing 88. The pressurizing gas should be flowing freely out of the container inlet and outlet tubing 88 and 79 throughout the operation and until the new container is connected to prevent contamination of the manifold. Disconnect the level sensor cable, unfasten the safety chains and straps, and carefully remove the depleted bulk container 20 from the enclosure.

To install a full bulk canister 20, the following steps should preferably be performed. Carefully place the bulk canister in the enclosure and reconnect the safety strap and chain. Connect the canister inlet valve 64 and outlet valve 66 connections to the inlet and outlet tubing 88 and 79 reversing the procedure used to disconnect them from the depleted bulk canister 20. Connect the level sensor cable and close the carrier gas isolation valve 71.

Before moving to the next step, a test for leakage should be performed. Open the vacuum gas shutoff valve 75 and the low pressure vent valve 73. After approximately 10 seconds, close the low pressure vent valve 73 and open the carrier gas isolation valve 71. After a few seconds, preferably four, close the carrier gas isolation valve 71 and the vacuum gas shutoff valve 75. Using an appropriate leak tester, check the inlet and outlet canister connections for leaks. If none appear, the manifold should be purged and then set for normal operation.

To purge the manifold, with the canister inlet and outlet valves 64 and 66 closed, the canister bypass valve 72, the vacuum gas shutoff valve 75 and the low pressure vent valve 73 should first be opened. The canister bypass valve 72 should already be open as a result of the purge sequence conducted before disconnecting depleted bulk container 20. After approximately 10 seconds, the low pressure vent valve 73 should be closed. Open the carrier gas isolation valve 71 for approximately four seconds and then close it. Repeat the opening and closing of the low pressure vent valve 73 and the carrier gas isolation valve 71 preferably a minimum of nineteen times. Open the low pressure vent valve 73 for approximately 15 seconds to ensure that vacuum has been pulled on the manifold and then close it. Close the vacuum gas shutoff valve 75 and the canister bypass valve 72.

To place the manifold 22 in the normal operating configuration, slowly open the carrier gas isolation valve 71. Then slowly open the canister inlet valve 64 and then the canister outlet valve 66. Adjust the pressure regulator to the desired delivery pressure and open the process line isolation valve 70.

In addition, the manifold 22 can be used to purge and evacuate the refill line 44 as well. To accomplish this, the purge and evacuation cycles would be performed with the process line isolation valve open and the pneumatic valve 42 closed. Also, if desired, additional parts of the system can be evacuated and purged by merely opening downstream valves to the final point that is desired to be purged. The suggested times for purging and evacuating should be extended to allow for the vacuum to be completely pulled on the lines being evacuated and purged.

While the bulk chemical refill system of the present invention has been described in connection with high purity TEOS, the system has application with many other high purity source chemicals, as a person of ordinary skill in the art would recognize. A non-exclusive list of the various high purity chemicals that might be used in the chemical refill system of the present invention is contained in Table 1.

TABLE 1

| | |
|---|---|
| Aluminum Tri-sec-Butoxide | Borazine |
| Carbon Tetrachloride | Trichloroethane (TCA) |
| Chloroform | Trimethylphosphite (TMP) |
| Dichloroethylene (DCE) | Trimethylborate (TMB) |
| Dichloromethane (DCM) | Titanium N-Butoxide |
| Diethylsilane (DES) | Titanium Isopropoxide |
| Hexafluoroacetylacetonate-Copper(I)-Trimethylphosphine | Tantalum Ethoxide |
| Silicon Tetrachloride | Triethylborate (TEB) |
| Tetrakis (Diethylamino) Titanium (TEAT) | Triethylphosphate (TEPO) |
| Triethylposphite (TEP) | Trimethylphosphate (TMPO) |
| Titanium Tetrachloride | Titanium Ethoxide |
| Triethoxyfluorosilane (FTEOS) | Titanium Isobutoxide |
| Trimethylorthosilicate (TMOS) | Titanium N-propoxide |
| Tetramethylcyclotetrasiloxane | |
| Tris(Trimethylsiloxy)Boron (TTMSB) | |
| Tris(Trimethylsilyl)Phosphate (TTMSP) | |

Now a particularly preferred use of a digital level sensor assembly 21 will be described in connection with FIGS. 19, 20 and 20a.

Figure 19:
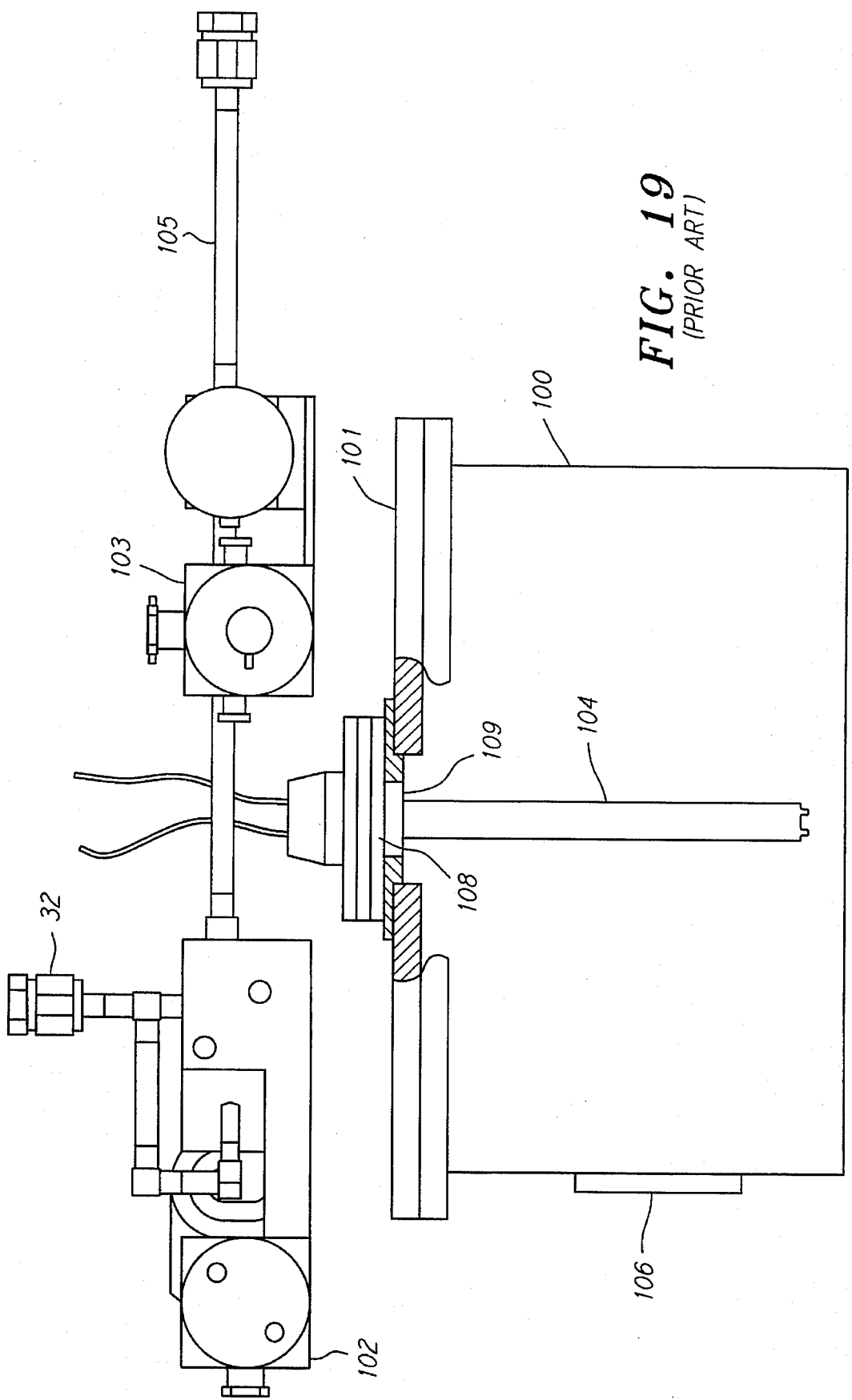
FIG. 19 is a partial cross section of a purge style rectangular dopant ampule and associated piping incorporating a prior art capacitance probe sensor.

FIG. 19 illustrates a rectangular ampule 100 of a configuration typically used in Applied Materials' P5000 CVD platforms for delivering TMB, TMP, TEPO or TEB dopants to a Plasma Enhanced Chemical Vapor Deposition (PECVD) reactor. The Applied Materials' P5000 CVD platform has two primary process types: (1) PECVD and (2) Sub-Atmospheric Chemical Vapor Deposition (SACVD). These processes utilize the same mainframe and chemical delivery platforms, although the exact configuration of the valves and piping on ampule 100 varies slightly between the two process types depending on the source chemical to be delivered to the CVD reaction chamber.

Rectangular ampule 100 is designed and manufactured to enable placement of seven ampules 100 in close proximity to the CVD reaction chamber. Rectangular ampules 100 are enclosed in a single "oven" type temperature controller, or hot box, that houses the ampules and the downstream hardware for flow control, purging, and liquid and particle control.

Rectangular ampule 100 illustrated in FIG. 19 is for delivering dopants such as TMB or TMP to a PECVD reaction chamber because it only has a single outlet/inlet valve 102. Pneumatic purge valve 103 in purge line 105 is merely for purging the delivery line 32. Earlier models of rectangular ampule 100 did not have this purge feature. The need to purge the delivery line 32 from a point of shutoff on the ampule back to the chamber was needed so that the low levels of chemicals with pungent odors, e.g., TMB and TMP, could be more completely removed.

Only a single valve is needed for delivery of dopants such as TMB or TMP to the PECVD reaction chamber because the standard dopants for PECVD type reactors are delivered to the reaction chamber simply by flowing vapor from above the liquid in the ampule. This is possible because the process flow rates required for some dopants, such as TMB and TMP, are much lower than that required by, for example, TEOS. Further, the vapor pressure of these dopants is much higher than that for TEOS. As a result, pressurized delivery of the source chemical is not required as with TEOS. When a purge style dopant rectangular ampule 100 such as the one in FIG. 19 is used, it cannot be refilled without removing it from the CVD processing equipment and sending it to a chemical supply company for cleaning and refilling.

When TEOS is the desired chemical to be delivered to the CVD reaction chamber, rectangular ampule 100 is provided with three valves, a manual valve for the carrier gas introduction, a manual valve for permitting the TEOS vapor out of the rectangular ampule 100 and into delivery line 32, and a pneumatic inlet valve 116 for performing frequent refills from a remote bulk chemical source container.

The three valve configuration for rectangular ampule 100, shown in FIG. 20a is also used when delivering dopants such as B and P in SACVD reactors. As the name implies, the SACVD process is run just below atmospheric pressure at about 600 torr. Due to this high pressure, the B and P dopants for the SACVD process, for example TEB and TEPO also require carrier gas type delivery to the reaction chamber. Thus, the manual valve for the carrier gas introduction and manual valve for permitting the dopant vapor out of the rectangular ampule 100 and into delivery line 32 are used in this application.

In each of the various configurations of rectangular ampule 100, a capacitive sensor 104 mounted to lid 101 is currently used to monitor the fluid level within rectangular ampule 100. Capacitive sensor 104 provides a continuous level output from the rectangular ampule because the output of capacitance sensor 104 continuously changes as the fluid level changes within rectangular ampule 100. Currently when a preset capacitance is measured corresponding to a low trigger point the depleted rectangular ampule 100 is simply replaced with a full ampule when it contained the B or P dopant. If the rectangular ampule 100 contained TEOS, on the other hand, then the ampule may be refilled until the output of the capacitance sensor 104 reached a preset trigger point corresponding to a full ampule. The trigger points were set such that the TEOS level is maintained at the center of the sight glass 106, which corresponds to approximately 475 ml of TEOS, which is considered to be 100%. The volume of TEOS is preferably maintained at this software programmed 100% level. The refill sequence is typically requested when the level of source chemical reaches 98%, but refilling will not be begun until the wafers currently in process are completed and a wafer transfer is performed. At that time the TEOS refill is accomplished. Typically the refilling continues until the level in rectangular ampule 100 reaches 102% of the software programmed level or a 10 second timeout has elapsed. Current TEOS refill systems for the P5000 system is set up in this manner to maintain the temperature of the TEOS in the ampule as stable as possible and to avoid additional downtime due to overfills fills or container changes as was previously practiced. A consistent level of TEOS is desired to provide as much consistency in TEOS saturation as possible. This results in a more repeatable process, wafer to wafer and lot to lot. Unfortunately, due to the problems with the repeatability of the level sensing of capacitance probe, the TEOS refill system was not completely reliable. For example, with the capacitance probe 104 one could not always be sure that the output of the probe 104 would be the same for 102% or 98%.

To overcome problems of capacitive sensor 104, the present invention comprises a digital level sensor assembly 21 which is directly substituted for capacitive sensor 104. As illustrated in FIG. 20, digital level sensor assembly 21 has been configured to mount in the same location as the capacitive sensor 104. The use of the a digital level sensor improves the reliability of the sensor, the repeatability of the sensor, simplifies the construction of rectangular ampule 100, and reduces or eliminates leak integrity issues, thus rendering rectangular ampules safer to work with for chemical suppliers cleaning and refilling rectangular ampule 100 and for workers handling the rectangular ampules in the field.

Figure 20:
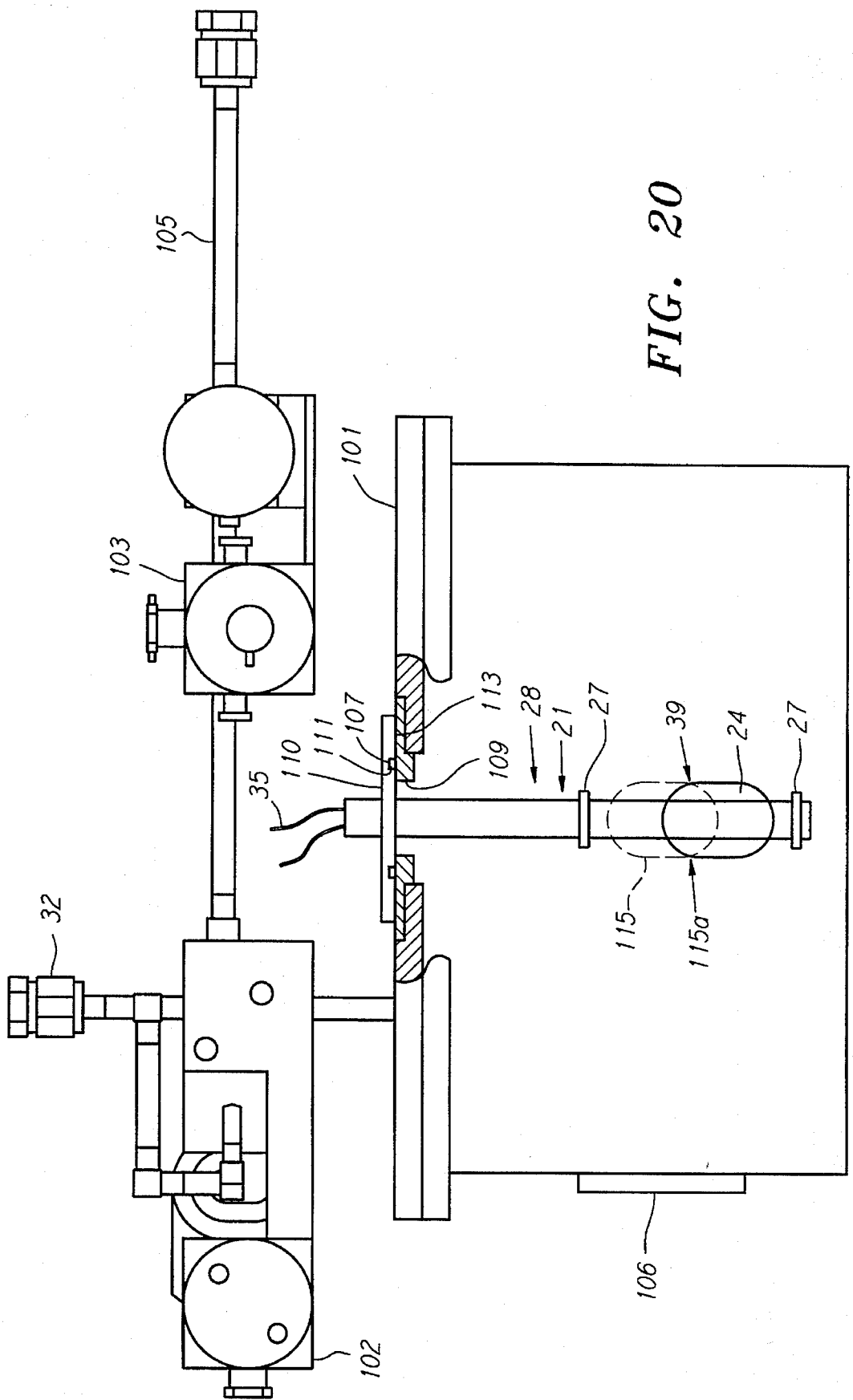
FIG. 20 is a partial cross section of a purge style rectangular dopant ampule and associated piping incorporating a digital probe sensor.

Although FIG. 20 illustrates a preferred form of a digital sensor, a digital metallic float level sensor assembly, substituted for a capacitive sensor 104 in a rectangular ampule 100 having a single valve configuration with purge capabilities, digital sensors can be substituted for capacitance probes used in all the various configurations of rectangular ampule 100. For example, FIG. 20a illustrates a rectangular ampule 100 having a three valve configuration for delivery of TEOS that has been improved by the replacement of capacitive sensor 104 with digital metallic float level sensor assembly 21.

The use of a digital level sensor assembly for level sensing in rectangular ampules 100 is particularly preferred when the source chemical to be delivered is TMB or TMP, as is the case with the embodiment illustrated in FIG. 20. This is because these dopant materials experience more problems both from the leak integrity standpoint and from an accuracy and repeatability standpoint.

Digital level sensor assembly 21 is attached to rectangular ampule 100 by way of flange 110. Flange 110 is permanently attached to one end of shaft 28. Flange 110 is preferably constructed out of 316L stainless steel, and the preferred method of attachment is welding. The hole pattern for attaching flange 110 to lid 101 of rectangular ampule 100 is the same as that found in the attachment flange 108 on capacitive sensor 104. Thus, digital metallic level sensor assembly 21 can be screwed directly to lid 101 of rectangular ampule 100 using existing attachment points. To ensure good leak integrity, an O-ring 107 is fitted into gland 111 located on the mating surface 113 of flange 110 so that as flange 110 is screwed down to lid 101, O-ring 107 will be compressed between the mating surface 113 of flange 110 and the mating surface of lid 101. This is the same type of "face seal" O-ring that is used with capacitive sensor 104. However, the need for the two O-rings that are used to seal and ensure the electrical separation of the two capacitive surfaces of sensor 104 is eliminated with the present invention. It is these O-rings, as indicated above, that are responsible for leak integrity problems. Thus, leak integrity problems are eliminated or significantly reduced with the design of the present invention.

To prevent contamination of the high purity source chemical contained within rectangular ampule 100, the wetted surfaces of metallic level sensor assembly 21, which comprise shaft 28, metallic float 24, retainer ring 27 and flange 110, are preferably electropolished following assembly. The surface finish of the wetted metal parts is preferably Ra 20 or better prior to electropolishing.

Digital level sensor assembly 21 in FIGS. 20 and 20a comprises a single metallic level sensor 39. Preferably metallic level sensor 39 is a dual level sensor employing two digital magnetic reed relay switches in the manner described above in connection with FIGS. 4–6 and 9–12. Trigger points 115, 115a of metallic level sensor 39 preferably correspond to 20% source chemical remaining ("Low") and 5% source chemical remaining ("Empty") in rectangular ampule 100, respectively. Because metallic level sensor 39 is a dual level sensor, four wires are used in cable 35 to communicate the fluid level status within rectangular ampule 100.

The rectangular ampule 100 of the embodiment in FIG. 20 is not refillable without disconnection from the system. Thus, it is simply removed and replaced when the "Empty" trigger point alarm is tripped and replaced with a full rectangular ampule 100.

Figure 21:
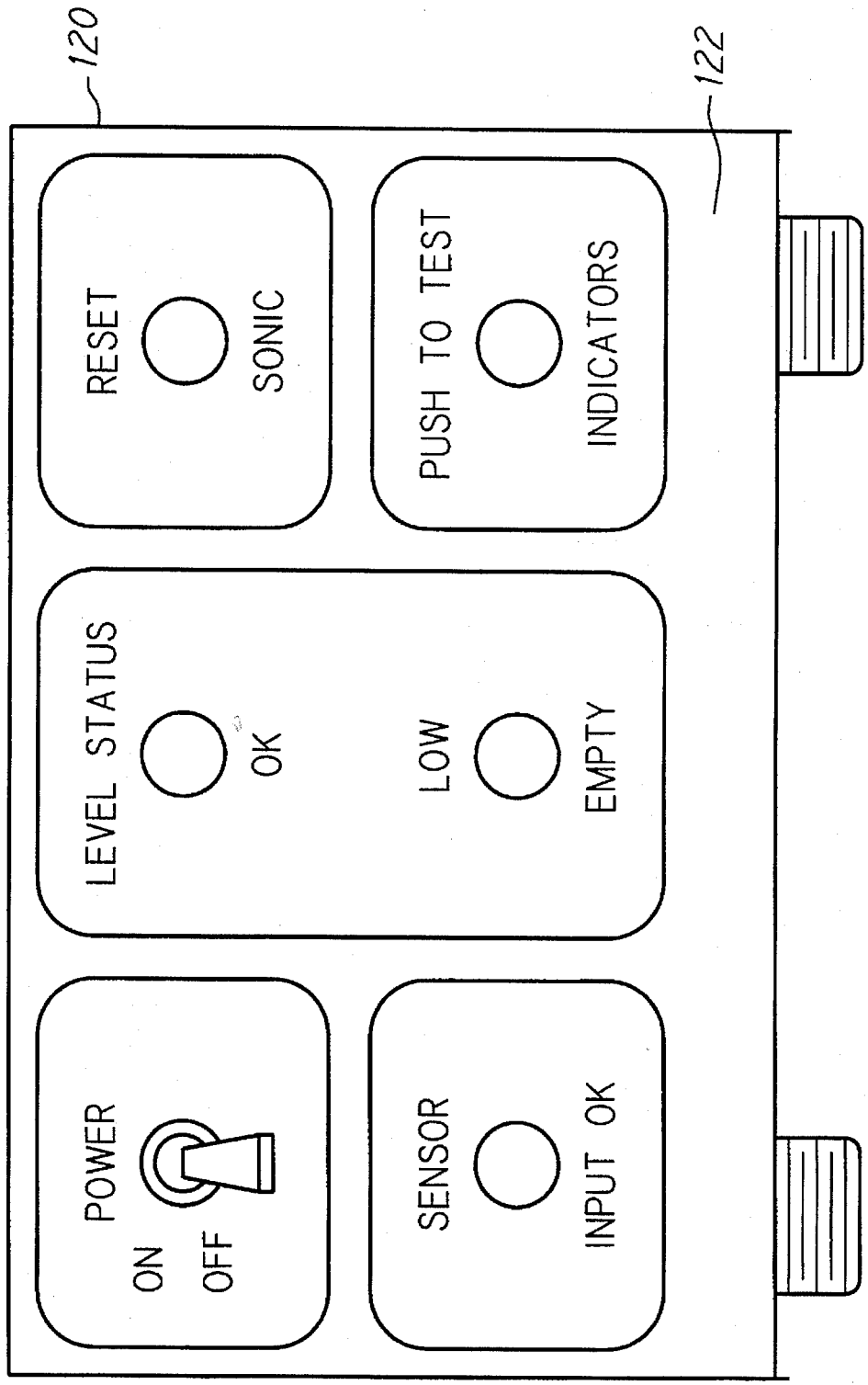
FIG. 21 is a drawing of the front panel of a preferred low level monitor.
Figures 22, 22A:
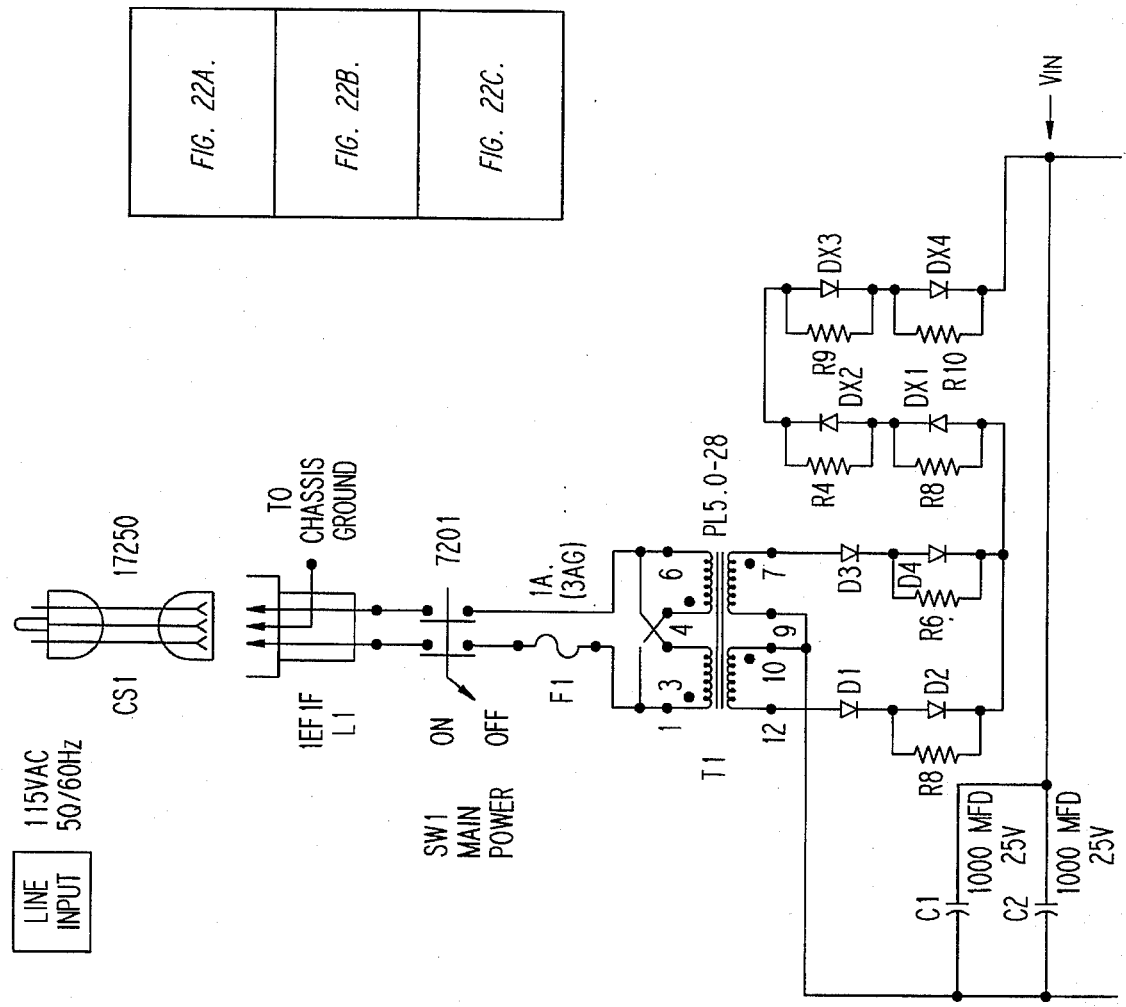
FIG. 22 is a circuit diagram for a low level monitor.
Figure 22B:
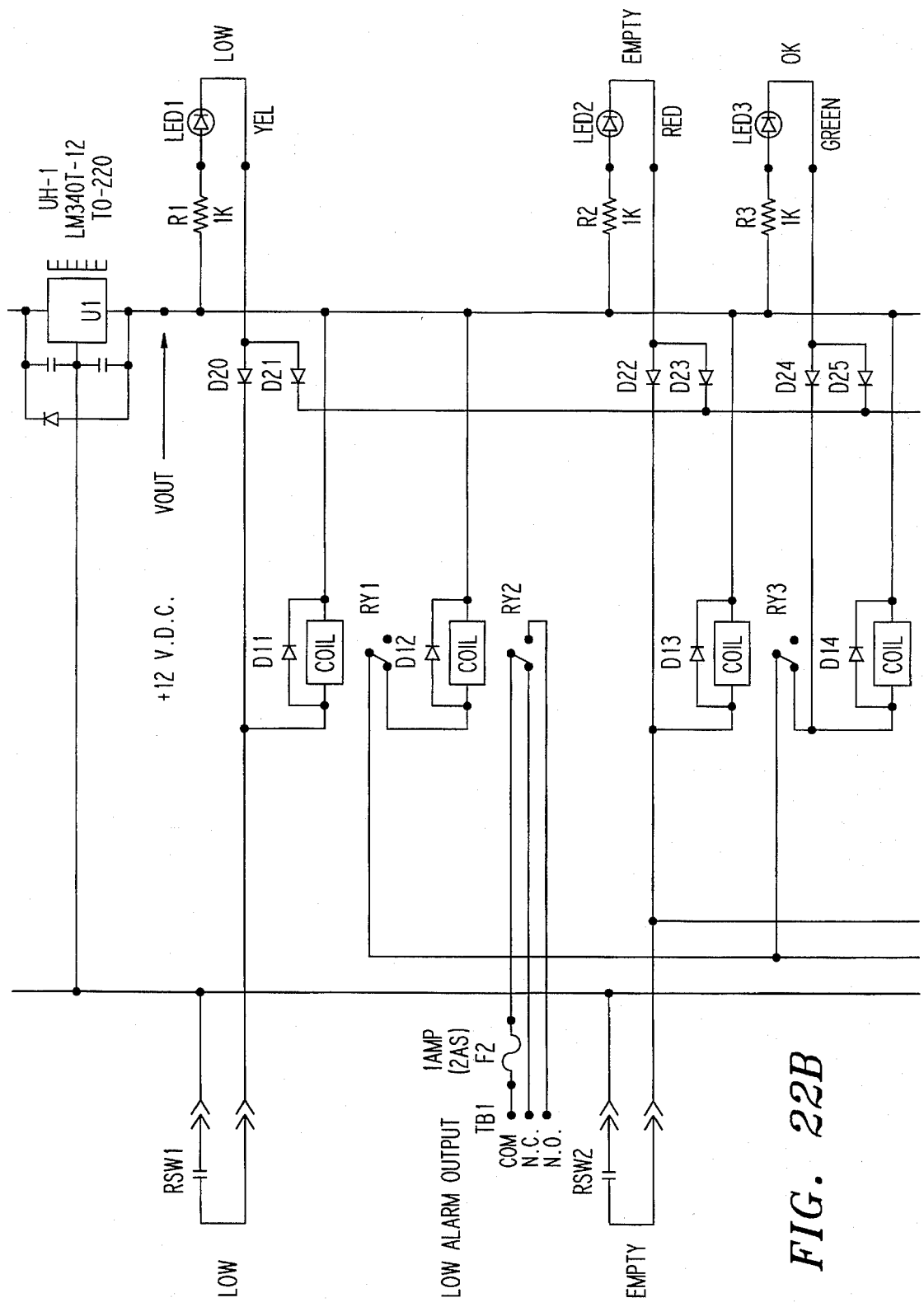
Figure 22C:
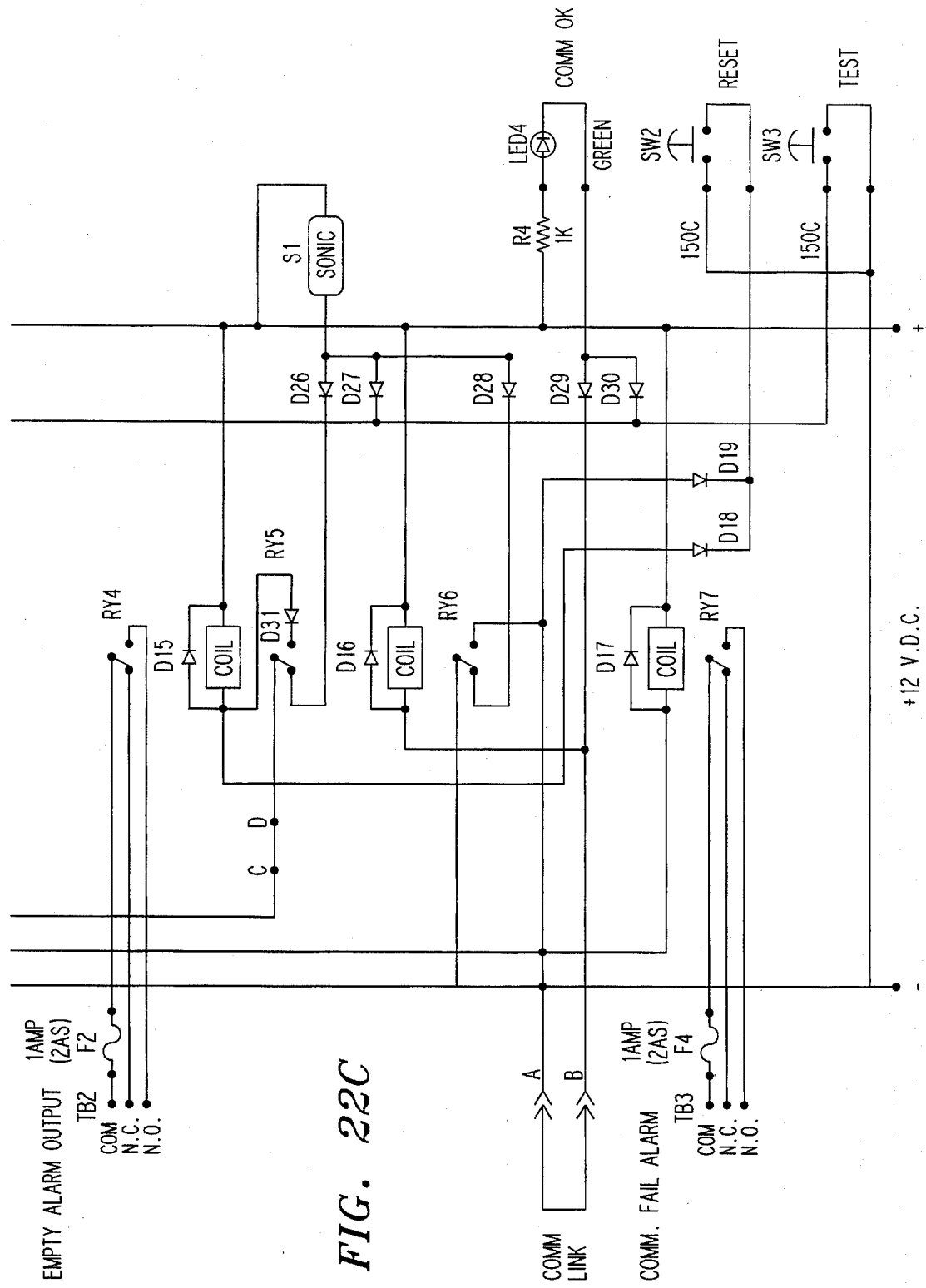

A dual level metallic level sensor 39 can interface directly with the low level monitor 120 illustrated in FIGS. 21 and 22 via cable 35. Low level monitor 120 provides independent level alarms with or without communication with the CVD process equipment. Specifically when metallic float 24 is above trigger points 115 and 115a, the "LEVEL STATUS OK" indicator will be lit on display panel 122. When metallic float 24 drops below trigger point 115, but is above trigger point 115a, the "LOW" indicator light will turn on. And, when metallic float 24 finally drops below trigger point 115a, the "EMPTY" indicator light will turn on. An audible alarm in low level monitor 120 is also activated when metallic float 24 drops below trigger point 115a or if communication with the digital sensor is disrupted. The preferred circuit for effecting the operation of low level monitor 120 is shown in FIG. 22. Cable 35 is connected at the terminals indicated as RSW 1 and RSW 2. The symbol RY in FIG. 22 indicates a relay and the remaining elements are shown using standard electrical symbology.

As discussed above, FIG. 20a depicts a non-refill configuration and requires that the rectangular ampule 100 be removed from the system once it is nearly empty for cleaning and refilling.

The benefits to be gained from this configuration include reliable level sensing, enhanced ability to plan container changes and thereby prevent the ampule from running empty and zeroing out product wafers during a run. Instead of replacing the rectangular ampule with 200 to 250 grams remaining, rectangular ampules 100 can now be replaced when only 125 to 150 grams source chemical remaining. Savings is achieved not only in reduced chemical cost, but also from less frequent downtime due to ampule changeover and whatever associated equipment issues that may result. Less frequent replacement also means less frequent handling, shipping and freight expenses for containers and less manpower in several departments. Moreover, due to the enhanced leak integrity of the rectangular ampules 100 modified to include the digital sensor, safety is less of a concern during ampule replacement.

Moreover, as a result of the less frequent ampule changes, a number of the issues that arise when completing an ampule changeover in a system that has a temperature controlled ampule, such as the P5000, are minimized. For example, as a result of the less frequent ampule changeover, the ampule needs time to cool down to a reasonable temperature prior to initiating the removal process. There may be a 3 to 24 hour process to properly purge the manifold and change the ampule because the full ampule needs to heat up to set point temperature (38°–48° C.), which can take a significant period of time due to the mass of the ampule. And, the process does not always come back into specification upon start-up after an ampule change. So, overall, there are a fair number of disadvantages to physically changing the rectangular ampule 100. But these problems are all minimized when capacitive sensor 104 is replaced with digital level sensor assembly 21.

If digital level sensor assembly 21 is only a single low level sensor, low level monitor 120 can still be used. Low level monitor 21 accepts six inputs, two for RSW 1, two for RSW 2 and two for communication as illustrated in FIG. 22. By jumping the sensor inputs for the "LOW" and "EMPTY" circuits together, when the single sensor closes, the input pins for both the "LOW" and "EMPTY" circuits will be closed by the same sensor and both LEDs in low level monitor 120 will illuminate and the respective relays will energize.

In a similar manner, low level monitor 120 as described above in connection with rectangular ampule 100, can also be used with the ampule configurations described above in connection with FIGS. 8–10 and in conjunction with bulk container 20.

Low level monitor 120 can also be used as a tool interface to communicate the level of fluid in rectangular ampule 100, with the CVD processing equipment. Dry contact outputs are provided for "Container Low", "Container Empty" and fault alarms. Outputs are fuse protected to prevent damage in the event of external power overload.

Figure 23:
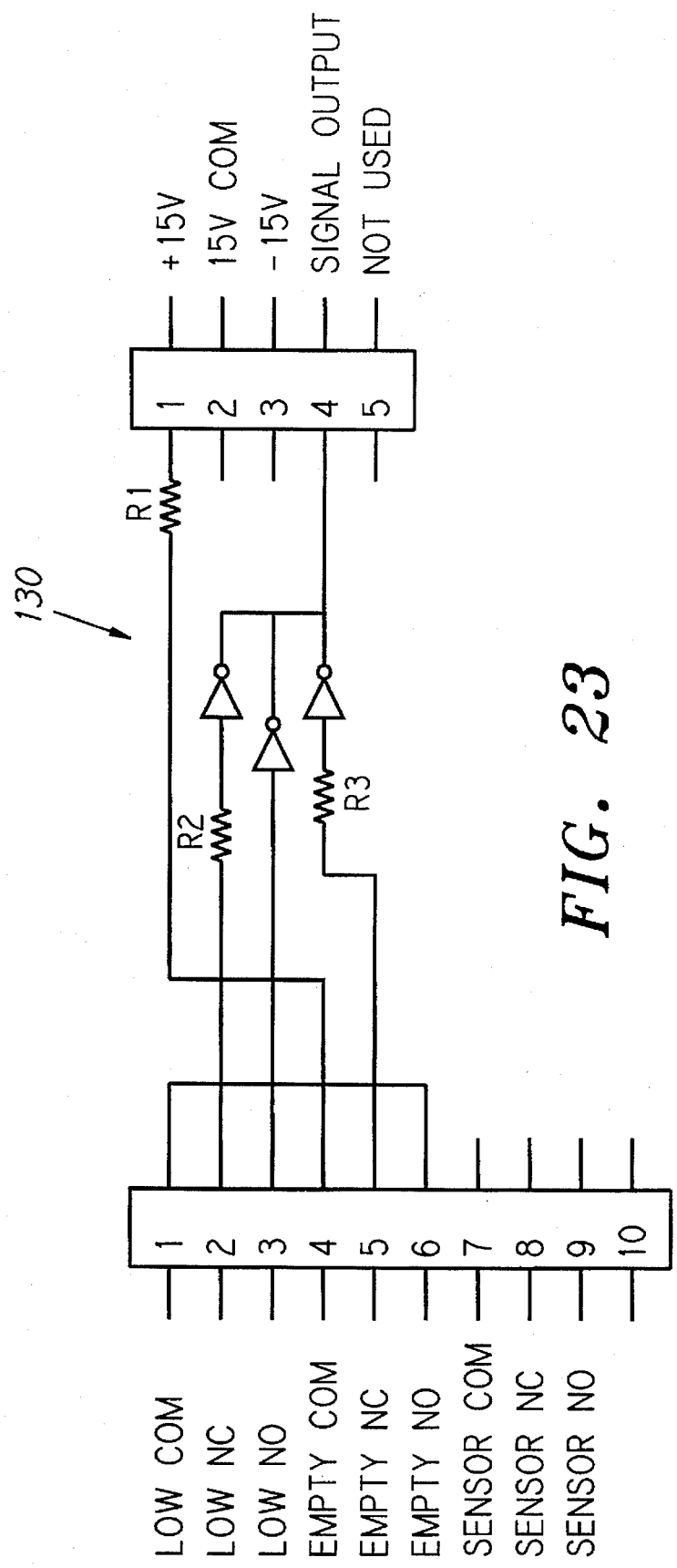
FIG. 23 is a circuit diagram of a preferred interface circuit between a low level monitor and the electronics of a CVD unit.

A preferred interface circuit is shown as low level monitor interface 130 for communicating the output signals from low level monitor 120 to the Applied Materials' P5000 is illustrated in FIG. 23. This circuit could be employed with the digital metallic level sensor assembly 21 configuration illustrated in FIGS. 20 and 20a. The inputs 1 through 9 of low level monitor interface 130 correspond to the similarly labeled outputs on FIG. 22.

Low level monitor interface 130 provides and interface between the relays of the low level monitor 120 to directly interface with the P5000 electronics. Low level monitor interface 130 preferably outputs 10 volts when both sensors are floating, 4.0 volts when the low level relay is toggled and 2.0 volts when the empty relay toggles.

The use of both the N.O. and N.C. contacts of relays RY1, RY3, and RY7 in the low level monitor circuit of FIG. 23 provides the switching capabilities so that each trigger level can be converted to an analog signal without additional relays or circuitry being required. Low level monitor interface 130 is easily installed and is unique in that it can simply replace the existing level sensor interface board. The benefit to the user of this system is that the operator or engineer running the equipment does not have to monitor an independent monitoring system because the low and empty levels will also be displayed on the screen of the CVD equipment such as the P5000. Again, in this non-refill application depicted in FIG. 20 the rectangular ampule 100 must be replaced after the "Empty" alarm is triggered.

FIGS. 24–28 illustrate alternative embodiments of digital level sensor assemblies 21 for use in rectangular ampule 100 and the corresponding preferred circuitry for interfacing the signal from the metallic float level sensor 39 with the electronics of the P5000.

Figure 24:
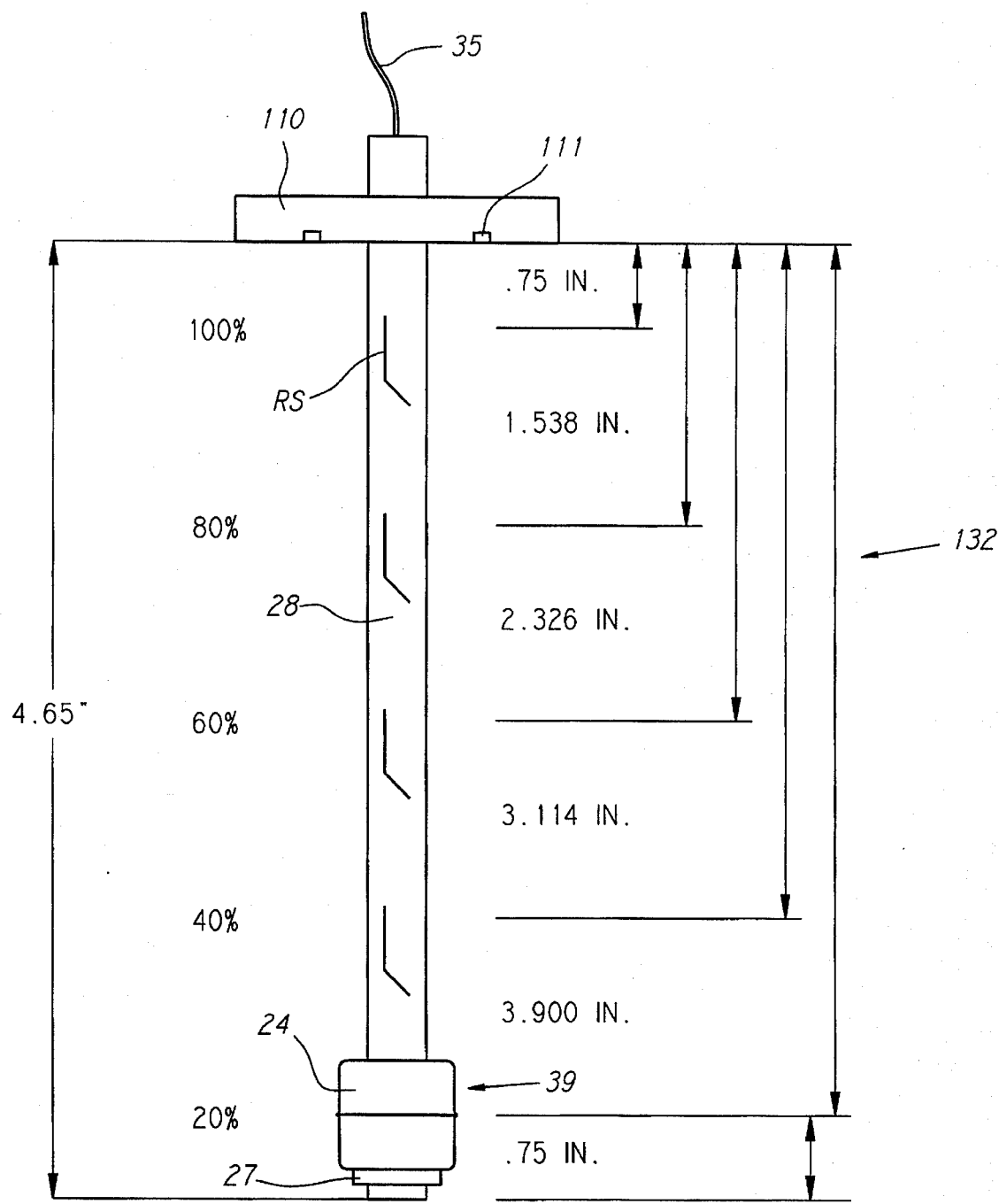
FIG. 24 is a diagram of a five level single float digital sensor for a rectangular ampule.

In FIG. 24, the five level digital level sensor assembly 132 comprises a single metallic float level sensor 39. Metallic float level sensor 39, however, has five trigger points corresponding to the placement of five N.O. magnetic reed switches RS within hollow shaft 28; thus, the metallic level sensor 39 can detect five different fluid levels. Preferably reed switches RS are configured within shaft 28 to detect fluid levels of 100%, 80%, 60%, 40%, and 20%. As illustrated in FIG. 24, this means that for a rectangular ampule 100 that is to be used in a P5000 system, a reed switch should be positioned at 0.75 in., 1.538 in., 2.326 in. 3.114 in., and 3.9 in. below the bottom surface of flange 110 of metallic level sensor assembly 21. The five reed switches RS in this configuration utilize a common ground. Therefore, cable 35 contains six wires 25, one common and five returns.

Figure 25:
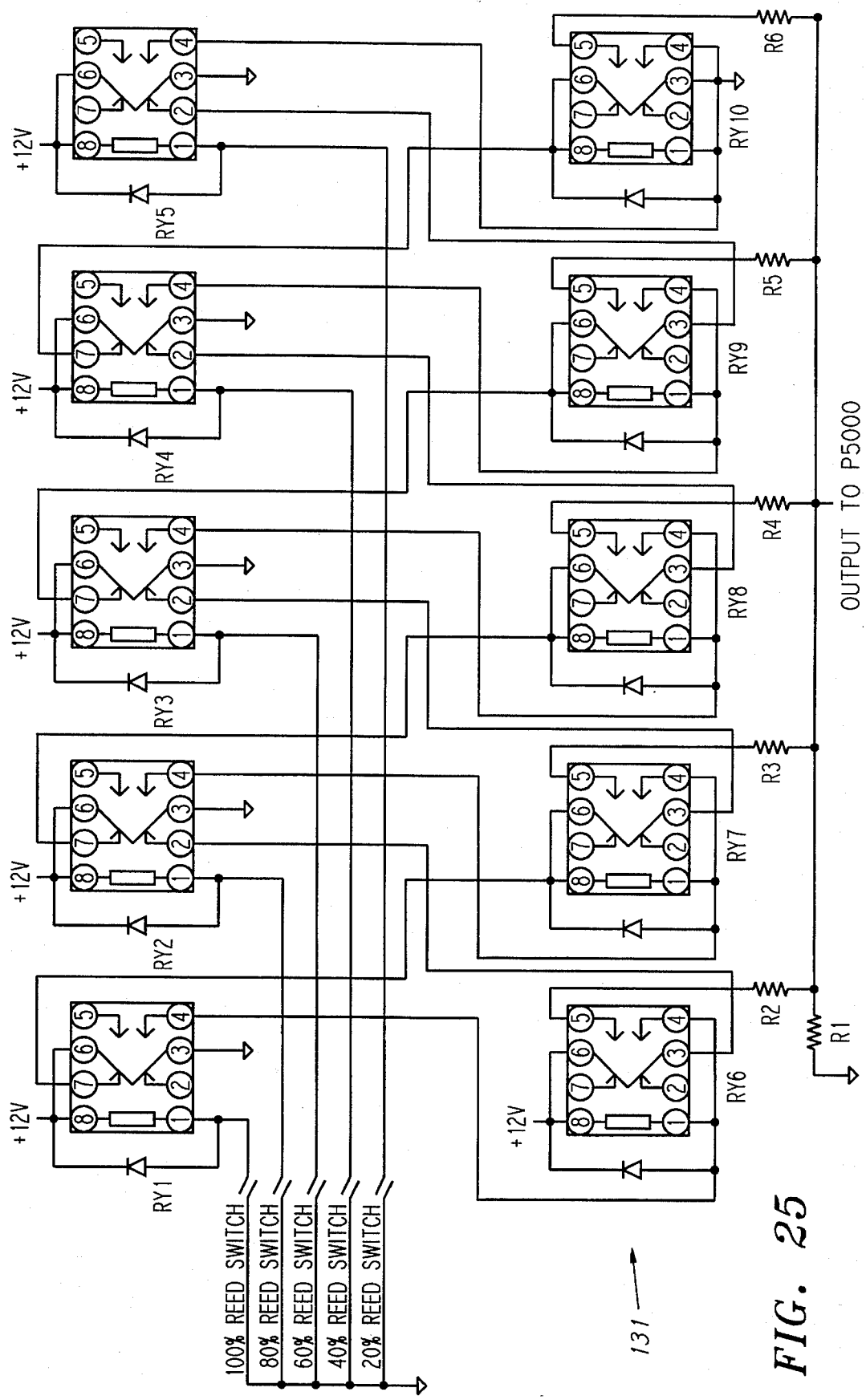
FIG. 25 is a circuit diagram of interface circuitry for a five level, single float digital sensor and a P5000-type CVD reactor.

Preferably the five level digital metallic float level assembly 132 is interfaced with the P5000 electronics via five level single float interface circuit 131 illustrated in FIG. 25. The five level single float interface circuit 131 communicates directly with the P5000 electronics and will provide an analog signal corresponding to the approximate chemical level in the ampule. The output of interface circuit 131 to the P5000 is preferably 10.0 volts, 8.0 volts, 6.0 volts, 4.0 volts, and 2.0 volts when the reed switches corresponding to the 100%, 80%, 60%, 40%, and 20% trigger points are triggered, respectively.

Again, in a non-refill application, rectangular ampule 100 will require replacement with a full ampule once the trigger point corresponding to "Empty" has been triggered, which would be the 20% trigger point in this configuration.

The benefit of using the digital metallic level sensor assembly 132 of FIG. 24 in combination with rectangular ampule 100 is that the user will be provided more than just a low and empty signal, which is the case for the metallic level sensor assembly 21 illustrated in FIG. 20. Indeed, with digital level sensor 132, the level will be displayed from 100% down to 20% resulting in a more desired output for the user.

Figure 26:
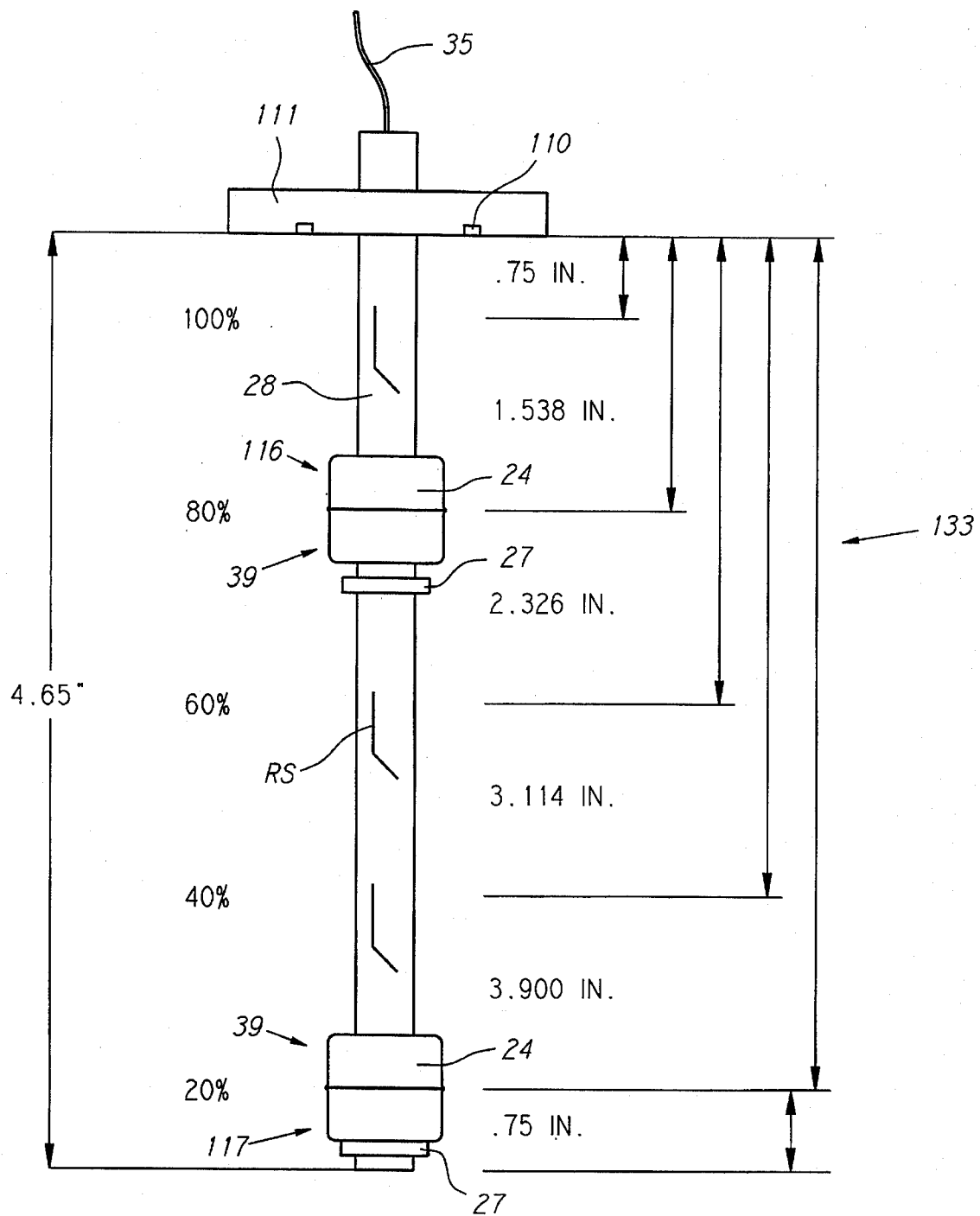
FIG. 26 is a diagram of a dual float five level digital sensor for a rectangular ampule.

FIG. 26 illustrates a two float five level digital metallic level sensor assembly 133 for use in a rectangular ampule 100 comprising two digital metallic level sensors 39. The upper digital metallic sensor 116 is a dual level sensor, and the lower digital metallic sensor 117 is a three level sensor. Thus, metallic level sensor assembly 21 can detect a total of five levels. The five trigger points of digital level sensor assembly 133 are located in the same position as those for digital level sensor assembly 132 illustrated in FIG. 24. The five N.O. reed switches RS in this configuration use a common ground. As a result, cable 35 contains six wires, one common and five returns.

An advantage of this configuration is that in a power down situation, at least one of the two sensors will be on a reed switch when the system comes back on line due to the selective placement of retainer rings 27, which may comprise an O-ring, on shaft 28. Thus, the P5000 is provided with an output signal when the system resumes operation. The level indicated, however, may not be completely accurate because the chemical level may be below the triggered reed switch, but at least it does provide the board with a starting point rather than a no voltage output if no reed switch is triggered.

A five level digital metallic level sensor assembly 21 can be produced with various combinations of digital metallic level sensors 39 having one, two, three, or four trigger points. For example, the digital level sensor assembly 21 can comprise three metallic level sensors 39, one a two level sensor, the second a one level sensor, and the third a two level sensor. For each additional metallic float 24 that is added to the metallic level sensor assembly 21, the five level interface circuit 131 in FIG. 24 is simplified. A relay is required for each non-latching reed switch. If a float's movement stops on a reed (and stays latched once it has been triggered), a relay is not needed in the circuit.

Figure 27:
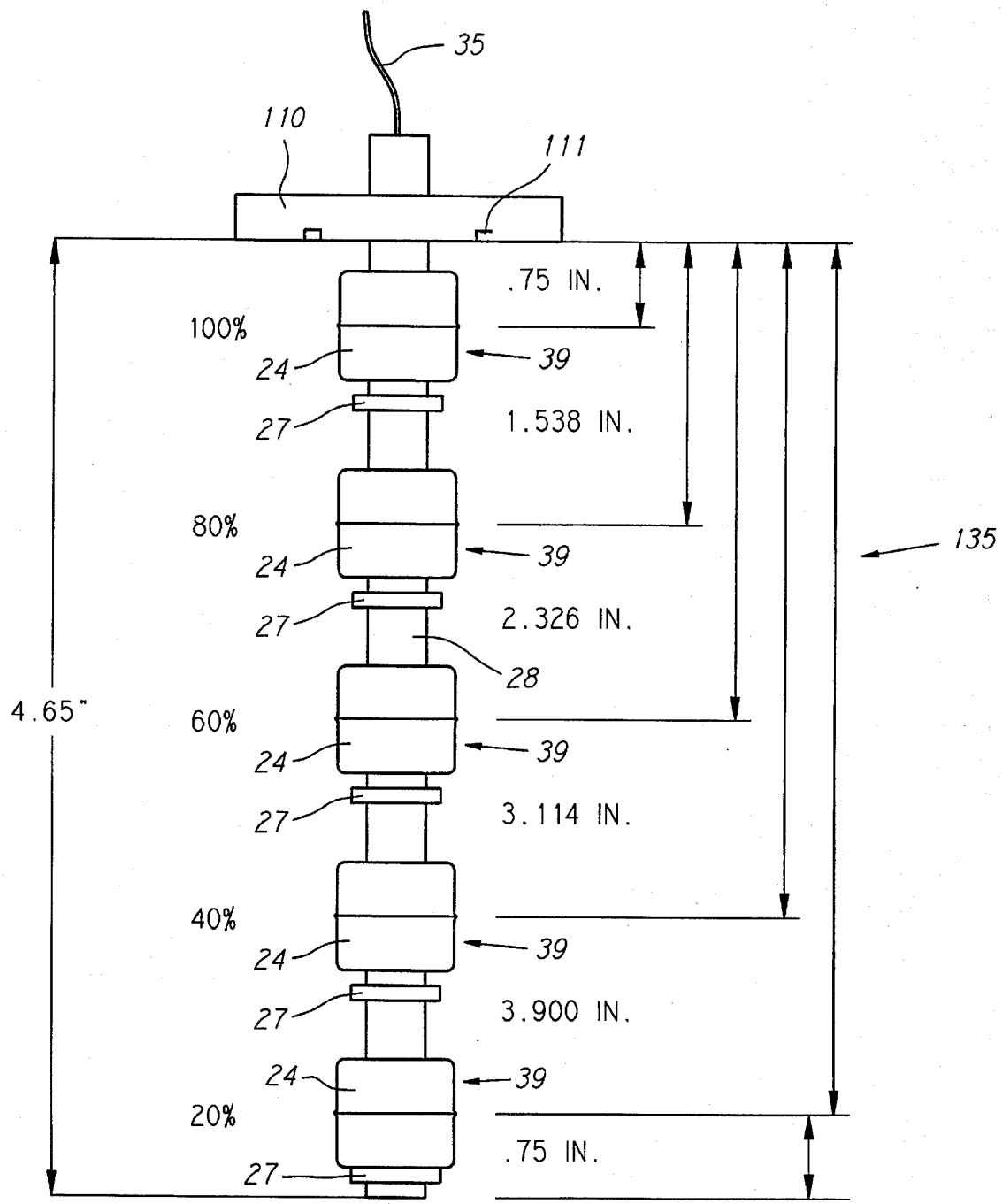
FIG. 27 is a diagram of a five float five level digital sensor for a rectangular ampule.

FIG. 27 illustrates a five level five float digital level sensor assembly 134 comprising five metallic float level sensors 39. Each metallic float level sensor 39 is a single level detector. However, due to their arrangement on shaft 28, by using retainer rings 27, metallic float level sensor assembly 21 can detect five different fluid levels in rectangular ampule 100. The preferred levels of detection are the same as those for the metallic level sensor assemblies illustrated in FIGS. 24 and 26. There are six wires in cable 35, one common and five returns. Thus, the five magnetic reed switches located within shaft 28 and used to set the trigger points share a common.

The magnetic reed switches used in this embodiment are N.O. switches. Thus, when rectangular ampule 100 is full, each of the metallic floats 24 are floated up above its corresponding reed switch so that the N.O. reed switch is open. The metallic float 24 used in the 100% metallic float level sensor has the upper reed switch already latched for the standard fill weight of chemical. This reed switch remains closed as additional source chemical is removed from rectangular ampule 100 because retainer ring 27 prevents the metallic float 24 corresponding to the 100% level from dropping below the trigger point. This occurs for each of the successive metallic float level sensors 39 until the last metallic float 24 passes its trigger point and the corresponding reed switch is closed. At which point rectangular ampule 100 is empty.

Figure 28:
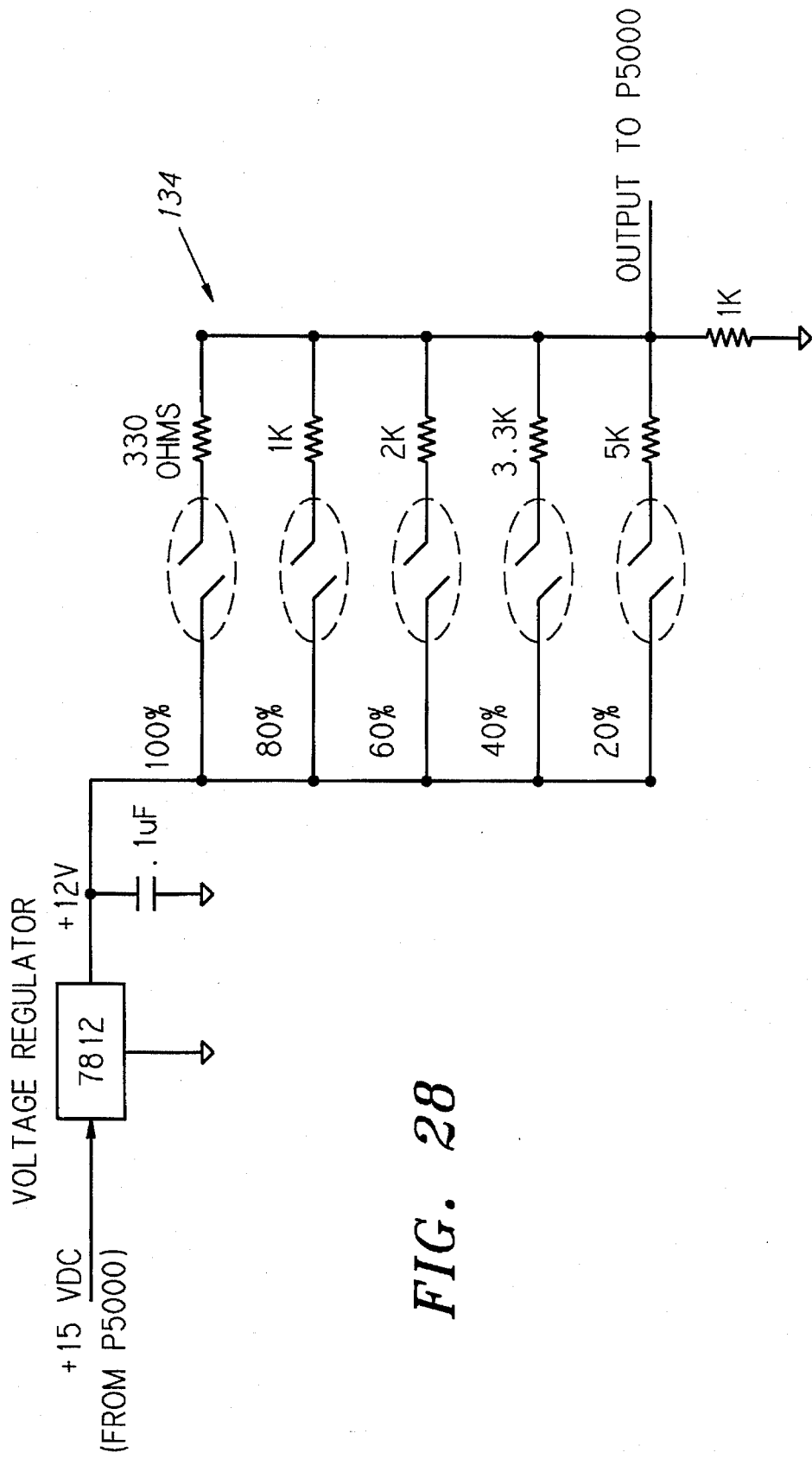
FIG. 28 is a circuit diagram for a five float five level digital sensor and interface circuitry for a rectangular ampule.

The preferred digital to analog interface circuit 134 for interfacing the output of digital level sensor assembly 135 with the electronics of the P5000 is shown in FIG. 28. The five level five float interface circuit 134 is very simple, inexpensive, and reliable. Further, in the case of a power loss to the system, the level of chemical will be known in all situations when the system comes back on line. The output voltage of circuit 130 is 10 V, 8.0 V, 6.0 V, 4.0 V, 2.0 V when the system is 100%, 80%, 60%, 40%, and 20% full, respectively. When the last reed switch, the 20% reed switch, is toggled, the rectangular ampule is empty and the output of interface circuit 130 is 2.0 V. In the non-refill application, the rectangular ampule 100 must be removed and replaced with a full ampule when this output is received by the P5000.

The interface circuits in FIGS. 25 and 28 can be modified to provide a low and empty signal to the low level monitor 120 in addition to providing an analog signal to the P5000. This provides the user with an additional level monitor, which can be mounted in a different location to make certain that the status of source chemical in the ampule is known at all times.

The embodiments of the present invention in connection with FIGS. 20–28 have all been described for the non-refill, e.g., stand alone, configuration. In other words, when an empty alarm is provided, rectangular ampule 100 must be removed from the CVD processing equipment and replaced with a full ampule. Refills from a remote bulk container, however, offer considerable advantages over the nonrefill configurations of the present invention discussed in connection with FIGS. 20–28 above. The downtime would be reduced to the time to complete the refill and for the temperature of the liquid to reach a set point. That time should be very short considering that only approximately 1 pound of dopant is added to a 25 pound ampule already at the set point in the automatic refill configurations of the present invention. The CVD process variations will be negligible since there are no delivery lines exposed to air or moisture, nor are there any major disruptions with the delivery system as a whole.

To convert the dopant ampules of FIG. 20 to a refill system, a refill port must be added. It is, however, not recommended to modify lid 101 of existing rectangular ampules 100 with an additional port and valve without the ability to electropolish the weld. The electropolish provides a passivated surface that is higher in chromium and iron oxides and prevents interaction of the source chemicals with the stainless steel surfaces of the rectangular ampule 100. If a second electropolish is attempted after addition of the refill valve, the surface will become very rough and course and the integrity of the passivated coating is compromised. As a result, undesirable concentrations of contaminants would be introduced into the high purity source chemical delivered from the rectangular ampule 100. For that reason, additional ports cannot be added to rectangular ampule 100o Further, placing a high purity source chemical in contact with an un-electropolished stainless steel surface is not recommended, especially for dopant materials, due to the danger of introducing metal contamination.

Figure 29:
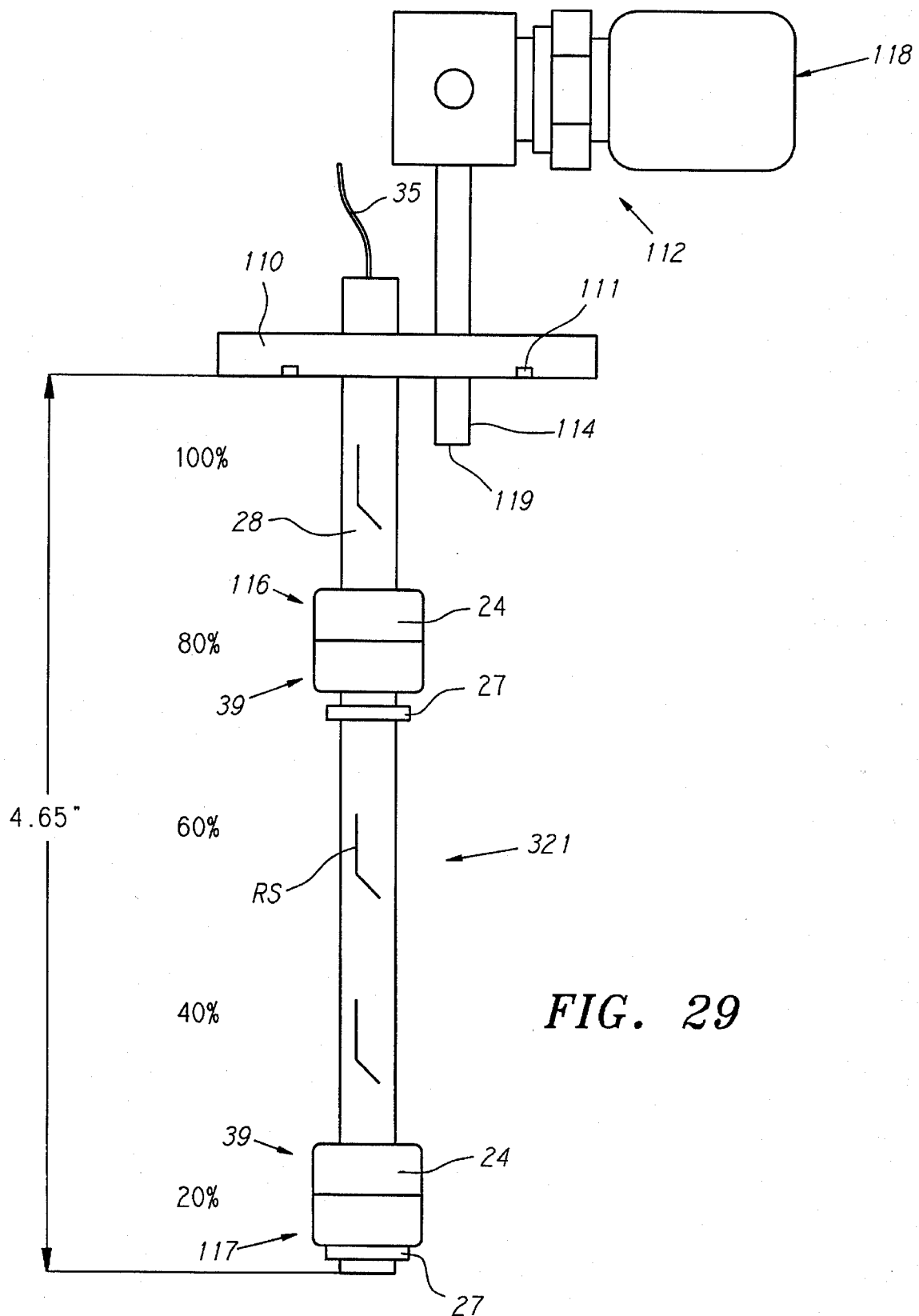
FIG. 29 is a diagram of a two float five level digital sensor for a rectangular ampule incorporating an integral refill line and isolation valve.

To upgrade rectangular ampules 100 so that they can be used in bulk refill applications the lid 101 can be modified to include three valves such as the one illustrated in FIG. 20a. However, this alternative is very costly. The current cost of upgrading rectangular ampule 100 with a three valve lid is estimated to be between $6,000 and $10,000 per rectangular ampule 100. Accordingly, a low cost and reliable means for adapting a single valve rectangular ampule 100 for bulk refill systems is needed. FIG. 29 illustrates such a means.

The refill digital level sensor assembly 321 in FIG. 29 has been adapted to accommodate a refill port and inlet valve assembly 112. The refill port and inlet valve assembly 112 is preferably attached to flange 110 of refill digital level sensor assembly 321 by welding. Flange 110 is the same size as flange 108 of capacitive sensor 104 and a seal between the lid 101 and the ampule 100 is preferably accomplished in the same manner. A similar modification of the capacitance probe sensor is not practical due to the size of the probe.

In the embodiment in FIG. 29, refill digital level sensor assembly 321 comprises two metallic float level sensors 39. The first 116 is a dual level sensor, and the second 117 is a three level sensor. Thus, as with the level sensor assembly depicted in FIG. 26, the refill digital level sensor assembly 321 depicted in FIG. 29 can detect a total of five levels. The five trigger points of refill digital level sensor assembly 321 are preferably located in the same positions as those for the level sensor assemblies 21 illustrated in FIGS. 24 and 26. And, as with those embodiments of the level sensor assembly 21, preferably the five reed switches RS making up the trigger points are normally open and share a common ground. As a result, cable 35 preferably contains six wires, one common and five returns.

Refill port and inlet valve assembly 112 in FIG. 29 comprises refill line 114 and inlet valve 118. Refill line 114 has an inlet port 119 and is preferably a ¼ inch 316L stainless steel pipe. Inlet valve 118 is preferably a pneumatic valve so that when refill digital level sensor assembly 321 is mounted on rectangular purge style dopant ampule 100 to create a modified rectangular purge style dopant ampule 200, modified rectangular purge style dopant ampule 200 can be used in an automatic bulk refill system.

Figure 30:
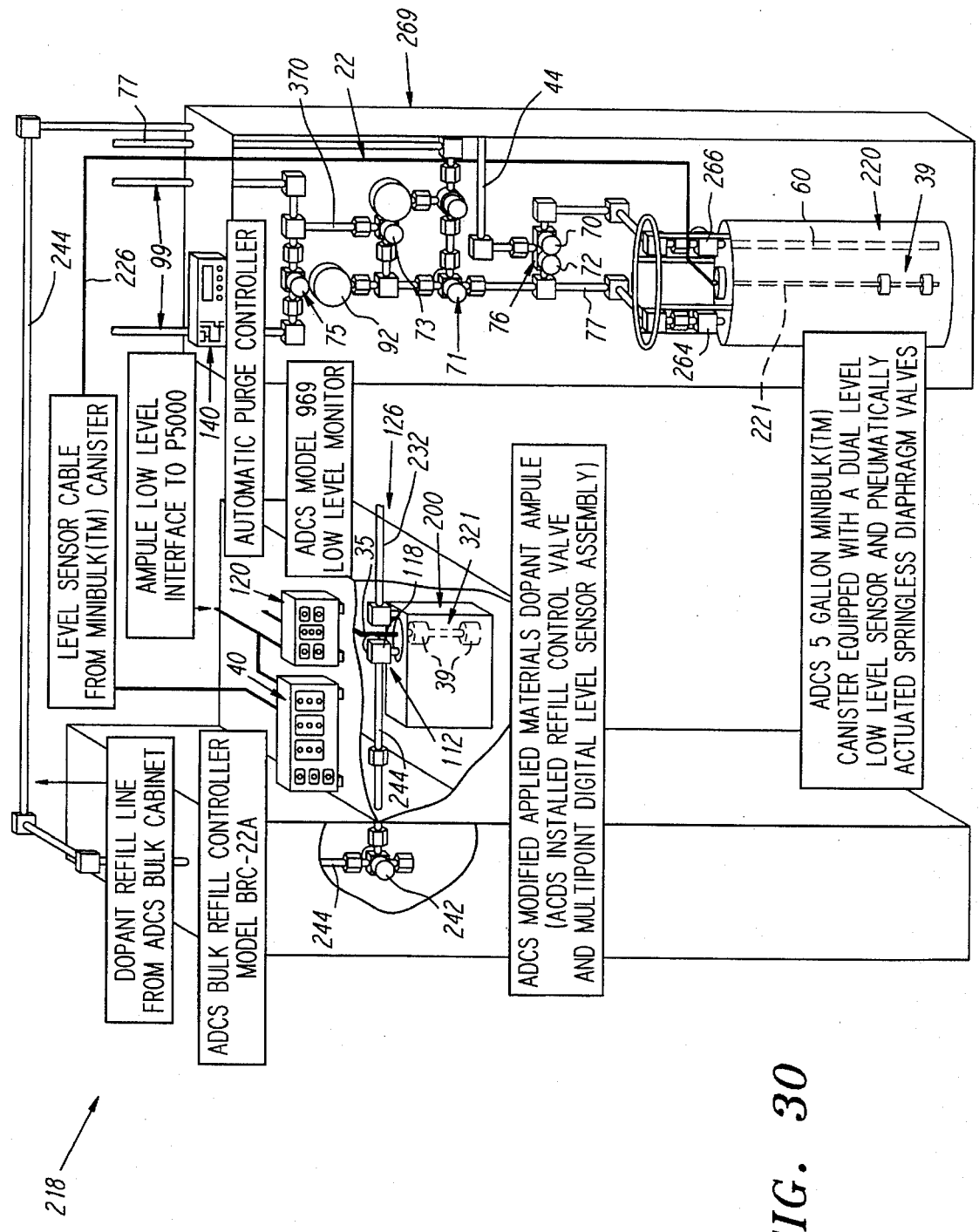
FIG. 30 is a representation of a high purity dopant chemical refill system according to one embodiment of the present invention.

FIG. 30 illustrates one embodiment of an automatic bulk refill system 218 for refilling a modified rectangular purge style dopant ampule 200 supporting an Applied materials' P5000 PECVD unit with TMB, TEB, TEPO or TMP. As illustrated, the capacitive sensor 104 has been replaced with a refill digital level sensor assembly 321 that has been modified with a refill port and inlet valve assembly so that modified rectangular purge style dopant ampule 200 can be refilled from remote bulk container 220. It should be noted that for use in refill system 218, the modified rectangular purge style dopant ampule 200 will work regardless of which manner of modification is used to include a refill port and inlet valve assembly. It can be modified by drilling a hole and welding the port and valve assembly to the lid of the ampule and the capacitance probe replaced with a digital probe assembly 21, it can be modified by using the refill digital probe assembly 321, or even a rectangular TEOS ampule with the digital probe assembly 21 can be used.

Bulk refill system 218 comprises six main functional components in this embodiment: a bulk container 220 located in a remote chemical cabinet with a manifold 222; a modified rectangular purge style dopant ampule 200 to supply a P5000 reaction chamber with TMB or TMP; a control unit 240 to supervise and control the refill operation and to monitor the level of the bulk container 220 and modified rectangular purge style dopant ampule 200; a low level monitor 120 to monitor the low level in rectangular ampule 200 and interface electronics 130 to interface with the electronics of the P5000; and an automatic purge controller 140 to step manifold 222 through a purge cycle following the replacement of bulk container 220.

Bulk refill system 218 operates essentially in the same manner as the embodiment illustrated in FIG. 1. However, because the source chemical to be delivered from bulk container 220 in this embodiment is TMB or TMP a vacuum is not required to be pulled on modified rectangular purge style dopant ampule 200, which is located in hot box 126, before the refill cycle can be completed. A vacuum is not required with TMB and TMP because the dopants are vapor delivery and the ampule pressure is typically well below atmosphere.

All of the valves in this embodiment are preferably pneumatic to permit the bulk refill system 218 to be configured for automatic refills if desired. The use of all pneumatic valves in manifold 222 and on bulk container 220 also permits the addition of an automatic purge controller 140 to the bulk refill system 218. Automatic purge controller 140 is preferably used to step manifold 222 through the drain and purge sequence to permit bulk container 220 to be replaced. Automatic purge controller 140 is also preferably used to configure the manifold 222 valves and bulk container 220 valves for the delivery of source dopant chemical to modified rectangular purge style dopant ampule 200 or for any other bulk chemical configuration or refill function. The operation of automatic purge controller 140 is described in more detail below. Low level monitor 120 can be used in the present embodiment of bulk refill system 218 to monitor the chemical level in modified rectangular purge style dopant ampule 200 as described in connection with FIG. 21. However, as described in more detail below, low level monitor 120, while preferred, is not required in bulk refill system 218.

During normal process operation of refill system 218, modified rectangular purge style dopant ampule 200 delivers a high purity chemical dopant such as TMB or TMP to the reaction chamber of an Applied Materials' P5000 PECVD unit via delivery line 232. It should be noted that outlet valve 102 on the back of rectangular ampule 200 has been omitted from FIG. 30 for purposes of clarity. Further, modified rectangular purge style dopant ampule 200 need not be pressurized with a delivery gas as with a TEOS delivery system, because, as mentioned above, TMB and TMP have a high vapor pressure and only low flow rates of these dopants are required to the CVD reaction chamber.

Figure 31:
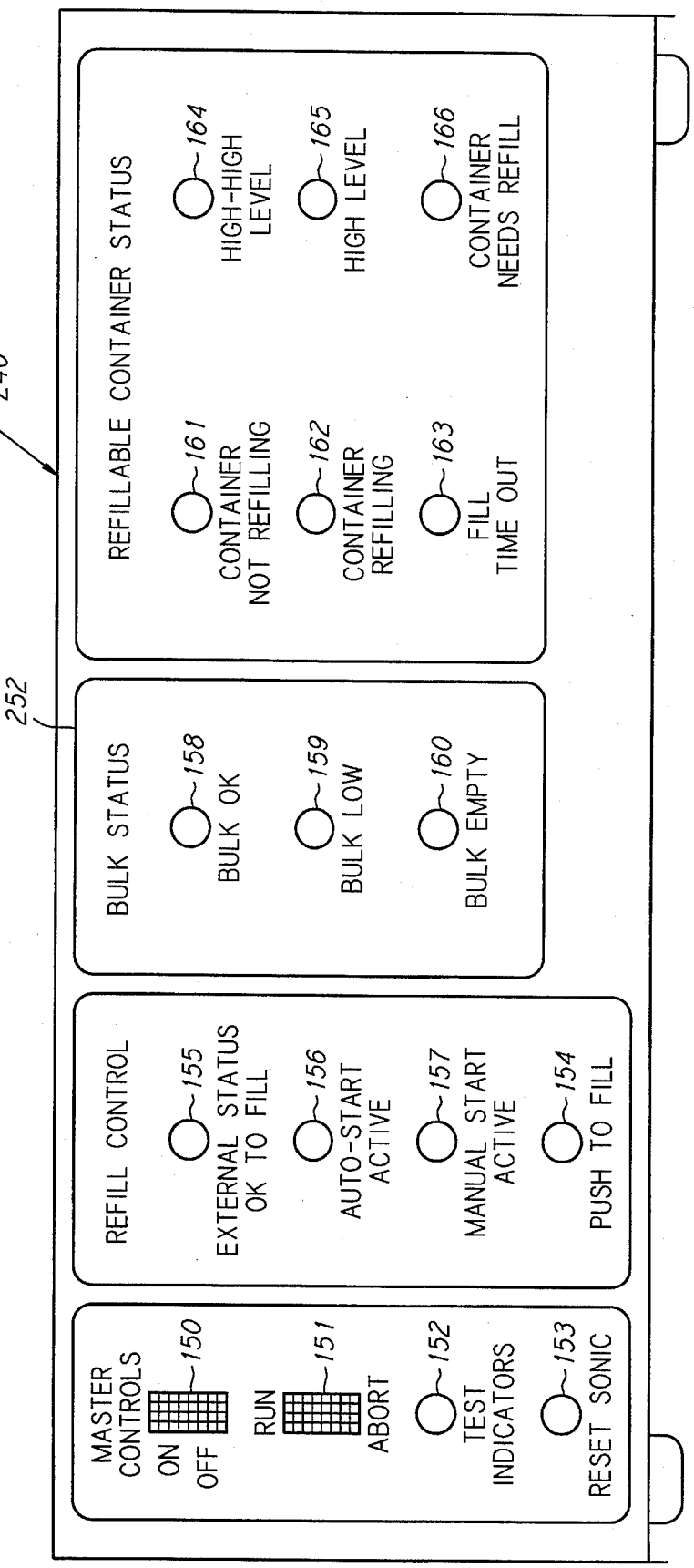
FIG. 31 is a front view of a control unit control panel according to a preferred embodiment of the present invention.
Figure 32A:
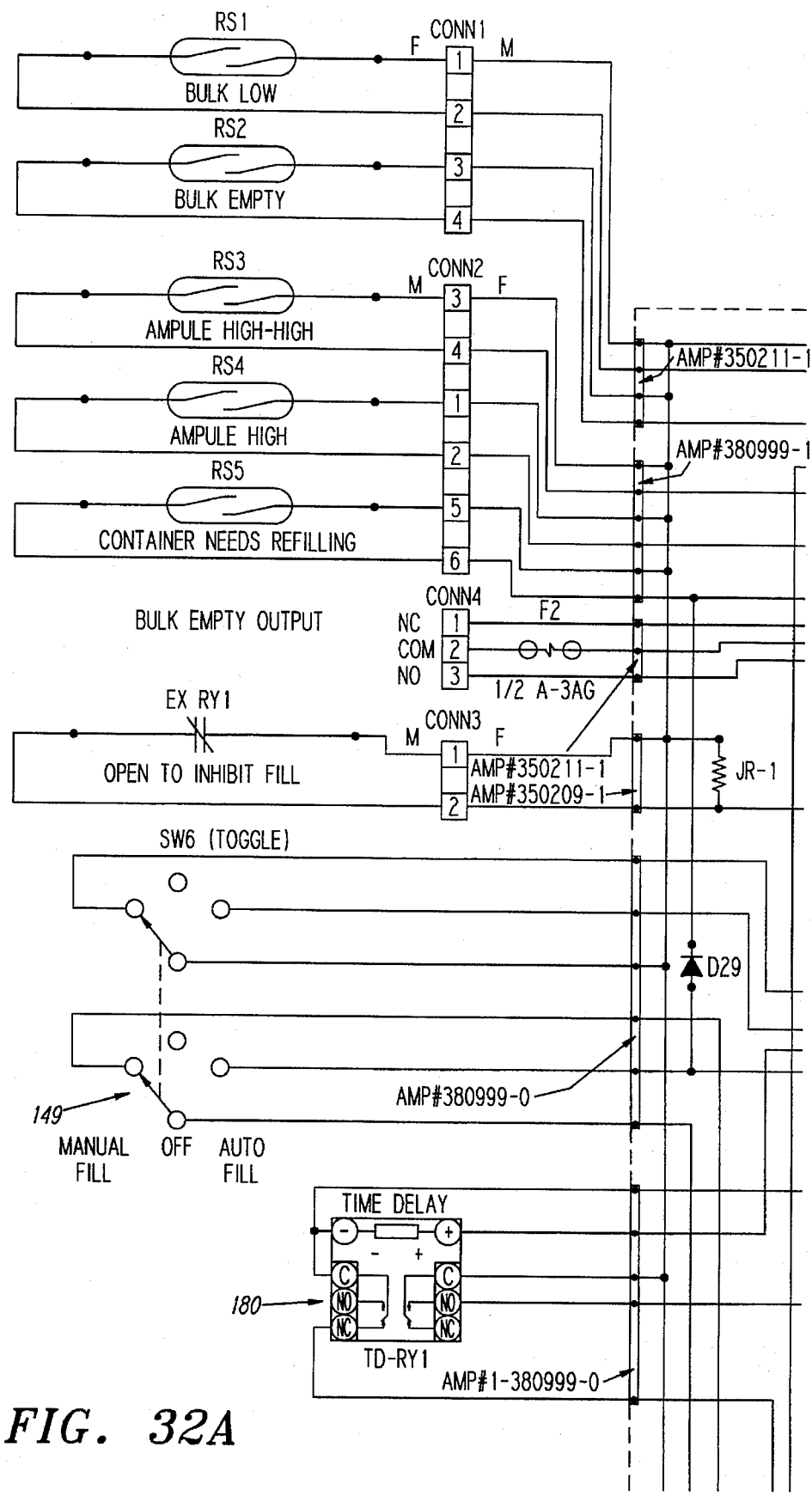
FIG. 32 is a schematic diagram of control circuitry for a presently preferred embodiment of the present invention
Figure 32B:
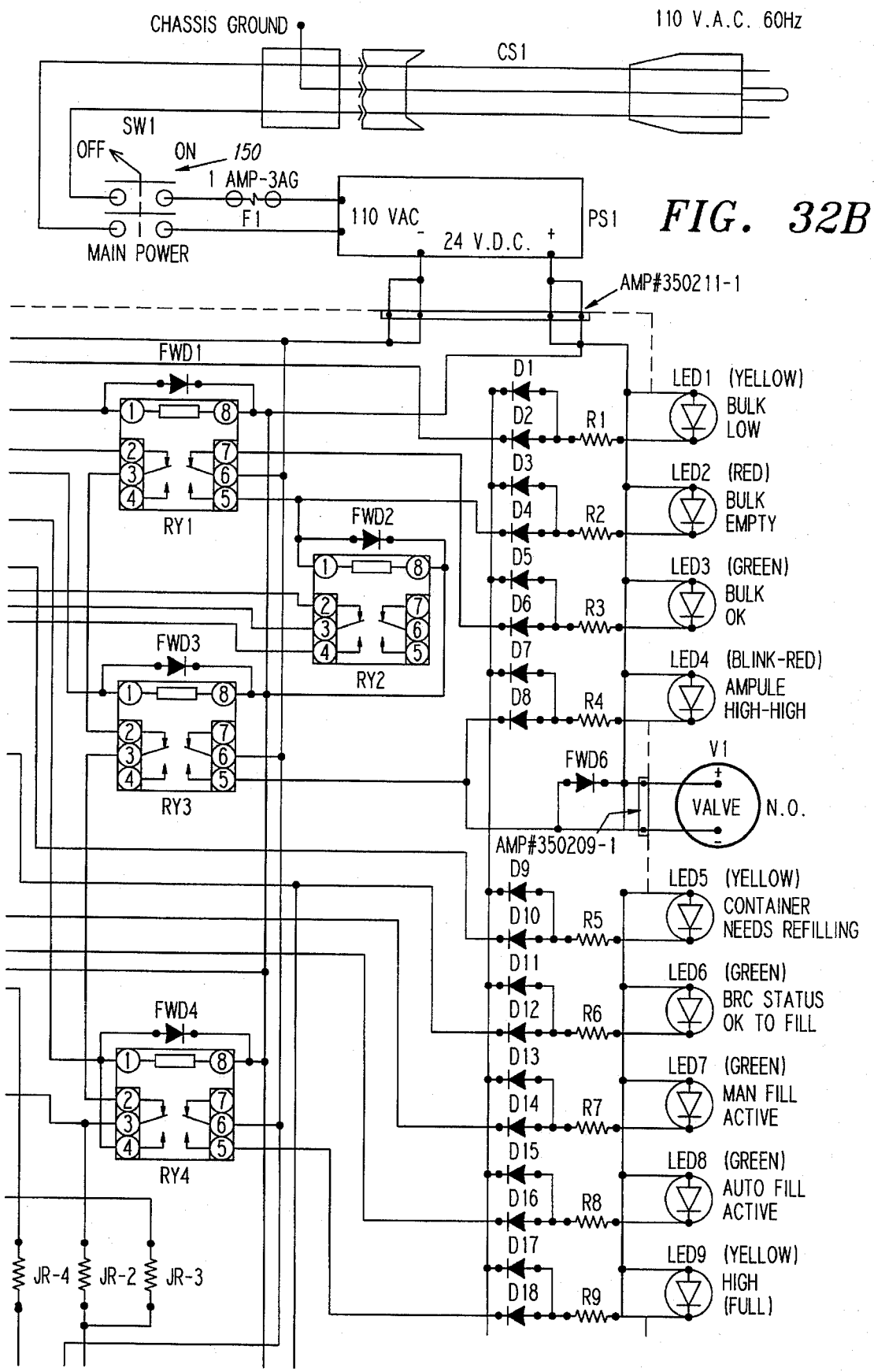

The operation of a most recently preferred embodiment of control unit 240 is described in connection with FIGS. 31 and 32. It should be noted that control unit 240 can be used in conjunction with a rectangular TEOS ampule 100 as well as the modified rectangular purge style dopant ampule 200. FIG. 31 illustrates a preferred configuration of control panel 252 of control unit 240, and FIG. 32 illustrates the corresponding preferred electrical circuit of control unit 240. The symbols used in FIG. 32 are standard electrical symbols and refer to the standard electrical components indicated by the symbol.

Control unit 240 includes six manual switches: an "ON/OFF" switch 150; a "RUN/ABORT" switch 151; a "TEST INDICATORS" switch 152; a "RESET SONIC" switch 153; a "PUSH TO FILL" switch 154; and an "AUTO FILL/MANUAL FILL" switch 155.

Control panel 252 includes a number of indicators to report the status of chemical levels in bulk container 220 and modified rectangular purge style dopant ampule 200. The indicators include "EXTERNAL STATUS OK TO FILL" 155, "AUTO-START ACTIVE" 156, "MANUAL START ACTIVE" 157, "BULK OK" 158, "BULK LOW" 159, "BULK EMPTY" 160, "CONTAINER REFILLING" 162, "CONTAINER NOT REFILLING" 161, "FILL TIME OUT" 163, "HIGH-HIGH LEVEL" 164, "HIGH LEVEL" 165, and "CONTAINER NEEDS REFILL" 166.

The "ON/OFF" switch 150 turns on the main power to control unit 240 and provides power to the control unit circuit in FIG. 32. The "RUN/ABORT" switch 151 is a manual and automatic refill function override. When pressed, it removes power from normally closed pneumatic control valve V2 (sown in FIG. 32), thereby causing refill control valve 242 and inlet valve 118 to close, shutting off the flow of source chemical from bulk container 220. The "TEST INDICATORS" switch 152 tests all the LEDs and sonic alarm in control unit 240. The "RESET SONIC" switch 153 silences the sonic alarm within control unit 240 and energizes the alarm circuit when pressed. The "AUTO FILL/MANUAL FILL" switch 149 is preferably located on the back panel of control unit 240. When this switch is set in the "MANUAL FILL" position, the "MANUAL START ACTIVE" LED 157 is illuminated and the "PUSH TO FILL" switch 154 is enabled. On the other hand, when this switch is set in the "AUTO FILL" position, the "AUTO-START ACTIVE" LED 156 is illuminated and control unit 240 is configured for automatic refill operation.

If the "EXTERNAL STATUS OK TO FILL" LED 155 is illuminated, the refill function is enabled. The "EXTERNAL STATUS OK TO FILL" LED 155 is illuminated when the contacts of an external refill controller override EX RY1 (shown in FIG. 32) generally located within the electronics of some CVD processing equipment are closed. Other devices can be interlocked using the external status inputs. The only requirement is for N.C. contacts. Thus, this circuit acts as an interlock to prevent refill of modified rectangular purge style dopant ampule 200 while the CVD unit is in normal operation. When the contacts of the override are open, the refill function is disabled, and the "EXTERNAL STATUS OK TO FILL" LED 155 is extinguished. If the unit is not connected to an external interlock a jumper must be installed across pins 1 and 2 of CONN 3.

During normal process operation, the level of source chemical in bulk container 220 should not change. Therefore, the "BULK OK" indicator 158 should remain lit. However, if the "BULK LOW" or "BULK EMPTY" indicator, 159 and 160 respectively, come on during a refill cycle, these indicators will remain illuminated until the bulk container 220 is replaced with a full container. The operation of the level sensors in bulk container 220 is the same as that explained in connection with FIGS. 3–5 above. The bulk container 220 sensors 39 are represented in FIG. 32 as RS1 and RS2.

Control unit 240 interfaces with a digital metallic level sensor assembly 221 in bulk container 220 via cable 226. The metallic level sensor 39 in the remote bulk container 220 has its trigger points preferably set at 20% remaining source chemical and at 5% remaining source chemical. Depending on specific process requirements, however, other trigger points can be used. If the source chemical level falls below the first trigger point, which typically only occurs during the refilling sequence, a visual indication of "BULK LOW" on the control panel 252 of control unit 240 is produced. If the source chemical level falls below the second trigger point, the "BULK EMPTY" visual alarm 160 on control panel 252 in addition to an audible alarm S1 is sounded in conjunction with an automatic termination of the refill sequence.

Throughout normal process operation, the "CONTAINER NOT REFILLING" indicator 161 should remain on to indicate that the refill system is not in the refill mode. Because the level of high purity TMB, TMP, or other high purity source chemical in modified rectangular purge style dopant ampule 100 changes throughout normal process operation, the "HIGH" level indicator 165, which is illuminated upon completion of a refill cycle, will remain illuminated until the high purity TMB, TMP, or other high purity source chemical level in modified rectangular purge style dopant ampule 200 falls below the "HIGH" trigger point of metallic level sensor assembly 221.

If the "HIGH-HIGH" indicator 164 was illuminated during the refill process, as with the "HIGH" indicator, the "HIGH-HIGH" indicator 164 will remain on until the high purity source chemical in modified rectangular purge style dopant ampule 200 falls below the "HIGH-HIGH" trigger point of metallic level sensor assembly 321. In such a case, the chemical level will fall through the "HIGH" trigger region thus causing the "HIGH" indicator to illuminate and then extinguish as described above.

The refill procedure is started either automatically or semiautomatically. For control unit 240 to be used in the semiautomatic mode, the "AUTO FILL/MANUAL FILL" switch 155 must be set to the "MANUAL FILL" position. In the semiautomatic mode when the indicators indicate that the ampule needs refilling, the operator must manually depressing the "PUSH TO FILL" switch 154 on control panel 252 of control unit 240 shown in FIG. 31. In the automatic mode, the level sensor input to the control unit 240 starts the refilling operation. The automatic mode may not be applicable to all CVD reactors. In the automatic mode a timer circuit 180 is preferably included to provide a default shut-off of the refill operation if the HIGH LEVEL sensor RS 4 is not activated in a preset period of time.

Once the "PUSH TO FILL" switch is pushed in the manual mode or relay RY 5 is automatically enabled in the automatic mode, the valve 242 is opened in the refill line 244 and inlet valve 118 on the back of rectangular ampule 200 is opened. High purity TMB, TMP (or other high purity source chemical, depending on the application) then flows into the modified rectangular ampule 200 from the bulk container 220. Throughout the refill cycle, the "CONTAINER REFILLING" LED 162 on panel 252 of control unit 240 is illuminated.

Valves 242 and 118 are preferably pneumatically activated valves. The control pressure used to open valves 242 and 118 can be nitrogen or other pressurization gas such as plant compressed dry air. The flow of a control pressure to valves 242 and 118 is controlled by N.O. solenoid valve V1 and N.C solenoid valve V2 in control unit 240.

Bulk container 220 is continuously pressurized with an inert gas such as helium; thus, when valves 242 and 118 are opened, inert gas forces the high purity source chemical from bulk container 220 through refill line 244 and into the modified rectangular ampule 200.

Digital level sensor assembly 321 in rectangular ampule 200 can take on a number configurations depending on how the bulk refill system 218 is to be operated. The following are particularly preferred configurations of digital level sensor assembly 321 and the corresponding preferred methods of operating bulk refill system 218.

In a first configuration, digital level sensor assembly 321 comprises two metallic float level sensors as illustrated in FIG. 29. Furthermore, the upper metallic float level sensor 116 is a dual level sensor, as in FIG. 29, used to indicate the "HIGH" and "HIGH-HIGH" levels within modified rectangular ampule 200. However, the lower metallic float level sensor 117 is only a single level sensor for indicating a low level inside modified rectangular ampule 200.

When the upper metallic float level sensor 116 is triggered, indicating that modified rectangular ampule 200 is full, it supplies a signal to the control unit 240 via cable 35. In response to that signal control unit 240 closes pneumatic valves 242 and 118 without operator intervention. Simultaneously, control unit 240 signals an audible alarm and a visual alarm on control panel 252. If the "HIGH LEVEL" trigger point RS 4 of upper level sensor 116 should fail, the "HIGH-HIGH LEVEL" trigger point RS 3 of upper level sensor 116 will trigger and instruct control unit 240 that the modified rectangular ampule 200 is full via cable 35 by an independent circuit within control unit 240. This "HIGH-HIGH" alarm is a fail safe feature that prevents overfilling the modified rectangular ampule 200 and stops refilling in case of electrical failure of the "HIGH LEVEL" alarm circuit.

During normal use of the chemicals, the source chemical within modified rectangular ampule 200 is consumed within the reaction chamber of the CVD processing equipment. The low level metallic level sensor 117 signals the control unit 240 via cable 35 when the source chemical level within modified rectangular ampule 200 has reached a low level. When the magnetic reed switch RS 5 closes, the "CONTAINER NEEDS REFILLING" circuit in FIG. 32 is completed and the "CONTAINER NEEDS REFILLING" LED 166 on control panel 252 of control unit 240 is illuminated. When "CONTAINER NEEDS REFILLING" LED 166 indicator light is illuminated, in the manual mode, the operator would initiate a refill cycle at the appropriate time by depressing the "PUSH TO FILL" switch. In the automatic mode, the system will automatically fill the modified ampule 200.

A second possible configuration of digital metallic level sensor assembly 321 for use in bulk refill system 218 of FIG. 30 is now described. In this configuration, upper metallic float level sensor 116 is a dual level digital sensor and functions in the same way as the previous example. However, in this embodiment, lower metallic float level sensor 117 is a dual level sensor with set points 115 and 115a corresponding to "LOW" and "EMPTY" levels, respectively. With this arrangement, metallic level sensor 117 preferably interfaces directly with low level monitor 120 via cable 35 as described in connection with FIGS. 21 and 22. Low level monitor 120 indicates when the source chemical within modified rectangular ampule 200 drops below the "LOW" level and "EMPTY" level trigger points 115, 115a, RSW 1 and RSW 2, (shown in FIG. 22) respectively, by illuminating the indicator on panel 122 (shown in FIG. 21), which, if the system is in manual mode, informs the operator that a manual start of bulk refill system 218 should be completed soon. In this embodiment, the bulk refill would still be accomplished through and controlled by control unit 240.

A third embodiment of bulk refill system 218 is now described. In this embodiment, digital level sensor assembly 321 is identical to the digital metallic level sensor assembly 321 described in the previous example. Thus, upper metallic level sensor 117 has two trigger points corresponding to "HIGH" and "HIGH-HIGH" fluid levels within rectangular ampule 100, and as before, the digital signal from these two trigger points is communicated to control unit 240 for refill termination. Furthermore, the "LOW" and "EMPTY" level signals of lower metallic level sensor 117 are communicated to the low level monitor 120. In addition, however, in this embodiment, the outputs of low level monitor 120 are communicated to the electronics of the P5000 unit using the interface circuit 130 illustrated in FIG. 23. If desired, the N.O. low alarm output of low level monitor 120 shown in FIG. 22 can be used to interface with the control unit 240 "CONTAINER NEEDS REFILLING" circuit RS 5. In this way, the "CONTAINER NEEDS REFILLING" LED 166 will light when the "LOW" level trigger point is tripped.

The advantage that this embodiment provides is that the user will have a visible "LOW" and "EMPTY" warning on the screen of the P5000 and the P5000 will not allow further wafer processing after an "EMPTY" alarm is detected. The "CONTAINER NEEDS REFILLING" indicator light 166 on control panel 252 would also be illuminated after the fluid level in modified rectangular ampule 200 drops below the "LOW" level to, in the manual mode, inform the operator that a refill should be conducted at the next opportunity.

A fourth embodiment of bulk refill system 218 is now described. The same digital level sensor assembly configuration 321 as used in the previous two embodiments is also used in this embodiment. The outputs of the five trigger points are communicated directly to the electronics of the P5000 using the interface circuit similar that depicted in FIG. 25, except that the 60% relay may be omitted. Thus, an independent control unit 240 and low level monitor 120 are not required in this embodiment. Rather, the P5000 electronics acts as the control unit for this embodiment. The output signal provided by interface circuit is interpreted by the software of the P5000 unit, which already exists for the refill of TEOS. The software and pneumatic controls of the P5000 would be modified in this embodiment to initiate a refill cycle when the fluid level drops to 20% in modified rectangular ampule 200 and to end the refill cycle when the source chemical reaches the 80% level. This would leave the 100% level as a safety "HIGH-HIGH" configuration since it would provide a voltage greater than the 8.0 volt set-point for the "HIGH" level.

A primary advantage to the user of this embodiment is that a separate control system is not required to operate in the refill mode. This greatly simplifies the installation of the bulk refill system 218. Primarily, pneumatic lines are modified such that the P5000 thinks that it is refilling a TEOS "slot" in the hot box. In actuality the modified dopant ampule 200 is refilling.

A fifth embodiment of bulk refill system 218 is now described. In this embodiment digital level sensor assembly 321 is a five level sensor employing from two to five floats such as the ones described in connection with FIGS. 24–28. The outputs of digital level sensor assembly 321 are interfaced with the electronics of the P5000 using the appropriate interface circuit described in connection with each of the configurations of the digital level sensor assemblies 21 in FIGS. 24, 26 or 27. An advantage of this embodiment is that incremental fills can be completed using the P5000 software. The refill percentages of the P5000 software are field programmable and can be set up to start the refill cycle at 6.0 volts and stop the refill cycle at 8.0 volts. The selected interface circuit will provide the analog signal change that results from the movement of the float from the 80% reed switch to the 60% reed switch. The output is still 8.0 volts as the float approaches the 60% reed switch. Once the 60% reed closes, the ampule 200 will be refilled until an 80% voltage (8.0 VDC) is detected, i.e., the liquid level has raised the float above the 60% reed switch.

If N.O. reed switches are employed, the interface circuit in FIG. 25 must be modified to unlatch as the float 24 rises above the 60% reed so that the proper signal will be sent to the P5000. The desired refill outputs can be achieved by using a two float configuration. The upper float (clip ring to stop its movement) stays at the 80% R.S. and keeps it latched. As the lower float changes level on the 60% R.S., the output will change as the 60% R.S. latches and unlatches. Float 24 will travel approximately ⅛ inch between trigger points, which corresponds to approximately 30 ml source chemical per refill.

The advantage of this embodiment is that incremental refills can be performed for added process control, repeatability, and stability during wafer fabrication. Further, a control unit 240 independent of the CVD electronics is not required for operation of the system.

Depending on the location, there may be a reluctance to modify the P5000 to achieve the incremental fill. If so, the BRC-22A can be configured to perform the same function in the "Auto Start" mode and with the proper interface configuration chosen.

The individual reed switches in the digital level sensor assemblies can fabricated on a single PCB having a large number of reed switches manufactured in a line directly on the board using techniques readily known in the printed wiring board manufacturing art. The traces and reed switches would be preferentially manufactured on a thin strip of substrate. The reed switches can be either normally open or normally closed. The substrate should be thin enough to easily fit within shaft 28 of the digital level sensor assembly 21. The reed switches should be evenly spaced along the length of the PCB and should be close enough together so that metallic float 24 will always have at least one reed closed. Preferably there are at least four reed switches per inch along the length of the PCB. This configuration will give a much more accurate level indication and is very close to a continuous output for the levels of interest in the ampule.

The lowest detection level may also be improved, thus allowing for more complete consumption of chemical in stand alone rectangular ampules 100 and modified ampules 200. For similar reasons the PCB reed switch configuration is also valuable in bulk refill applications due to the more accurate level indication and flexible start and stop points for the refill process. This sensor are also preferred for the incremental refill configuration as well. It allows the end user more flexibility in selecting a refill level and the amount of refill.

An interface circuit for converting the trigger points is preferably included on the reed switch PCB. For example the resistors of interface circuit shown in FIG. 25 are preferably built into the board to provide a varied output for the individual reed switch. Fuzzy logic similar to that employed in the camera arts is preferably used to determine the exact location of the metallic float 24 relative to the digital reed switches. With the magnetic field distributed among several reeds, fuzzy logic can be used to determine the exact location of the metallic float 24, and thus the fluid level. The fuzzy logic system employed is preferably similar to the algorithms used in most advanced fully automatic cameras.

In this embodiment the electronics of the P5000 would be used to the control the refill cycle and act as the control unit 240 for the bulk refill system. When a preset empty condition is measured, the P5000 electronics would supply a control pressure to refill valve 242 and source chemical would begin to flow from bulk container 220 to refillable ampule 200. When the preset full condition is communicated to the P5000 electronics, the control pressure to refill control valve 242 would be cutoff and the flow of source chemical from bulk container 220 to refillable ampule 200 stopped.

Chemical cabinet 269 illustrated in FIG. 30 contains one manifold 222 and one bulk container 220. Chemical cabinet 269 can, however, contain additional bulk containers 220 and manifolds 222 depending upon the application. Manifold 222 is preferably used to isolate the refill line 244 when the bulk container 220 is replaced with a fresh tank. This helps prevent contamination of the system.

The arrangement and basic operation of manifold 222 is identical to that described in connection with FIG. 17 above with three exceptions. In the manifold illustrated in FIG. 17, valves 70, 71, 72, 73 and 75 are manual valves. In the present embodiment, all of the valves within manifold 222 are preferably N.C. pneumatic valves. The second difference is that the emergency shut-off valve 74 has been eliminated from manifold 222 since all valves are now pneumatic and can be used as a shut-off. Thirdly, the preferred manifold 222 includes a vacuum switch 370, and indicating pressure switch 371 as required for use with the Advanced Delivery & Chemical Systems, Inc. automatic purge controller. The manifold 222 can include an indicating pressure transmitter (IPT) between valves 71 and 73 to allow for automatic leak test functions.

The bulk canister inlet valve 264 and bulk canister outlet valve 266 are also preferably N.C. pneumatic valves. These valves are preferably attached directly to bulk container 220 without any manual valves, so that when bulk container 220 is removed from the bulk system, the bulk canister inlet and outlet valves 264, 266 remain attached to isolate the interior of bulk container 220 from the atmosphere.

The pneumatic valves in manifold 222 and on bulk container 220 are preferably springless diaphragm valves to minimize the particle contamination in the bulk refill system.

Pneumatic valves are preferably used in the manifold 222 and bulk canister 220 in this embodiment so that they can be controlled by an automatic purge controller 140 via pneumatic control lines. Thus, the pneumatic actuators of the canister inlet and outlet valves 264, 266 and all the valves in manifold 222 are connected to individual pneumatic control lines (not shown) that are in communication with the automatic purge controller 140. As a result, automatic purge controller 140 simply communicates a control pressure through the appropriate pneumatic control line to open a specified valve.

The line draining and purge sequences are fully automated and free of human interaction if the container valves 264 and 266 are pneumatic. If they are manual, a technician must be present during the line draining process to open and close the canister inlet valve. To simplify the manual operation, the canister outlet valve 266, is left open during the line draining process. The CBV valve 72, is used to control that part of the canister.

An added benefit of using normally closed pneumatically actuated valves in the manifold and on the bulk container inlet and outlet is that all valves will act as an emergency shut-off valve; thus enabling the removal of emergency shut-off valve 74 from the manifold. When the emergency shut-off condition is activated, the pneumatic supply to the valves will be cut off, closing all valves.

The following is a preferred way to refill the bulk container having pneumatic valves. In principle there are several very specific needs for working with liquids especially combustible or flammable liquids. The requirements are made even more difficult when working with the ultrahigh purity levels required for the CVD, etch and diffusion applications.

The filling process should be completed in the absence of trace moisture and oxygen. The concern raised by trace moisture and oxygen is primarily with regards to purity and chemical stability, however, safety concerns are also present. To achieve that, the valve connections must be purged prior to the transfer of any liquid as described above. This requirement makes filling through the valve a distinct advantage.

Once the trace moisture and oxygen are removed down to the desired parts per million level, the actual filling process can begin. The filling process is a fully automated process that utilizes pneumatic valves, analog scale outputs, a pneumatic controller and a filling manifold. Prior to filling, canister valve actuation is required to vent the pressure in the canister and to pull a vacuum on the canister. The vacuum assists in the debubbing of CVD materials as it fills the container.

After the fill process has been completed, the valves on the bulk canister are closed automatically. The liquid between the filling manifold shut-off valve and the canister shut-off valve must be removed before the canister can be safely removed from the filling manifold. Unlike gases, the liquid must be removed out of this deadleg by pressure transfer due to the fact that the vapor pressure of the liquid is not sufficient to remove the liquid in a time efficient manner. The procedure to perform that activity includes pneumatic actuation of both canister valves. Without the pneumatic valves on the canister, the container depressurization and the final steps of the filling process would require operator interaction and would compromise the safety and purity considerations needed for this process.

The above process is similar to the line draining process performed by the APC during a canister change. The needs are the same for both procedures.

The purpose of the automatic purge controller 140 is to perform the line draining and purge cycle operations on the bulk canister 220 and manifold 222. As described above in connection with FIGS. 16–18, these operations are quite detailed due to the need to minimize the possibility of introducing contamination to the high purity chemical delivery system. By using automatic purge controller 140, the line drain and purge cycles, before and after canister change, can be optimized to virtually eliminate the possibility of contamination and to ensure safe conditions for operators replacing the empty bulk container 220.

Figure 33:
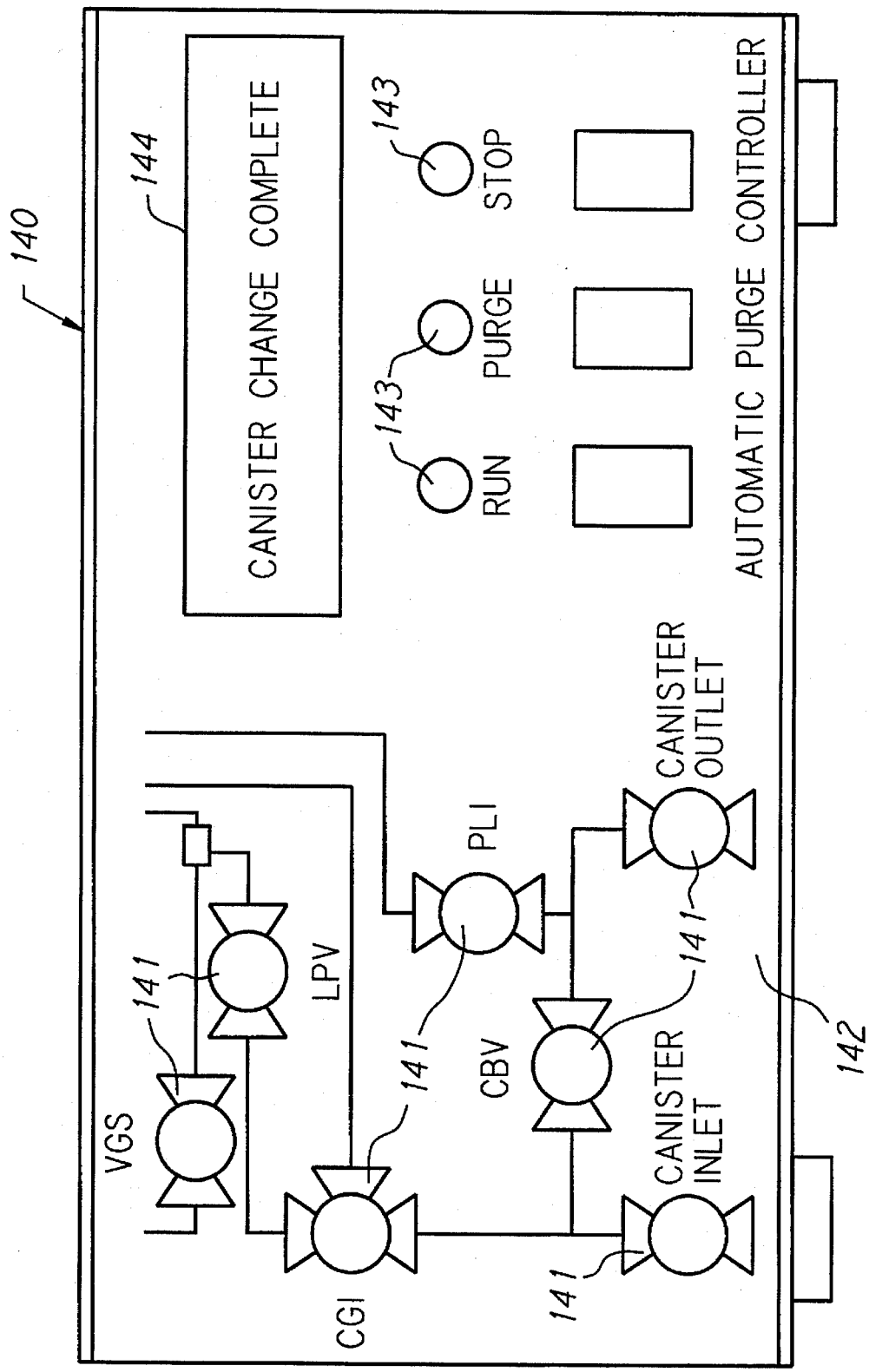
FIG. 33 is a front view of a automatic purge controller control panel according to one embodiment of the present invention.

The operation of automatic purge controller 140 is described in connection with FIG. 33.

Control panel 142 of automatic purge controller 140 preferably includes seven LEDs 141, one corresponding to each valve in manifold 222 and the valves on bulk container 220. The valve abbreviations on control panel 142 correspond to the valves in manifold 222 and on bulk container 220 as follows: "CANISTER INLET"=canister inlet valve 264; "CANISTER OUTLET"=canister outlet valve 266; "PLI"=process line isolation valve 70; "CGI"=carrier gas isolation valve 71; "CBV"=container bypass valve 72; "LPV"=low pressure vent valve 73; "VGS"=vacuum supply valve 75. When a valve LED indicator 141 is illuminated, the indicated valve is open.

Control panel 142 also includes three control switches and corresponding LED indicators 143. These are "RUN"; "PURGE"; and "STOP". When a given switch is pressed, the corresponding LED indicator is illuminated. In addition, the automatic control unit performs the operations described below.

When the run switch is pressed, automatic purge controller configures the valves in manifold 222 and the valves on bulk container 220 to deliver source chemical to for example modified rectangular ampule 200. As a result, carrier gas isolation valve 71, process line isolation valve 70, canister inlet valve 264, and canister outlet valve 266 are opened. Bulk container 220 is now pressurized and will deliver source chemical to the modified rectangular ampule 200 when refill control valve 242 is opened by control unit 240 or the CVD electronics as described above.

After bulk container 220 has been depleted, digital level sensor assembly 221 in bulk container 220 will signal control unit 240 via cable 226 that a "BULK EMPTY" status exists within bulk container 220. At this point, bulk container 220 will need to be replaced before another refill cycle can begin, or be completed. By depressing the "PURGE" switch, automatic purge controller 140 steps the manifold and bulk container 20 through the valve control sequence described of the bulk container 20 change procedure described above in connection with FIGS. 16–18. The automatic valve controller software and truth tables are set forth below in Tables 2–5. The display box in each table indicates the display provided on display screen 144 of automatic purge controller 140 after each step of the software. The operator performing the bulk container 220 replacement procedure must simply follow the instructions provided on display screen 144 to effect the removal and replacement of bulk container 220.

When the "TOP" switch is pressed, automatic purge controller 140 closes all valves in manifold 222 and on bulk container 220 by cutting of the control pressure to these valves.

Preferably, automatic purge controller 140 performs the following automatic test functions throughout its operation.

1. Verifies the valve actuation pressure is sufficient for manifold actuation. Adjustable pressure switch on the valve actuation source input.
2. Verifies that the helium or other inert pressurizing gas is properly regulated. Verifies a minimum delivery pressure is present at the inlet of the pressurization gas.
3. Verifies that the carrier gas isolation valve 71 is functioning properly. The vacuum switch is used to monitor leaks at the CGI valve.
4. Verifies that the low pressure vent valve 73 is functioning properly. The vacuum switch on the manifold would detect a valve failure at LPV 73. A leak past LPV would be detected in the leak test process.
5. Verifies that the vacuum supply valve 75 is functioning properly. A vacuum test is performed by means of the vacuum switch on the manifold.

Further, after each bulk container changeover, automatic purge controller 140 also preferably performs a manifold leak check.

Preferably automatic purge controller is also configured to have a dry contact safety feature. Opening the contacts of the N.O. safety relay, stops all automatic purge controller functions. As a result all manifold and canister valves close. In the event of a regulator failure, the mechanical pressure relief valve on the regulator would vent excess pressure to the cabinet exhaust. This is an industry standard in handling regulator failures.

TABLE 2

Liquid TEOS Draining and Canister Shutoff

| STEP | ACTION | VGS | LPV | CGI | PLI | CBV | Can IN | Can OUT | Display | Continue |
|---|---|---|---|---|---|---|---|---|---|---|
| 00 | Open Canister Inlet | | | | | | $1^7$ | | Starting DRAIN and SHUTOFF sequence | (5)01 - after VDLY<br>(7)03 - after VDLY |
| 01 | Open Canister Valves | | | | | | | | Open Canister Valves Then Press PURGE | (5)02 - after PURGE is pressed |
| 02 | | $1^7$ | | | | | | $1^7$ | Liquid TEOS Draining Purge Cycle X of X | (5)03 - after VSTART<br>(7)05 - after VSTART and VACUUM TEST = TRUE |
| 03 | | | | | | | | | OPEN Canister INLET Then Press PURGE | (5)04 - on first cycle only<br>(5)04 - After PURGE is pressed |
| 04 | Open VGS | 1 | | | | | | | Starting Venturi | (5)05 - after VSTART and VACUUM TEST = TRUE |

TABLE 2-continued

Liquid TEOS Draining and Canister Shutoff

| STEP | ACTION | VGS | LPV | CGI | PLI | CBV | Can IN | Can OUT | Display | Continue |
|---|---|---|---|---|---|---|---|---|---|---|
| 05 | Open LPV | 1 | 1 | | | | $1^7$ | | Depressurizing Manifold for XXX seconds | 06 - after DRAIN |
| 06 | Close CanIN and LPV | 1 | | | | | | | Closing VENT Valve | (5)07 - after VDLY<br>(7)08 - after VDLY |
| 07 | | | | | | | | | CLOSE Canister INLET Then Press PURGE | (5)08 - after PURGE is pressed |
| 08 | Open CGI | $1^7$ | | 1 | | | | | Opening Purge Valve | 09 - after 2VDLY and CGI PRESSURE TEST = TRUE |
| 09 | Open Canister Inlet* | $1^7$ | | 1 | | 1 | | $1^7$ | Draining Manifold and Purge for xx.x seconds | 0A - after BUBBLE |
| 0A | Close CBV, CGI, Can OUT | $1^7$ | | | | | | | Closing Purge Valve | 02 - after VDLY and LOOP < DRACNT<br>(5)0A - after VDLY and LOOP = DRACNT<br>(7)10 - after VDLY and LOOP = DRACNT |
| 0B | | | | | | | | | Close Canister Valves Then Press PURGE | (5)10 - after PURGE is pressed |

Note:
(5) means 5 valve sequence
(7) means 7 valve sequence
"unmarked" means common to both sequences

TABLE 3

Purging Prior to Depleted Canister Disconnection

| STEP | ACTION | VGS | LPV | CGI | PLI | CBV | Can IN | Can OUT | Display | Continue |
|---|---|---|---|---|---|---|---|---|---|---|
| 10 | Open CBV, LPV | 1 | | | | 1 | | | Starting PURGE BEFORE CANISTER EXCHANGE | 11 - after 2VDLY and VACUUM TEST = TRUE |
| 11 | Evaporate TEOS | 1 | 1 | | | 1 | | | Evacuating Manifold for XXX seconds | 12 - after VENT |
| 12 | Close LPV | 1 | | | | 1 | | | Closing VENT Valve | 13 - after VDLY |
| 13 | Open CGI | 1 | | 1 | | 1 | | | Filling for XX Seconds Cycle X of X | 14 - after FILL |
| 14 | Close CGI | 1 | | | | 1 | | | Cycle X of X | 15 - after VDLY |
| 15 | Open LPV | 1 | 1 | | | 1 | | | Evacuating for XX Seconds Cycle X of X | 16 - after EVAC |
| 16 | Close CGI | 1 | | | | 1 | | | Cycle X of X | 13 - after VDLY and LOOP < CYCLE<br>17 - after VDLY and LOOP = CYCLE |
| 17 | Close VGS | | | | | 1 | | | | 18 - after 3 seconds |
| 18 | Open LPV | | 1 | | | 1 | | | | 20 - after 5 seconds |

TABLE 4

Purging Prior to Depleted Canister Disconnection and Removal

| STEP | ACTION | VGS | LPV | CGI | PLI | CBV | Can IN | Can OUT | Display | Continue |
|---|---|---|---|---|---|---|---|---|---|---|
| 20 | | | | | | 1 | | | Turn He REG CCW then press PURGE | 21 - after PURGE button is pressed |
| 21 | | | 1 | 1 | | 1 | | | Adjust He to 5 PSIG then press PURGE | 22 - after PURGE button is pressed |
| 22 | | | | 1 | | 1 | | | UNTIGHTEN Canister then press PURGE | 23 - after PURGE button is pressed |
| 23 | | | | 1 | | 1 | | | Remove EMPTY Canister then press PURGE | 24 - after PURGE button is pressed |
| 24 | | | | 1 | | 1 | | | Install New Canister | 25 - after PURGE button is pressed |

TABLE 4-continued

Purging Prior to Depleted Canister Disconnection and Removal

| STEP | ACTION | VGS | LPV | CGI | PLI | CBV | Can IN | Can OUT | Display | Continue |
|---|---|---|---|---|---|---|---|---|---|---|
| 25 | | | | 1 | | 1 | | | then press PURGE TIGHTEN Connections then press PURGE | 26 - after PURGE button is pressed |
| 26 | | | | | | 1 | | | Adjust He to XX PSIG then press PURGE | 27 - after PURGE button is pressed |
| 27 | Open VGS | 1 | | | | 1 | | | Starting Venturi | 28 - after V_START and Vacuum Test = TRUE |
| 28 | Open LPV | 1 | 1 | | | 1 | | | Evacuating Manifold for XX Seconds | 29 - after EVAC |
| 29 | | 1 | | | | 1 | | | Closing Vent Valve | 2A - after VDLY |
| 2A | OPEN CGI | | | 1 | | 1 | | | Pressurizing Manifold | 2B - after FILL and Manifold Pressure Test = TRUE |
| 2B | CLOSE CGI | | | | | 1 | | | Leak Check Connections then press PURGE | 30 - after PURGE button is pressed |
| | | | | | | | | | Leak Testing Manifold for XXX sec XX.X PSIG | 30 - after Manifold Holding Pressure Test = TRUE |

TABLE 5

Purging After Cylinder Connection

| STEP | ACTION | VGS | LPV | CGI | PLI | CBV | Can IN | Can OUT | Display | Continue |
|---|---|---|---|---|---|---|---|---|---|---|
| 30 | Open VGS | 1 | | | | 1 | | | Starting PURGE AFTER CYLINDER CONNECTION | 31 - after V_START and VACUUM TEST = TRUE |
| 31 | Open LPV | 1 | 1 | | | 1 | | | Evacuating for XX Seconds Cycle X of X | 32 - afte EVAC |
| 32 | Close LPV | 1 | | | | 1 | | | Cycle X of X | 33 - after VDLY |
| 33 | Open CGI | 1 | | 1 | | 1 | | | Filling for XX Seconds Cycle X of X | 34 - after FILL |
| 34 | Close CGI | 1 | | | | 1 | | | Cycle X of X | 31 - after VDLY and LOOP < CYCLE 35 - after VDLY and LOOP = CYCLE |
| 35 | Open LPV | 1 | 1 | | | 1 | | | Evacuating Manifold for XXX seconds | 36 - after VENT and VACUUM TEST = TRUE |
| 36 | Close LPV | 1 | | | | 1 | | | | 37 - after VDLY |
| 37 | Close VGS and CBV | | | | | | | | CANISTER CHANGE COMPLETE!! | |

Figure 34:
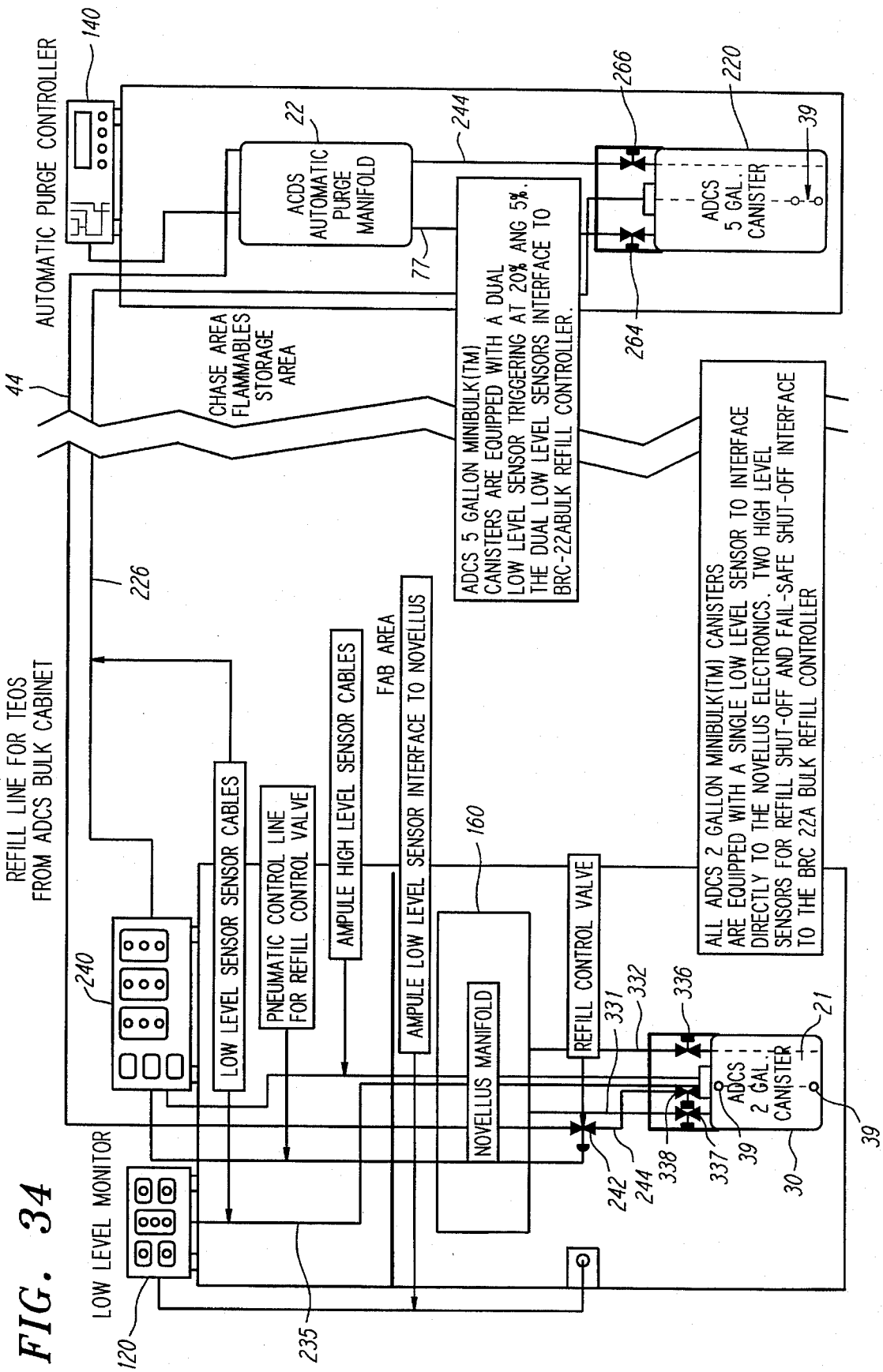
FIG. 34 is a schematic representation of a high purity chemical delivery system according to an embodiment of the present invention.

Another embodiment of a bulk refill system according to the present invention is illustrated in FIG. 34. This embodiment illustrates one possible configuration for employing a bulk refill system in a Novellus Sigma Six unit. In this embodiment, a refillable ampule 30 as described in connection with FIG. 8 is used. However, instead of employing two digital level sensor assemblies 21, a single digital level sensor assembly 21 capable of detecting at least four levels is employed. The digital outputs of trigger points of the digital level sensor 21 corresponding to the "HIGH" and "HIGH-HIGH" levels are communicated to control unit 240 via cable 247. Similarly, the digital outputs of the trigger points of the "LOW" and "EMPTY" levels are communicated to low level monitor 120 via cable 235. The empty alarm output from the low level monitor circuit illustrated in FIG. 22 is then interfaced with the electronics of the CVD processing equipment. This output informs the CVD equipment when the source chemical level within refillable ampule 30 has reached the empty trigger point and prevents further fabrication until ampule 30 is refilled. Further, the N.O. output of the "LOW ALARM" circuit can also be interfaced with the "CONTAINER NEEDS REFILLING" LED in control unit 240 if desired.

An alternative exists for the four level output sensor (21) output such that the low level monitor is not needed. All four levels are interfaced to the BRC-22A (40) and an N.C. output on the back of control unit 240 is used to interface to the CVD system for the empty alarm. This can be used if a remote indicator is not needed.

The CVD processing equipment in this configuration has a separate manifold 160 for refillable ampule 30. Manifold 160 includes a separate valve in delivery line 332 for closing off the supply of TEOS or other high purity source chemical to the CVD reaction chamber. In addition manifold 160 includes separate valves from that of valve 337 for closing of the inert gas supply and vacuum supply through passage 331 to ampule 30. Accordingly, the three manual isolation valves 336, 337, and 338 will remain open at all times once the refillable ampule 30 is installed into the system. The process for accomplishing a refill of ampule 30 in this embodiment is described in connection with FIG. 1.

The manifold of this embodiment is identical to manifold 222 described in connection with FIG. 30. Furthermore, bulk container inlet and outlet valves 264, 266 are also preferably pneumatic in this embodiment. The pneumatically actuated valves in manifold 222 and on bulk container 220 are controlled in the same manner in this embodiment as described in connection with FIGS. 30 and 33.

Figure 37:
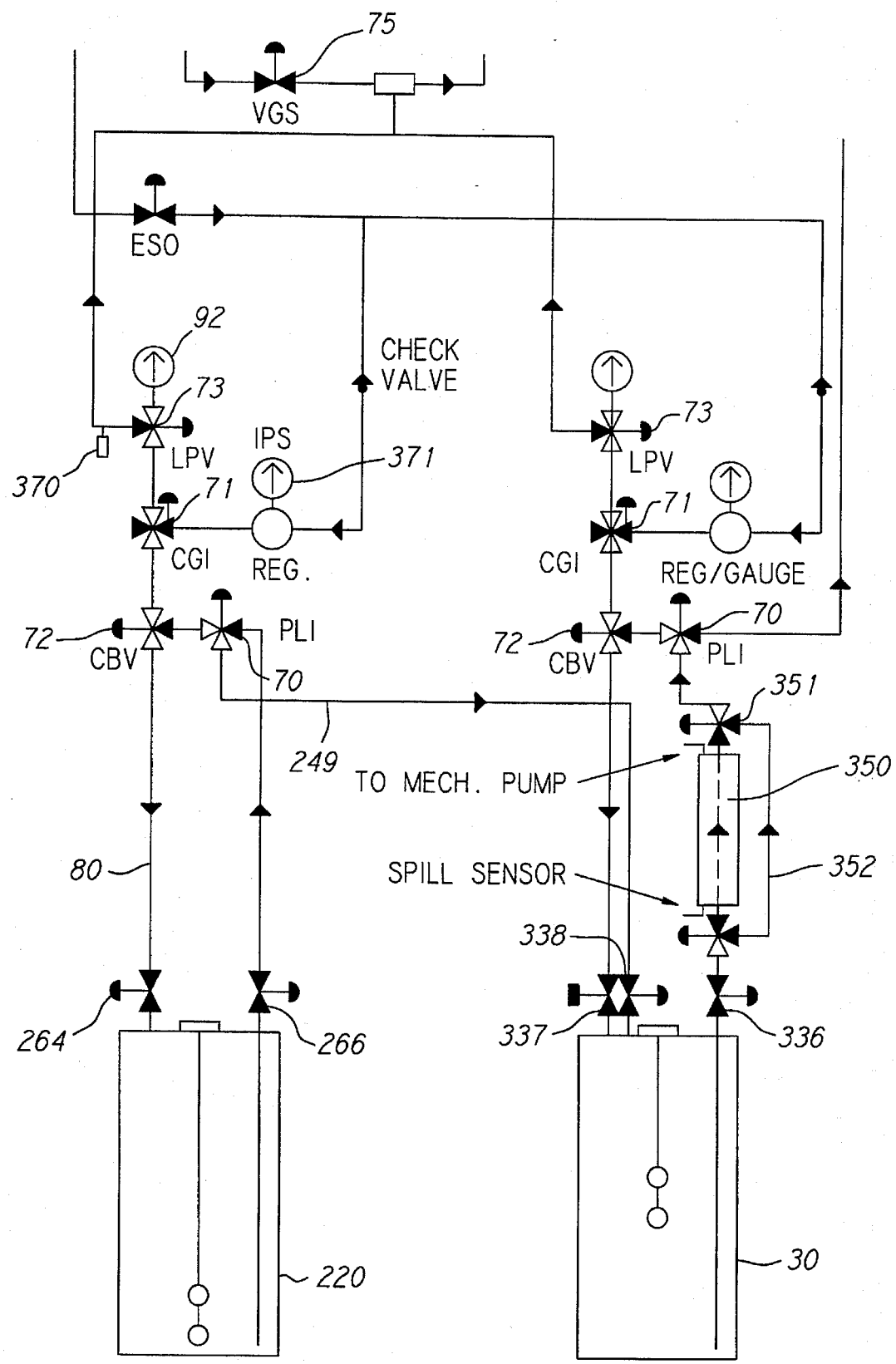
FIG. 37 is a diagrammatic representation of a presently preferred refillable high purity chemical delivery system according to one embodiment of the invention.

FIG. 37 depicts an arrangement of a bulk container and an ampule 30 that is presently preferred with some systems. The valves having the same number as the valves in FIG. 34 perform the same function as previously described. In addition, a degassing cylinder 350 and corresponding bypass valves 351 and 352.

Figure 35:
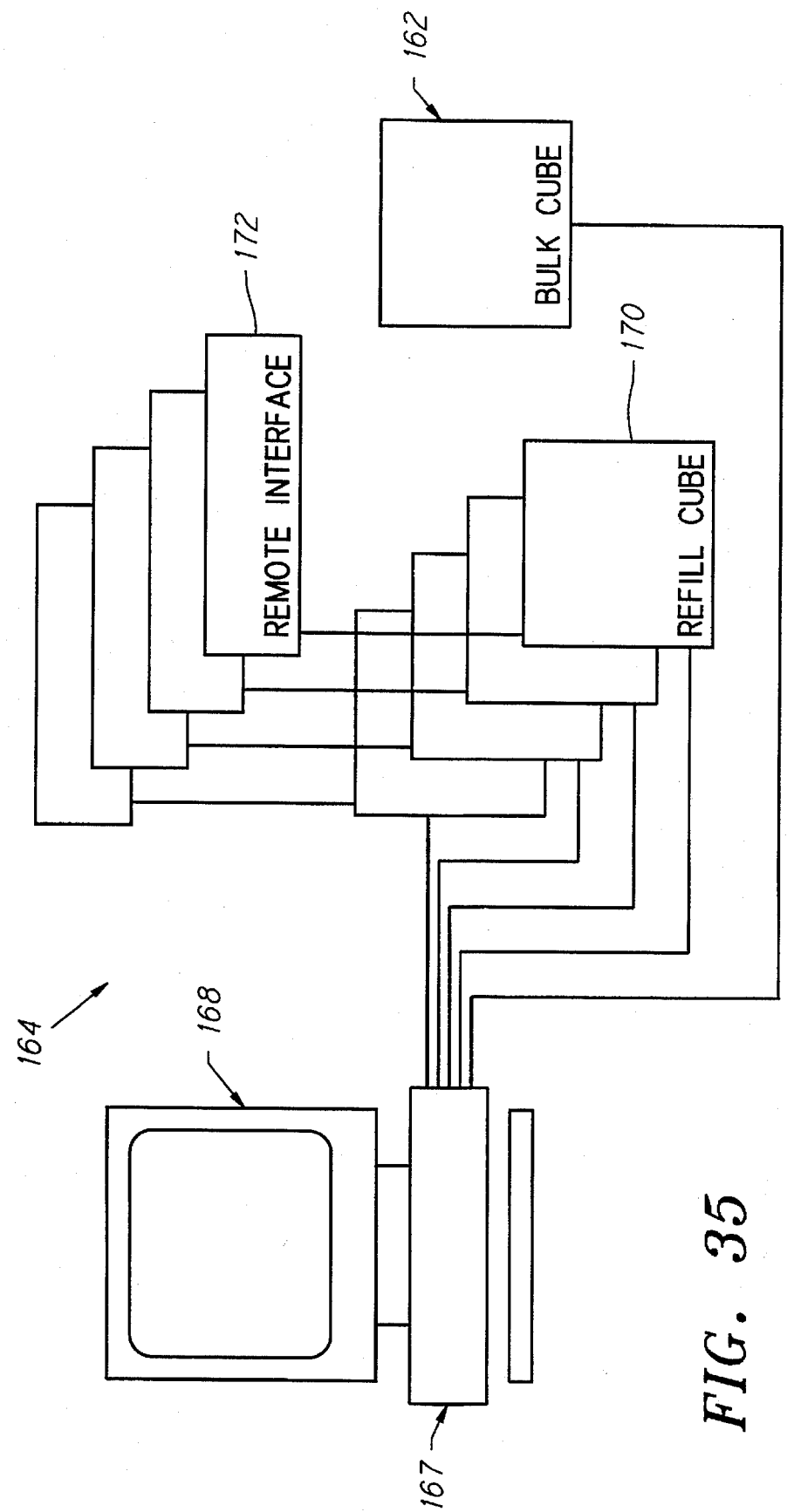
FIG. 35 is a schematic representation of a multi-point auto-refill system according to one embodiment of the present invention.

A particularly preferred embodiment of a bulk refill system 218 will now be described in connection with FIGS. 35 and 36. FIG. 35 is a schematic representation of a multi-point auto-refill system 164 ("MARS") according to the present invention. The MARS control system 164 comprises a CPU 167, at least one refill cube 170 with its own CPU, a corresponding number of remote interfaces 172, and a bulk cube 162 again with its own CPU. This system is particularly applicable to use with the Novellus Concept One and Concept Two CVD systems, which is a PECVD unit.

Figure 36:
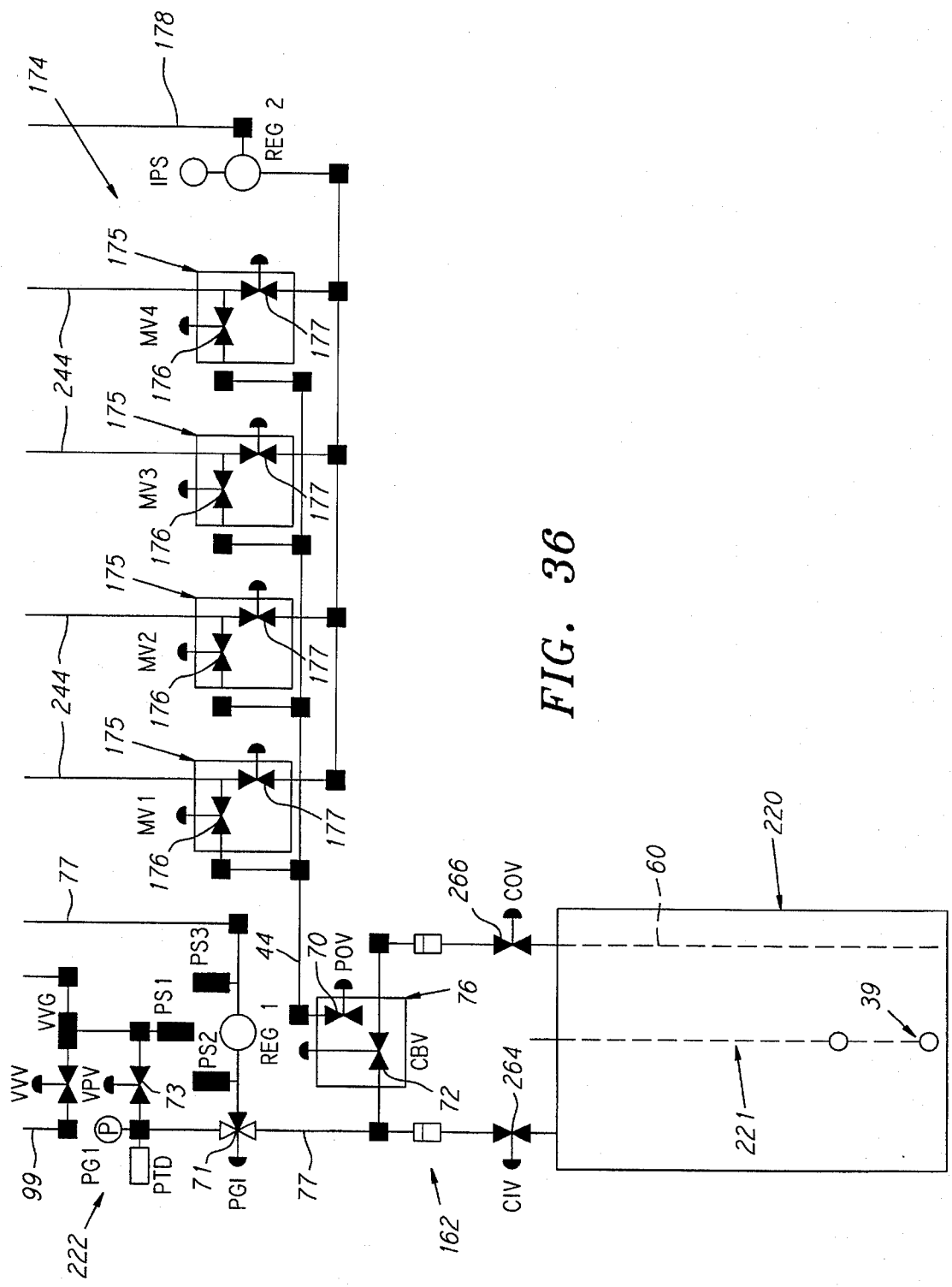
FIG. 36 is a schematic representation of one embodiment of a bulk cube including a purge manifold and a distribution manifold for use in a multi-point auto-refill system according to the present invention.

One embodiment of a bulk cube 174 is shown in FIG. 36. Bulk cube 174 comprises a bulk container 20, purge manifold 22, distribution manifold 174, and automatic purge controller 140 (not shown). Because distribution manifold 174 contains four distribution block valves 175 disposed in parallel in refill lines 244, bulk container 220 can supply a high purity source chemical such as TEOS to four different refillable ampules 30 within respective refill cubes 170.

In FIG. 36, the components of the manifold with the same number as the manifold 222 described in connection with the bulk refill systems illustrated in FIGS. 30 and 34 perform the same function. Further, canister inlet and outlet valves 264, 266 are also preferably pneumatically actuated valves. Thus, although bulk container 220 would preferably have a larger capacity than the bulk container 220 of the previous embodiments, removal and replacement of bulk container 220 would be accomplished in the same manner. Automatic purge controller 140 functions, however, are completed by the CPU at the Bulk Cube and master CPU so that a refill sequence is not initiated for any of the four refillable ampules 30 during the replacement of bulk container 220, or for that matter after a "BULK EMPTY" signal is communicated from bulk container 220.

When bulk container 220 is in need of replacement, the "BULK EMPTY" signal is communicated to the Refill Cube and the Master CPU 167. After receiving the signal to start the container change, CPU 167 automatically initiates the drain and purge cycle required before bulk container 220 can be disconnected.

Distribution manifold 174 comprises a plurality of distribution block valves 175, four in the present embodiment. Each distribution block valve 175 includes a refill line isolation valve 176 and a purge valve 177. Each refill line isolation valve 176 is disposed in a branch of refill line 244. Refill isolation valves 176 are preferably N.C. pneumatically actuated valves. When a valve 176 is closed, no source material can flow through the respective distribution block valve 175 to a refillable ampule 100 or modified ampule 200.

Each purge valve 77 communicates inert gas supply line 178 with the respective refill line 244 branches via distribution block valve 175. The purge valves 177 are also preferably N.C. pneumatically actuated valves. When these valves are closed, inert gas in gas supply line 178 is prevented from entering refill line 244. On the other hand, when a purge valve 177 is opened, inert gas is allowed to flow through the respective refill line 244 branch. In this manner, each individual refill line 244 can be purged without disrupting the operation of other distribution valves 175 or the flow of source chemical therethrough.

Pneumatically actuated valves 176, 177 are controlled by CPU 167 to open and close at appropriate times. Or, if desired, manual toggle valves can be mounted in the cabinet for local control.

The overall layout of the refill configuration for an individual ampule 30 in the MARS system 164 is similar to that in FIG. 34. The only real difference is the multiple port configuration in the cabinet, larger bulk canisters and an integrated control system that replaces the low level monitor (120), BRC-22A (240) and automatic purge controller (140).

Refill cube 170 includes refillable ampule 30, control unit 40, and low level monitor 120. The "HIGH", "HIGH-HIGH", "LOW" and "EMPTY" outputs of the digital level sensor assembly 21 in refillable ampule 30 are communicated to the refill cube and CPU 167. In this manner, CPU 167 can monitor the status of a plurality of refillable ampules 30. When any one of them are depleted, digital level sensor 21 will signal CPU 164. CPU 167 will then initiate a refill cycle for that refillable ampule 30 upon receipt of a system "idle" signal from the electronics of the corresponding CVD reactor if available. If the signal is not available, a manual start would be required. This prevents the premature initiation of a refill cycle while the CVD unit is in the middle of processing a batch of wafers, which would result in the loss of the batch.

The status of refillable ampule 30 in each refill cube 170 is communicated through a remote interface 172 to the electronics of CVD unit. This is done so that the CVD unit does not initiate a run when there is insufficient source chemical in ampule 30 to complete the run. To ensure that the tool remains idle during the entire refill process, CPU 166 or low level monitor 120 will inhibit the user from initiating the wafer fabrication process by providing an ampule low alarm to the electronics of the CVD unit. The ampule low alarm will not allow the user to start any sequence until the alarm is removed. Once the refill cycle is complete and the refillable ampule 30 container re-pressurized, the alarm will be removed so that the process can be started.

The MARS system of the present invention offers benefits in system availability and process stability. The automatic refill configuration allows for 100% availability of the process tool and eliminates the downtime associated with the more frequent changeovers required with the smaller bulk containers 20. In addition, complications that can arise from a container change, which can further extend the downtime of the process tool and require additional resources before the system can be turned over to production, are minimized. Those complications are typically: process requalification for deposition rate, uniformity and particles, liquid injector and liquid flow controller (LFC) malfunctions and replacement, or other delivery related problems.

The MARS system and the refill configurations disclosed in FIGS. 34 and 37 have another benefit that results from the transfer of chemical from the bulk container in a remote area to the refillable ampule in the fab area. This added benefit is that is a reduced amount of dissolved pressurization gas. Thus, the transfer performs a de-gassing function. The TEOS or other high purity chemical transferred from bulk container 20 is degassed upon transfer to refillable ampule 30, because refillable container 30 is under vacuum prior to transfer. When the refill starts, the TEOS or other high purity source chemical passes through the critical orifice of the valve on the recipient container 30 and is exposed to a significant pressure drop. That pressure drop results in cavitation of the liquid which results in a significant reduction of dissolved gases in the liquid chemical. The amount of dissolved gas (He or Nitrogen) in the liquid is significant since that gas will come out of solution and cause LFC instabilities and wafer inconsistencies. The benefits of the MARS system and the corresponding hardware also include:

1. A refill system with a much higher level of intelligence. There are several microprocessors being used to monitor various inputs and the provide corresponding outputs. Processors are resident in the CPU 167, Refill Cube 170 and bulk cube 172.
2. The MARS system can integrate the function of all controllers previously used. That includes: the control unit 240, the automatic purge controller 140, and low level monitor 120.
3. A large number of refill points, bulk cabinets and system status interfaces can be monitored using one control system.

Although the invention has been described in connection with reference to preferred embodiments and specific examples, it will readily understood by those skilled in the art that many modifications and adaptions of the inventions described herein are possible without departure from the spirit and scope of the inventions as claimed hereafter.

We claim:

1. An ampule for delivering high purity chemical comprising:
   a. an ampule lid having an opening therethrough;
   b. a digital level sensor assembly extending through the opening in said lid and into the interior of said ampule, said digital level sensor assembly comprising:
      i. at least one digital metallic float level sensor having at least one trigger point, said at least one digital metallic float level sensor comprising two digital metallic float sensors, an upper digital metallic sensor having two trigger points and a lower digital metallic sensor having three trigger points; and
      ii. an electrical cable having multiple conductors connected to said at least one digital float level sensor, said cable comprising at least six conductors;
   c. a flange permanently attached to said digital level sensor assembly and removably securing said digital level sensor assembly to a mating surface surrounding said opening in said lid; and
   d. an O-ring disposed between the mating surfaces of said flange and lid.

2. A high purity chemical delivery system comprising:
   a. an ampule having a lid, said having opening communicating with the interior of said ampule;
   b. a digital level sensor assembly extending through the opening in said lid and into the interior of said ampule, said digital level sensor assembly comprising:
      i. at least one digital metallic float level sensor having at least one trigger point, said at least one digital metallic float level sensor comprising two digital metallic float sensors, an upper digital metallic sensor having two trigger points and a lower digital metallic sensor having three trigger points; and
      ii. an electrical cable having multiple conductors connected to said at least one digital float level sensor said cable comprising at least six conductors; and
      iii. the digital outputs of said trigger points are communicated to the electronics of a reactor chamber by said conductors via a digital to analog circuit;
   c. a flange permanently attached to said digital level sensor assembly and removably securing said digital level sensor assembly to a mating surface surrounding said opening in said lid; and
   d. an O-ring disposed between the mating surfaces of said flange and lid.

3. A chemical refill system for high purity chemicals comprising:
   a. a refillable ampule;
   b. a bulk container containing a high purity source chemical;
   c. a refill line interposed between and communicating with said ampule and said bulk container for transferring the high purity source chemical from said bulk container to said ampule;
   d. an inert gas pressure source communicating with the interior of said bulk container to force the high purity source chemical from said bulk container to said ampule through said refill line;
   e. a first metallic float sensor inside said ampule having at least one trigger point for detecting a level of the high purity source chemical;
   f. a control unit electronically communicating with said metallic float and having an indicator that provides a signal to indicate that the high purity source chemical in said ampule is at said level when the level of the high purity source chemical in said ampule reaches the trigger point of said first metallic float sensor; and
   g. a manifold, comprising:
      i. a carrier gas line for providing inert gas from said inert gas pressure source to said bulk container;
      ii. means disposed in said refill line for isolating the outlet of said bulk container from a portion of said refill line;
      iii. means in said carrier gas line for isolating said inert gas pressure source from the inlet of said bulk container;
      iv. means for connecting a vacuum source to said carrier gas line; and
      v. means for bypassing said inert gas pressure source and the vacuum source to at least a portion of said refill line that was not isolated by said means for isolating said refill line.

4. A chemical refill system for high purity chemicals comprising:
   a. a refillable ampule;
   b. a bulk container containing a high purity source chemical;
   c. a refill line interposed between and communicating with said ampule and said bulk container for transferring the high purity source chemical from said bulk container to said ampule;
   d. an inert gas pressure source communicating with the interior of said bulk container to force the high purity source chemical from said bulk container to said ampule through said refill line;
   e. a first metallic float sensor inside said ampule having at least one trigger point for detecting a level of the high purity source chemical;

f. a control unit electronically communicating with said metallic float and having an indicator that provides a signal to indicate that the high purity source chemical in said ampule is at said level when the level of the high purity source chemical in said ampule reaches the trigger point of said first metallic float sensor; and g. a manifold, comprising:
  i. a process line isolation valve interposed in said refill line for isolating said bulk container from a portion of said refill line;
  ii. a carrier gas isolation valve for isolating said bulk container from said inert gas pressure source;
  iii. a low pressure vent valve for isolating a vacuum source from said carrier gas line; and
  iv. a canister bypass valve for bypassing said pressure source and the vacuum source to at least a portion of said refill line that was not isolated by said process isolation valve.

5. A chemical refill system for high purity chemicals according to claim 4, wherein said canister bypass valve bypasses said pressure source and the vacuum source to all of said refill line that was not isolated by said process isolation valve.

* * * * *